United States Patent [19]
Dangelo et al.

[11] Patent Number: 5,801,958
[45] Date of Patent: Sep. 1, 1998

[54] METHOD AND SYSTEM FOR CREATING AND VALIDATING LOW LEVEL DESCRIPTION OF ELECTRONIC DESIGN FROM HIGHER LEVEL, BEHAVIOR-ORIENTED DESCRIPTION, INCLUDING INTERACTIVE SYSTEM FOR HIERARCHICAL DISPLAY OF CONTROL AND DATAFLOW INFORMATION

[75] Inventors: Carlos Dangelo, Los Gatos; Daniel Watkins, Los Altos; Doron Mintz, Sunnyvale, all of Calif.

[73] Assignee: LSI Logic Corporation, Milpitas, Calif.

[21] Appl. No.: 707,918

[22] Filed: Sep. 10, 1996

Related U.S. Application Data

[63] Continuation of Ser. No. 196,337, Feb. 10, 1994, Pat. No. 5,555,201, which is a continuation-in-part of Ser. No. 77,304, Jun. 14, 1993, abandoned, which is a continuation-in-part of Ser. No. 76,729, Jun. 14, 1993, Pat. No. 5,544,066, which is a continuation-in-part of Ser. No. 76,738, Jun. 14, 1993, Pat. No. 5,557,531, which is a continuation-in-part of Ser. No. 76,728, Jun. 14, 1993, Pat. No. 5,541,849, which is a continuation-in-part of Ser. No. 77,403, Jun. 14, 1993, Pat. No. 5,553,002.

[51] Int. Cl.$^6$ .................................................. G06F 17/50
[52] U.S. Cl. ........................................... 364/489; 364/488
[58] Field of Search ...................................... 364/488, 489, 364/490, 491

[56] References Cited

U.S. PATENT DOCUMENTS

T940,008  11/1975  Oden ............................................ 444/1
T940,020  11/1975  Brechling et al. ............................ 444/1

(List continued on next page.)

FOREIGN PATENT DOCUMENTS 0 319 232 A2  6/1989  European Pat. Off. ............... 15/40
0 463 301 A2  1/1992  European Pat. Off. ............... 15/60
0 473 960 A2  3/1992  European Pat. Off. ............... 15/40

OTHER PUBLICATIONS

"Methods Used in an Automatic Logic Design Generator (ALERT)", IEEE Trans. On Computers, vol. C–18, No. 7, Jul. 1969, pp. 593–614.

"Partitioning and Placement Technique for CMOS Gate Arrays" by Odawara et al, IEEE Trans. On Computer–Aided Design, vol. CAD–6, No. 3, May 1987, pp. 355–363.

"Theory and Concepts of Circuit Layout" by Hu et al, IEEE 1985, pp. 3–18.

"Tango–Schematic Capture Software," *PERX Catalog*, pp. 18 & 19.

(List continued on next page.)

*Primary Examiner*—Vincent N. Trans
*Attorney, Agent, or Firm*—Oppenheimer Wolff & Donnelly LLP

[57] ABSTRACT

A technique for hierarchical display of control and dataflow graphs allowing a user to view hierarchically filtered control and dataflow information related to a design. The technique employs information inherent in the design description and information derived from design synthesis to identify "modules" of the design and design hierarchy. The user can specify a level of detail to be displayed for any design element or group of design elements. Any CDFG (control and dataflow graph) object can be "annotated" with a visual attribute or with text to indicate information about the design elements represented by the object. For example, block size, interior color, border color, line thickness, line style, etc., can be used to convey quantitative or qualitative information about a CDFG object. Examples of information which can be used to "annotate" objects include power dissipation, propagation delay, the number of HDL statement represented, circuit area, number of logic gates, etc. The user is able to expand and/or compress CDFG blocks either "in-place" on a higher level CDFG display or to be displayed in isolation. Simulation-related data can also be used to annotate the CDFG. By viewing CDFG's (particularly annotated CDFG's) for a variety of trial designs, a problem-solving user can gain quick insight into the effects and effectiveness of various design choices.

40 Claims, 49 Drawing Sheets

U.S. PATENT DOCUMENTS

| | | | |
|---|---|---|---|
| 4,353,117 | 10/1982 | Spellman | 364/300 |
| 4,587,625 | 5/1986 | Marino, Jr. et al. | 364/578 |
| 4,635,208 | 1/1987 | Coleby et al. | 364/491 |
| 4,675,832 | 6/1987 | Robinson et al. | 364/521 |
| 4,697,241 | 9/1987 | Lavi | 364/488 |
| 4,703,435 | 10/1987 | Darringer et al. | 364/489 |
| 4,789,944 | 12/1988 | Wada et al. | 364/488 |
| 4,805,113 | 2/1989 | Ishii et al. | 364/491 |
| 4,813,013 | 3/1989 | Dunn | 364/900 |
| 4,827,427 | 5/1989 | Hyduke | 364/489 |
| 4,831,543 | 5/1989 | Mastellone | 364/489 |
| 4,833,619 | 5/1989 | Shimizu et al. | 364/489 |
| 4,890,238 | 12/1989 | Klein et al. | 364/491 |
| 4,908,772 | 3/1990 | Chi | 364/491 |
| 4,918,614 | 4/1990 | Modarres et al. | 364/490 |
| 4,922,432 | 5/1990 | Kobayashi et al. | 364/490 |
| 4,965,741 | 10/1990 | Winchell et al. | 364/513 |
| 4,967,367 | 10/1990 | Piednoir | 364/489 |
| 4,970,664 | 11/1990 | Kaiser et al. | 364/521 |
| 5,005,136 | 4/1991 | Van Berkel et al. | 364/490 |
| 5,034,899 | 7/1991 | Schult | 364/518 |
| 5,084,824 | 1/1992 | Lam et al. | 364/490 |
| 5,111,413 | 5/1992 | Lazansky et al. | 364/578 |
| 5,146,583 | 9/1992 | Matsunaka et al. | 395/500 |
| 5,164,908 | 11/1992 | Igarashi | 364/491 |
| 5,164,911 | 11/1992 | Juran et al. | 364/578 |
| 5,220,512 | 6/1993 | Watkins et al. | 364/489 |
| 5,222,030 | 6/1993 | Dangelo et al. | 364/489 |
| 5,258,919 | 11/1993 | Yamanouchi et al. | 364/489 |
| 5,299,137 | 3/1994 | Kingsley | 364/489 |
| 5,555,201 | 9/1996 | Dangelo et al. | 364/489 |

OTHER PUBLICATIONS

"Methods Used in an Automatic Logic Design Generator (ALERT)", by Friedman et al., *IEEE Transactions On Computers*, vol. C18, No. 7, Jul. 1969, pp. 594–614.

"Quality of Designs from an Automatic Logic Generator (ALERT)," by Friedman et al., *IEEE Design Automation Conference*, 1970, pp. 71–80.

"Design Automation," by Russo, *Computer*, May/Jun. 1972, pp. 19–22.

"Computer Aided Design," by Lynn, *Computer*, May/Jun. 1972, pp. 36–45.

"Recent Developments in Design Automation," by Breuer, *Computer*, May/Jun. 1972, pp. 23–35.

"LINDA: A Local Interactive Design Aid for Computer–Aided General–Purpose Artwork Production," by Briggs, *GEC Journal of Science & Technology*, vo. 43, No. 2, 1976.

"An Engineering System for Designer, Manager and Manufacturer," by Smith et al., *Telesis*, vol. 4, No. 9, Dec. 1976, pp. 268–273.

"Computer Graphics in Power Plant Design," by Strong et al., *IEEE Power Engineering Society*, Jul. 1978.

"An Automated System to Support Design Analysis," by Willis, *12th Annual Asilomar Conference on Circuits, Systems & Computers, IEEE*, Nov. 1978, pp. 646–650.

"Computer–Aided Partitioning of Behavioral Hardware Descriptions," by McFarland, *20th Design Automation Conference, IEEE*, 1983, pp. 472–478.

"Definite Clause Translation Grammars," By Abramson, *University of British Columbia, IEEE*, 1984, pp. 233–240.

"VERIFY: A Program for Proving Correctness of Digital Hardware Designs," By Barrow, *Artificial Intelligence 24*, 1984, pp. 437–483.

"Switch–Level Delay Models for Digital MOS VLSI," By Ousterhout, *IEEE 21st Design Automation Conference*, 1984, pp. 542–548.

"Automated Generation of Digital System Schematic Diagrams," By Arya et al., *22nd Design Automation Conference, IEEE*, 1985, pp. 388–395.

"Using Bottom–Up Design Techniques in the Synthesis of Digital Hardware from Abstract Behavioral Descriptions," By McFarland, *23rd Design Automation Conference, IEEE*, 1986, pp. 474–480.

"Partitioning Before Logic Synthesis," By Camposano et al., *IBM Thomas J. Watson Research Center, IEEE*, 1987, pp. 324–326.

"Partitioning and Placement Technique for CMOS Gate Arrays," By Odawara et al., *IEEE Transactions on Computer– Aided Design*, vol. CAD–6, No. 3, May 1987, pp. 355–363.

"Partitioning A Design in Structural Synthesis," By Camposano et al., *IBM Watson Research Center, IEEE*, 1987, pp. 564–566.

"The System Architect's Workbench," By Thomas et al., *1988 DAC Draft Submission*, Nov. 1987.

"Formal Verification of Digital Circuits Using Hybrid Stimulation," By Srinivas et al., *IEEE Circuits and Devices Magazine*, Jan. 1988, pp. 19–26.

"Tektronix Design Automation Products," 1988, pp. 83–90.

"Formal Verification of the Sobel Image Processing Chip," By Narendran et al., *25th ACM/IEEE Design Automation Conference*, 1988, pp. 211–217.

"Area–Time Model for Synthesis of Non–Pipelined Designs," by Jain et al., *CH2657–5 1988 IEEE*, pp. 48–51.

"CAD For System Design: Is It Practical?", *IEEE Design & Test of Computers*, Apr. 1989, pp. 46–55.

"Architectural Partitioning for System Level Design," By Lagnese et al., *26th ACM/IEEE Design Automation Conference*, 1988, pp. 62–67.

"Here's An Easy Way to Test ASICs," By MacLeod, *Electronics*, May 1989, pp. 116–117.

"Experience with the ADAM Synthesis System," By Jain et al., *26th ACM/IEEE Design Automation Conference*, 1989, pp. 56–61.

"CHIPPE: A System for Constraint Driven Behavioral Synthesis," By Brewer et al., *IEEE Transactions on Computer–Aided Design*, vol. 9, No. 7, Jul., 1990, pp. 681–695.

"BAD: Behavioral Area–Delay Predictor," By Kucukcakar et al., *CEng Technical Report* 90–31, Nov. 1990.

"An Efficient Heuristic Procedure for Partitioning Graphs," By B.W. Kernighan et al., *The Bell System Technical Journal*, Feb. 1970, pp. 291–306.

"HYPER–LP: A System for Power Minimization Using Architectural Transformations," By Chandrakasan et al., *IEEE*, 1992, pp. 300–303.

| LEVEL STAGE | HIGHEST LEVEL | MEDIUM-HIGH | MEDIUM-LOW | LOWEST LEVEL |
|---|---|---|---|---|
| CONCEPTUAL | MILESTONE(1,1) | MILESTONE(1,2) | MILESTONE(1,3) | MILESTONE(1,4) |
| SPECIFICATION | MILESTONE(2,1) | MILESTONE(2,2) | MILESTONE(2,3) | MILESTONE(2,4) |
| FEASIBILITY | MILESTONE(3,1) | MILESTONE(3,2) | MILESTONE(3,3) | MILESTONE(3,4) |
| DESIGN | MILESTONE(4,1) | MILESTONE(4,2) | MILESTONE(4,3) | MILESTONE(4,4) |
| IMPLEMENTATION | MILESTONE(5,1) | MILESTONE(5,2) | MILESTONE(5,3) | MILESTONE(5,4) |
| VERIFICATION | MILESTONE(6,1) | MILESTONE(6,2) | MILESTONE(6,3) | MILESTONE(6,4) |

| STAGE \ LEVEL | SYSTEM LEVEL (3329) | SYSTEM LEVEL (3331) | SYSTEM LEVEL (3333) | BEHAVIOR/ARCHIT. LEVEL (3335) | BEHAVIOR/ARCHIT. LEVEL (3337) | MICRO-ARCHIT. LEVEL (3339) | MICRO-ARCHIT. LEVEL (3341) | LOGIC LEVEL (3343) |
|---|---|---|---|---|---|---|---|---|
| CONCEPT (3345) | SYS. BLOCK DIAGRAM | ARCHITECT. &P FUNCTIONAL | FUNCTIONAL PARTITION, & CHIP PARTITION. | PARTITION LOGIC VS. MEMORY | PRELIM. FUNC.SYS. VECTORS (TEST BENCH) | PRELIM. TRL DESCR. | ENTITY/PORT INTERFACE DEFS (EACH BLOCK) | EXISTING MODULES OR DESIGNS |
| SPECIFICATION (3347) | BLOCK DEFIN. & BEHAV. DESC. | BLOCK FUNCTIONAL SPEC. (BEHAV.) | SYS. TIMING GOALS; AREA & PWR CONSTR. | SYSTEM DATA/CTRL FLOW SPECS | # CHIPS; PKG.SPECS. | MICRO-ARCH. TIMING & AREA GOALS (PWR) | BLOCK RTL SPEC. (SIM) TIMING VS. AREA SPECS | LOGIC DEF COST SPEC; CRIT.PATH SPECS. |
| FEASIBILITY (3349) | ASIC PARTITION | BD./PKG. SIZE&SPEED ESTIMATION | "WHAT-IF" ANALYSIS & TRADE-OFF ANALYSIS | BOARD FLOOR-PLANNING | COST/SIZE/SPD./PWR EST. (FLOORPLAN) | ASIC(s) AREA/SPEED/PWR FEASBLTY. | RTL SYNTHESIS/OPTIMIZATION (ESTIM. ONLY) | LOGIC/FUNCTION TECHNOL FEAS. |
| DESIGN (ASIC) (3351) | ASIC(s) BEHAV. DESIGN | ASIC(s) TRL DESIGN | SYSTEM FUNCTIONAL DESIGN | GLOBAL NET-LIST GENERATION | SYSTEM-LEVEL EMULATION/SIMULATION | ASIC REPART-IONING | CRIT.PATH CONSTR. & DESIGN | CHIP DESIGN (AREA/SPEED) & TEST DESGN. |
| IMPLEMENT (ASIC) (3353) | BEHAV. TECHNOL BINDING | RTL TECHNOL BINDING | OPTIMIZ-ATION | SYNTHESIS &P OPTIMIZ. | FINAL SCHEM. FLOORPLAN, PLACEMENT, TIMING EST. | CHIP TIMING IMPLEMENT | CRIT.PATH OPTIM. & LAYOUT | CHIP(S) LAYOUT TEST GEN. |
| VERIFY (3355) | SYSTEM FUNCTION | SYSTEM CONSTR. | SYSTEM TIMING | CHIP(s) FUNCTION | CHIP(S) TIMING CONSTR. | CRITICAL PATHS | CHIP LEVEL LOGIC VS. LAYOUT | TEST COVERAGE |

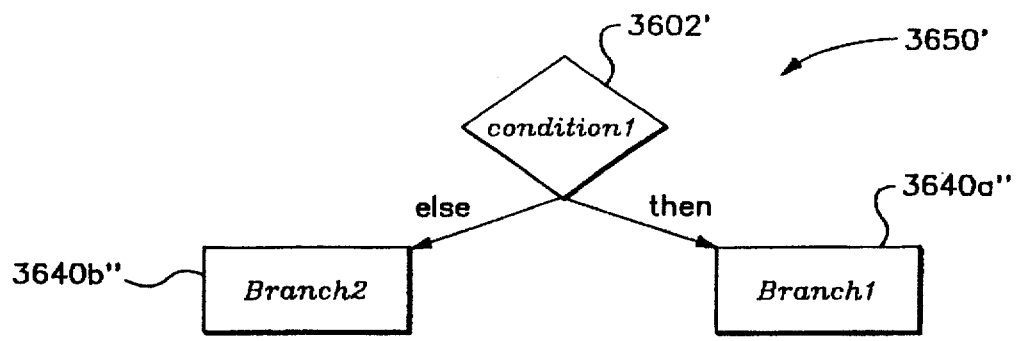
Fig.36e
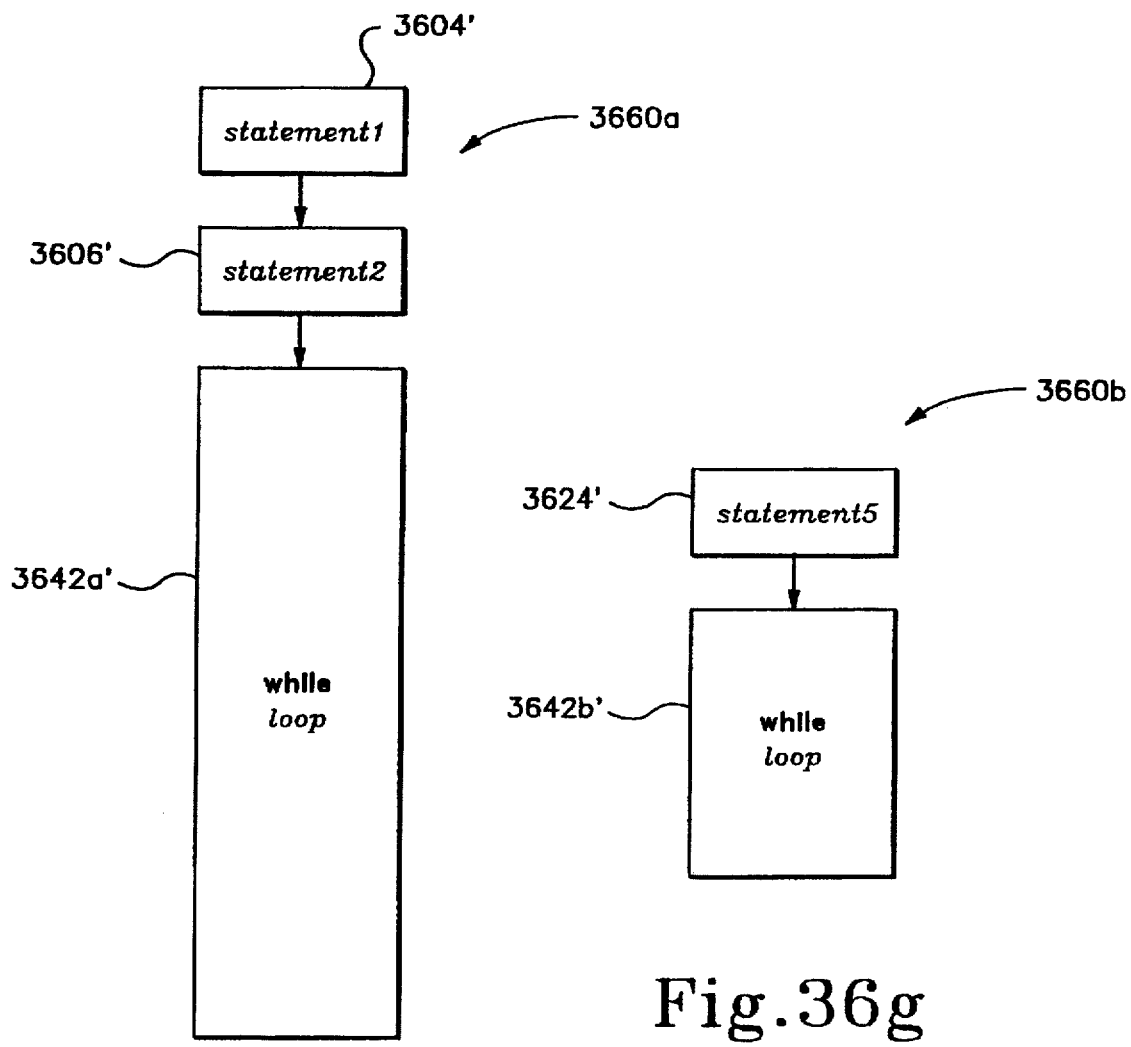
Fig.36f
Fig.36g

METHOD AND SYSTEM FOR CREATING AND VALIDATING LOW LEVEL DESCRIPTION OF ELECTRONIC DESIGN FROM HIGHER LEVEL, BEHAVIOR-ORIENTED DESCRIPTION, INCLUDING INTERACTIVE SYSTEM FOR HIERARCHICAL DISPLAY OF CONTROL AND DATAFLOW INFORMATION

This application is a continuation U.S. patent application Ser. No. 08/196,337 dated Feb. 10, 1994, now U.S. Pat. No. 5,555,201; which is a CIP of U.S. patent application Ser. No. 08/077,304 dated Jun. 14, 1993, now abandoned; which is a CIP of U.S. patent application Ser. No. 08/076,729 dated Jun. 14, 1993, now U.S. Pat. No. 5,544,066; which is a CIP of U.S. patent application Ser. No. 08/076,738 dated Jun. 14, 1993, now U.S. Pat. No 5,557,531; which is a CIP of U.S. patent application Ser. No. 08/076,728 dated Jun. 14, 1993, now U.S. Pat. No. 5,541,849; which is a CIP of U.S. patent application 08/077,403 dated Jun. 14, 1993, now U.S. Pat. No. 5,553,002.

CROSS-REFERENCE TO RELATED APPLICATIONS

This is related to the following Patent Applications:

U.S. patent application Ser. No. 08/077,304, filed Jun. 14, 1993 by Watkins et al (abandoned);

U.S. patent application Ser. No. 08/077,294, filed Jun. 14, 1993 by Dangelo et al (abandoned);

U.S. patent application Ser. No. 07/917,801, filed Jul. 20, 1992 by Watkins et al (now U.S. Pat. No. 5,220,512);

U.S. patent application Ser. No. 07/512,129, filed Apr. 19, 1990 by Watkins et al (abandoned);

U.S. patent application Ser. No. 08/054,053, filed Apr. 26, 1993 by Dangelo et al (abandoned);

U.S. patent application Ser. No. 07/507,201, filed Apr. 6, 1990 by Dangelo et al (now U.S. Pat. No. 5,222,030);

U.S. patent application Ser. No. 08/076,729, filed Jun. 14, 1993 by Dangelo et al (now U.S. Pat. No. 5,544,066);

U.S. patent application Ser. No. 08/076,738, filed Jun. 14, 1993 by Dangelo et al (now U.S. Pat. No. 5,557,531);

U.S. patent application Ser. No. 08/076,728, filed Jun. 14, 1993 by Dangelo et al (now U.S. Pat. No. 5,541,849); and U.S. patent application Ser. No. 08/077,403, filed Jun. 14, 1993 by Dangelo et al (now U.S. Pat. No. 5,553,002).

1. Technical Field of the Invention

The present invention relates to computer-aided design tools and techniques for the interactive design, implementation, and simulation of complex circuits and systems, particularly digital devices, modules and systems.

2. Background of the Invention

Present day state-of-the-art design technique, logic synthesis, is really only a mapping between different levels of physical abstraction.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

The Modular Design Environment (MDE) produced by LSI Logic Corporation of Milpitas, Calif., is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEEE Std 1076–1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macro-cell, a logic gate, or any level of abstraction in between. A "configuration" can be used to describe how design entities are put together to form a complete design.

VHDL supports three distinct styles for the description of hardware architectures. The first of these is "structural" description, wherein the architecture is expressed as a hierarchical arrangement of interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main hereinafter, the behavioral description style is discussed. However, all three styles may be intermixed in a single architecture.

A methodology for deriving a lower-level, physically-implementable description, such as a RTL description of the higher level (e.g. VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term_expansion", which converts predefined rules into ordinary Prolog clauses.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for hierarchical design whereby a previously created and stored circuit may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

Typically, the form of user interaction with the schematic editor is an object-oriented screen display whereby the user thereof may manipulate objects on the screen through the use of a pointing device. A pointing device is any device through the use of which a user may "point" to and identify objects on a display screen. Such object-oriented interfaces are well known to those skilled in the art. One example of such and interface is the Macintosh Finder for the Apple Macintosh computer, both produced by Apple Computer, Inc. Another example of such an interface is that of Microsoft Windows, produced by Microsoft Corp. of Redmond, Wash.

In order to simulate the performance of the circuit, it is necessary to run a simulator. A simulator is a software tool which operates on: a digital representation, or simulation model of a circuit, a list of input stimuli representing real inputs, and data about the performance characteristics of the represented circuit elements; and generates a numerical representation of the response of the circuit which may then either be viewed on the display screen as a list of values or further interpreted, often by a separate software program, and presented on the display screen in graphical form. Typically, the graphical presentation is designed to produce an image similar to what one would see on an oscilloscope or logic analyzer screen monitoring a real circuit connected as described in the schematic diagram if the real inputs represented by the list of input stimuli were applied. The simulator may be run either on the same computer which is used for schematic entry, or on another piece of electronic apparatus specially designed for simulation. Simulators which run entirely in software on a general purpose computer, whether the same as or different from the one used for schematic entry, will hereinafter be referred to as software simulators. Simulations which are run with the assistance of specially designed electronic apparatus will hereinafter be referred to as hardware simulators. An example of a such a hardware simulator is described in U.S. Pat. No. 4,587,625, entitled PROCESS FOR SIMULATING DIGITAL STRUCTURES. Usually, software simulators perform a very large number of calculations compared to the number required for schematic entry and operate slowly from the user's point of view. In order to optimize performance, the format of the simulation model is designed for very efficient use by the simulator. Hardware simulators, by nature, require that the simulation model comprising the circuit description and its performance parameters be communicated in a specially designed format. In either case, a translation process is required.

Simulation is often provided by utilizing simulation models at one or more of several different levels. Component-level models attempt to describe the exact behavior of a specific component, such as a gate or transistor, when it is acted upon by a stimulus or stimuli. Behavioral-level models provide a simplified model of extremely complicated devices, such as a microprocessor, or an operational amplifier. Such models, if simulated exactly on a transistor by transistor basis, would become prohibitive in terms of the size of their descriptions and the number of calculations and amount of computing time required to completely simulate their function. In response to this, the behavioral-level model provides a logical or mathematical equation or set of equations describing the behavior of the component, viewed as a "black box". Such models may either provide a very complete and accurate description of the performance of the modeled device, or a simple description of the types of signals one might expect the modeled device to produce. For example, a behavioral model of a microprocessor might provide the user with the capability of issuing various types of bus cycles, but not the capacity to actually simulate the execution of a program. Circuit-level models typically comprise a plurality of component-level and/or behavioral-level models and the descriptions of their interconnections for the purpose of simulating the performance of a complete circuit comprising a number of interconnected components. Simulations of hierarchical designs require that the included macro-level components also be simulated. Circuit-level or behavioral-level models of the macro-level components may be used to simplify this task.

The simulation model used by the simulator is usually derived from the output of the schematic editor by a schematic compiler, also making use of information about performance characteristics of the circuits, often stored in simulation libraries. Simulation libraries contain simulation characteristics of numerous circuit components and are typically maintained in files on the computer's on-line storage devices. The schematic compiler is a software tool which interprets the circuit element and interconnection information generated by the schematic editor and the performance characteristics stored in the simulation libraries, and reorganizes and translates them into the simulation model for the circuit. Occasionally, either the simulator or the schematic editor includes the function of a schematic compiler, in which case, separate compilation is not required.

Simulators often allow several different types of simulation. One type is a complete simulation run, where an initial set of conditions is specified, a set of input stimuli is defined and the duration of the simulated run is specified. The simulator then operates on the data and produces a file of the results which may be displayed. Another type of simulation, similar to the complete simulation run is an event-terminated run, whereby the simulation is run until a certain pre-specified event occurs in the simulation results. The simulation may be terminated immediately at that point, or run for some simulated duration afterwards. One final type of simulation run is a stepped simulation run, whereby the current simulation may be "stepped" by one unit of time, or one clock cycle, or some other similar criterion.

The process of designing an electronic circuit on a typical ECAD system is done in several discrete steps. A schematic diagram of the circuit is entered interactively through the use of a schematic editor which produces a digital representation of the circuit elements and their interconnections. The user of the ECAD system then prepares a list of input stimuli representing real input values to be applied to the simulation model of the circuit. This representation is then compiled by a schematic compiler and translated into a form which is best suited to simulation. This new, translated representation of the circuit is then operated upon by a simulator, which produces numerical output analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

While the design process outlined herein is significantly faster and less error prone than manual design, the user must still go through the design process in a number of discrete, disjointed steps. The design process is broken into two or three separate thought processes. First, the user must enter the schematic into the computer using a schematic editor. Second, the user completes the schematic entry process and instructs the appropriate software tool (schematic editor, schematic compiler, or simulator) to prepare the design for simulation. Third, the user must create simulation stimuli, usually with the assistance of yet another software tool, and instruct the simulator to apply these stimuli to the simulation model of the circuit being designed. The results are viewed by the user, who then makes a judgement about whether the design is performing correctly.

In modern digital systems, designs incorporating 20,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

This need for frequent, partial simulation is somewhat frustrated by current ECAD systems which require the user to break his train of thought in the design process and to move from one tool to the next. Some ECAD systems have begun to attack this problem by providing "windowed" displays, whereby the user may display the output of several software programs at once on different portions of the display screen. This design environment, however is still not fully interactive. In order to simulate small portions of a circuit, the user may need to design special test circuits incorporating those small portions of the circuit and simulate them in isolation.

As described, for example, in parent case (Attorney Docket No. 92-221; LLC-2191) a top-down design process for electronic systems and devices may proceed in an organized, hierarchical manner, from a highest level description of an electronic design, through various stages of refinement, to a lowest level description of the design. These levels may include system level, architectural level, behavioral level, register-transfer (RT) level, logic level and structural level. As the design is being refined, the engineer must make choices and explore alternatives to ensure that a valid, implementable design can and will be achieved. Changes made at one level of abstraction will typically influence the design at other stages of abstraction. Hence, it is important that the designer have ready access to various bits and pieces of information about the circuit or system under design at various stages of abstraction. The present invention describes techniques for organizing and providing such information with a high degree of concurrency, and a facile user-interface for accessing and manipulating such information.

DISCLOSURE OF THE INVENTION

It is therefore an object of the present invention to provide an improved ECAD system whereby the characteristics of schematic editor, schematic compiler, and simulator are all presented to the user in a fashion such that they appear as a single, integrated function.

It is a further object of the present invention to allow portions of a circuit which is being designed on such an improved ECAD system to be simulated in isolation without requiring that those circuit portions be copied to another schematic, regardless of whether or not the overall schematic diagram has been completed, and regardless of whether or not the circuit portion has other connections.

It is a further object of the present invention to allow the user to view full or partial simulation results on the display screen representation of the schematic as it is being edited on the improved ECAD system.

It is a further object of the invention to enable the user to view state, performance, loading, drive strength or other relevant data (hereinafter, "state" data) in display areas immediately adjacent to the schematic object to which it pertains.

It is a further object of the invention to enable the user to perform simulator setup on the schematic diagram by using point and select techniques to identify items to be simulated, input values, override values, and points to be monitored.

It is a further object of the invention to enable the user to create state tables for circuits, portions of circuits, or components.

It is a further object of the invention to enable the user to store the interactive state data for viewing at another time.

It is a further object of the invention to enable the user to create macros to move through the simulation in defined steps (of "n" time units of the lowest system granularity), or to cycle a clock.

It is a further object of the invention to enable the user to pop up data sheets or any library element being used, and further to allow the user to define his/her own data sheets and to allow these to be popped up in the schematic editor environment.

It is a further object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

It is a further object of the invention to provide a technique interactive design, synthesis, simulation and graphical display of electronic systems.

It is a further object of the present invention to provide a technique for indicating the source of design rule violations in a logic synthesis or design process to a user.

It is a further object of the present invention to provide a technique for automatically providing suggestions to a user about possible alterations or corrections to a design or design description of an electronic system which violates design rules.

It is a further object of the invention to accomplish the above objects in a manner compatible with the design of board-level systems, multi-chip modules, integrated circuit chips, and ASICs using core modules.

It is a further object of the invention to accomplish the above objects independently of scale, complexity, or form factor of the electronic system.

It is an additional object of the present invention to provide a technique for gathering and condensing relevant information about an electronic design into a form readily accessible to the designer, for presenting this information to the designer in a readily digestible (e.g., visual) format, and to allow the designer to interact with this information in a facile, ergonomic manner.

It is an additional object of the present invention to provide a technique for propagating information from level-to-level in a hierarchical design system.

It is an additional object of the present invention to provide a technique for providing the designer with suggestions regarding the steps necessary to create information which is not available at a particular instance of the design process.

According to the invention, there is provided an electronic CAD system operated with a suite of software tools for enabling a designer to create and validate a structural description and physical implementation of a circuit or system (hereinafter, "device") from a behavior-oriented description using a high-level computer language. The methodology includes the following steps:

First, the designer specifies the desired behavior of the device in a high-level language, such as VHDL. The description includes high-level timing goals.

Next, in a "behavioral simulation" step, starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioned, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

According to the invention, the electronic CAD system comprises a computer processor, mass storage, a display screen, means for user input, and means for circuit simulation. The electronic hardware of the means for simulation may comprise the ECAD system's computer, one or more general purpose computers interfaced to the ECAD system's computer, one or more hardware simulators interfaced to the ECAD system's computer, or any combination of these. The user interacts with the ECAD system through the use of an object-oriented user interface, whereby the user may create, select, move, modify and delete objects on the display screen, where objects may represent circuit components, wires, commands, text values, or any other visual representation of data. The graphical and software techniques of interacting with a user on such an object-oriented user interface are well known to those skilled in the art and need not be elaborated upon in this discussion.

A component database resides on the ECAD system's mass storage. This database comprises a number of data objects: graphical symbols, connection information, timing parameters, and simulation models corresponding to various electronic components. These data objects contain all of the information necessary to display, interconnect, and edit schematic symbols on a graphical display screen. The simulation model data objects contain the behavioral data corresponding to the components represented by the graphical objects such that the simulator may produce results closely approximating those that would be observed if real components were used and measured on standard laboratory instrumentation.

Five major software program functions run on the ECAD system: a schematic editor, a logic compiler, a logic simulator, a logic verifier, and a layout program. The schematic editor program allows the user of the system to enter and/or modify a schematic diagram using the display screen, generating a net-list (summary of connections between components) in the process. The logic compiler takes the net list as an input, and using the component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

These programs are typical of similar, discrete programs existing in the current art, but are slightly modified (improved in their functionality) in the source of their control information. The editor's user interface is extended such that the simulator functions may be requested by the user. It is further modified such that whenever a change is made to the schematic, the editor updates its output files (net list, etc.) and signals the logic compiler to re-compile the schematic using the new data. The logic compiler is modified to accept such commands directly from the editor, rather than from user input. The simulator is modified such that it can accept directly from the editor: requests for simulation runs, initial data, signal data, and other information usually entered by the user via the keyboard and/or pointing device. It is further modified to signal the editor that it has completed a simulation operation, and to provide its results in the form of a data structure, either in memory or in a disk file, rather than to the display screen. The logic verifier is also modified such that it interacts with the editor directly, rather than with the display screen and keyboard/pointing device.

Further according to the invention, the editor causes the logic compiler to re-compile the schematic each time a graphical object (schematic symbol) is added, modified, or deleted, and each time a connection is made, changed or removed. In this way, the editor ensures that the net-list and simulation structures are always current and representative of the schematic diagram as displayed on the ECAD system's graphical display screen.

At any time, the user may instruct the editor to create areas on the display screen adjacent to selected schematic symbol connection points (pins) or on connection nets (wires). By conventions already in place in all editors, compilers, and simulators, these connection points and/or connection nets are uniquely identifiable. The user may specify that these data areas are to contain textual state data, or graphical state data. Next the user may identify certain signal values to be injected into the circuit representation. Ordinarily these would be input signals, but for simulation of part of the schematic, it is possible to override the outputs of selected schematic object to force special conditions to exist on a net, or to force signals into a particular input connection point on a schematic object, effectively overriding its connection. It is also possible for the user to indicate that only certain components are to be compiled and simulated, thus improving the compile and simulation times. This is accomplished by one of two means: either subset net-list and object files are created, reducing the amount of data to be handled by the logic compiler and logic simulator, or software flags are provided in the data structures indicating which data objects are to be considered active, allowing the logic compiler to selectively compile the schematic and allowing the logic simulator to selectively simulate the schematic.

All of the user input occurs by pointing with the pointing device and selecting connection nodes, nets or devices and issuing commands which affect the selected object's numerical parameters. Each data object (schematic symbol, connection net (wire), and connection point (pin)) has special parameters which allow it to be made eligible or ineligible for compile and/or simulation, and to have some or all of its other parameters overridden for the purposes of simulation.

When the user wishes to perform a simulation he issues a command which is relayed by the editor to the simulator. The simulator performs a simulation run according to the user's specification and places the simulation results into a data structure. It signals the editor that the simulation is complete and then fills in the results on the screen, according to the user's display specification. The user may specify a complete simulation run from a set of initial conditions or a simulation stepped run which continues from the last simulation's ending point. In the event of a complete simulation run, a new simulation results data structure is created and filled in. In the event of a stepped run, the simulator appends new simulation data to the end of the previously created simulation results data structure.

Simulators, by their nature, must maintain the last state (history) of every node for every enabled component in the schematic. However, this history is kept only for those signals requested. This is done to minimize the amount of data storage required. It is possible to request that the history be maintained for all nodes at the expense of some amount of additional memory (or disk space) required.

When the editor receives notification from the simulator that the simulation run is finished, it displays the simulation data on the screen according the specifications for the display areas that the user has requested. If it is a textual display area, then the last state of the node is written into the allocated display area. If it is a graphical (timing diagram) display area, then the history data is presented in the allocated display area in the form of a timing diagram. In either case, the user can step through the state data back from the end point to any previous point in the simulation from the beginning of the session.

The editor may also create, at the user's request, an area on the screen for the presentation of a state table. The user identifies the signals to be monitored and identifies the simulation conditions. The editor then draws a table on the screen and headings corresponding to the monitored signals' names, and requests a series of stepped simulations. After each step, the editor records the last state data into columns under the signal name headings, thus creating a state table of the type seen in component specifications.

The techniques described hereinabove for electronic system synthesis, graphical design of an electronic system, simulation and display are independent of the type of electronic system being designed and may be applied with equal facility to multi-board systems, board-level designs, ASICs, custom integrated circuits, portions of systems, or multi-chip modules.

According to an aspect of the invention, the techniques of electronic circuit synthesis and simultaneous graphical editing and display can be used in combination to provide a user with means for viewing a behavioral synthesis of an electronic system in progress, and to simulate the all or a portion of the electronic system and to view signals within the electronic system.

According to another aspect of the invention, design rule violations (e.g., timing violations detected during synthesis) flagged by the synthesis process can be presented to the user by display the portion of the electronic system involved in the violation in schematic diagram form, and presenting simulation results which illustrate the violation on the schematic diagram.

According to another aspect of the invention, an expert system can be used to analyze the electronic system and the design rule violation, and to suggest to the user possible alterations or corrections to the design of the electronic system which would eliminate or correct the design rule violation.

Parent U.S. patent application Ser. No. 07/917,801, filed Jul. 20, 1992 (U.S. Pat. No. 5,220,512; Jun. 15, 1993) generally describes a system wherein information relating to signal values is displayed to the user, simultaneously and interactively, immediately adjacent a selected line on a schematic diagram. The present invention is similarly interactive and simultaneous, and provides the user with the ability to display and edit information other than signal values in the context of a broader range of graphical objects that may be derived from various hierarchical levels of abstraction of an electronic design on an ECAD system.

According to an additional aspect of the invention, the editor may also create, at the user's request, an area on the display for the presentation of a state table. The user identifies the signals to be monitored, and identifies the simulation conditions. The editor then draws a table on the screen, wherein headings correspond to the monitored signals' names, and requests a series of stepped simulations. After each step, the editor records the last state data into columns under the signal name headings, thus creating, for example, a modified state table of the type seen in component specifications.

According to an additional aspect of the invention, the ECAD system includes a sub-system for gathering and condensing (preferably all) information relevant to a design. This information may include information about the origin of a design, the various objects which make up the design, the revision history of the design, and the authorship of the design. The information may also include information concerning the hardware specifications of the components of the design, for example, circuit loading, performance and timing information, and drive strength.

The various pieces of information available to the designer may typically already exist in diverse areas of an ECAD system—for example in, a schematic editor, a logic compiler, and a simulation program, as well as in various databases. These areas, or sources, are generally well known tools operating on an ECAD system. The present invention provides a user interface for managing retrieving information from such diverse sources.

According to an additional aspect of the invention, a user interface is provided with the capability of displaying abstract representations of a design in progress. These representations include all levels of design abstraction and include, but are not limited to, system level, architectural level, RT level, logic level, gate level and transistor level. The user interface also is also provided with the capability of linking like kinds of information over different representations, for example, a block diagram view and a gate level implementation of the block diagram. Common signal paths are shown in the block diagram and gate level views using a common symbology, such as color, shading, dashed lines, or the like. Alternatively, one view (e.g., block diagram) may be superimposed on another view (e.g., schematic).

Other objects, features and advantages of the invention will become apparent in light of the following description thereof.

BRIEF DESCRIPTION OF THE DRAWINGS

FIG. 20b is a representative hierarchical view of the multi-chip module of FIG. 20a.

FIG. 21b is a representative hierarchical view of the board-level system of FIG. 21a.

FIG. 33a is a chart of a generalized milestone matrix illustrating a top-down design methodology of the present invention.

FIG. 33b is a chart of a specific milestone matrix directed to the design of an integrated circuit, according to the present invention.

FIG. 36a is a representation of an exemplary HDL design description, according to the invention.

FIG. 36b is a control and data flow graph (CDFG) corresponding to the HDL description of FIG. 36a.

FIG. 36e is a top-level control and data flow graph, similar to that of FIG. 36d, according to the invention.

FIG. 36f and 36g are CDFGs, showing a one-level expansion of a block of the CDFGs of FIG. 36d or 36e, according to the invention.

DETAILED DESCRIPTION OF THE INVENTION

Introductory Comments

Figure 1:
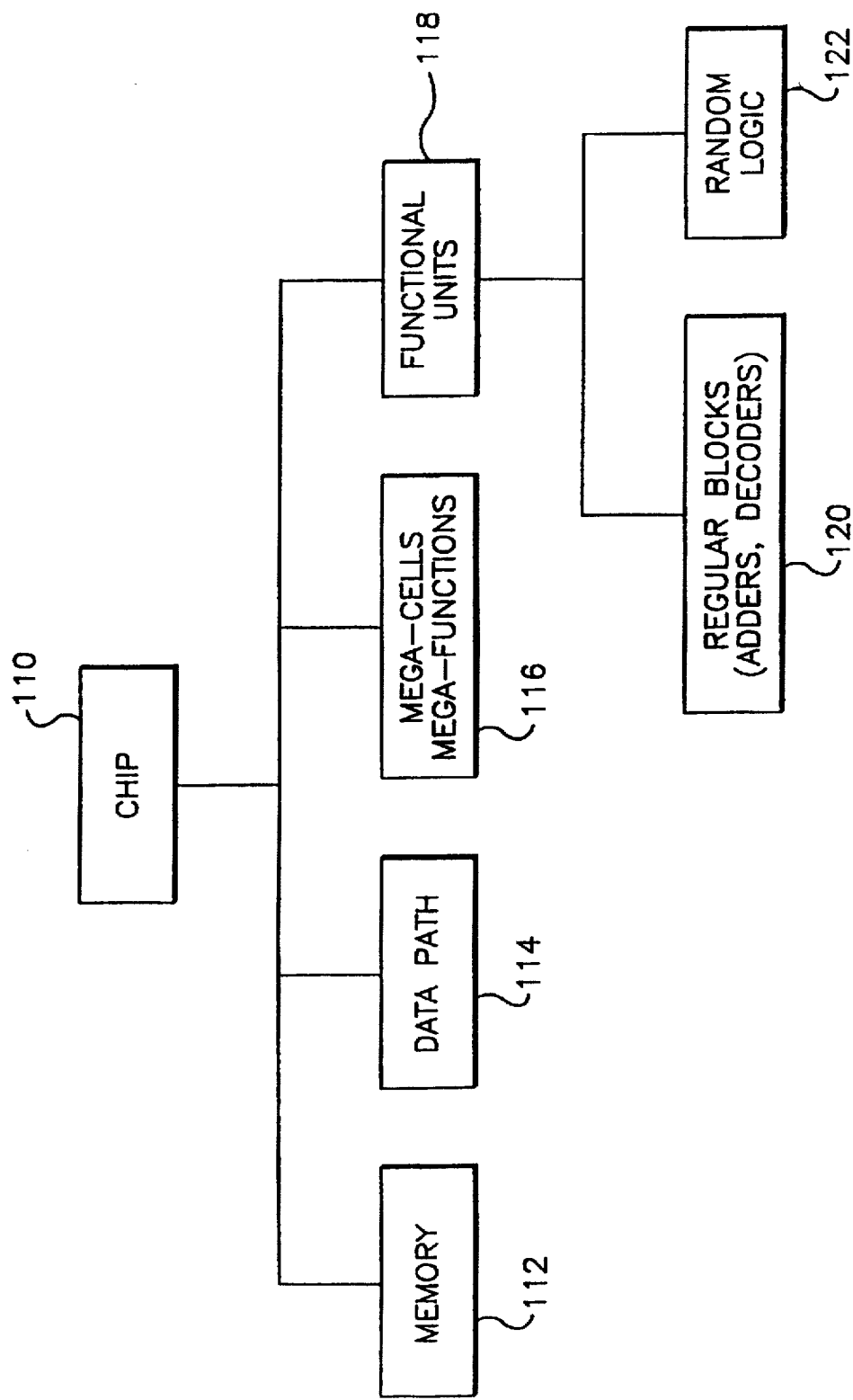
FIGS. 1–7 are schematic representations of the methodology of the present invention.

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for hierarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, or the like.

FIG. 12

Figure 12:
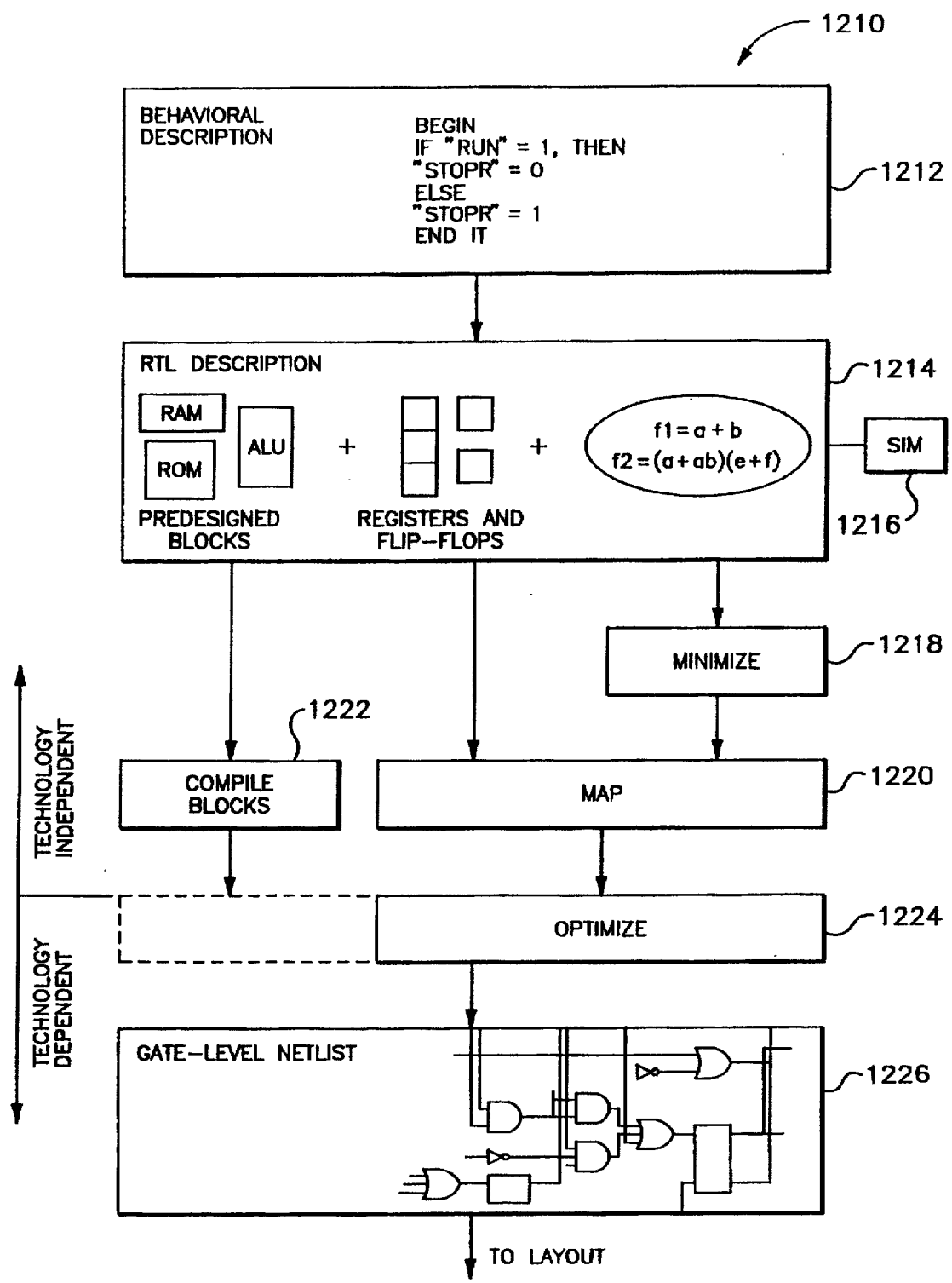
FIG. 12 is a block diagram of a generalized logic synthesis methodology, lacking critical features of the present invention.

FIG. 12 shows a generalized design methodology 1210. It should be understood that the descriptions contained herein are in terms of a suite of software "blocks" that can be run on any suitable computer system (shown, for example, in FIG. 16).

A designer begins designing a circuit (or system) by formulating a behavioral description of a circuit's desired behavior in a high-level computer language, such as VHDL. This is represented in the block 1212, which shows exemplary high-level code describing a desired behavior.

Next, the designer re-formulates the design as a register-transfer level (RTL) description of the circuit in terms of pre-designed functional blocks, such as memories and registers. This is represented in the block 1214.

The resulting RTL description is simulated, in a block 1216, to ensure that it equates to the original behavioral description. At that point, the design consists of synthesizable parts (combinational logic, registers and flip-flops) and non-synthesizable parts (pre-designed blocks).

The logic is then minimized in a block 1218, by finding common terms that can be used repeatedly, and maps the description into a specific technology (e.g., CMOS) in a block 1220. Further, the non-synthesizable parts are compiled in a block 1222.

The foregoing steps 1212 through 1222 are all technology independent (except for the step 1222, to the extent that it is technology dependent).

The design of at least the synthesizable parts is optimized in block 1224 to produce a gate-level net list 1226.

The blocks 1218 through 1222 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established.

The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the behavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 1–8

There follows an exemplary embodiment of the invention described in the context of an ASIC design.

FIG. 1

FIG. 1 is a simplistic view of an ASIC chip 110, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 110 includes the following major functional blocks: memory 112, data path 114, mega-cells and mega-functions 116 and functional units 118 which may include regular blocks 120 such as adders and decoders and random logic 122.

The memory block 112 is generated by memory compilers using efficient technology-dependent building blocks. The output of the memory compiler is a net list of primitive transistors.

The data path block 114 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 116 is chosen from pre-designed building block libraries, which are already designed for optimal performance.

The regular functional units 120 are generated using regular blocks such as adders, decoders and multiplexers. These blocks can be further optimized, if desired.

The random logic blocks 122 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 2-5

FIGS. 2-5 describe a synthesis design methodology that is independent of any particular design style or technology. The various steps (blocks) of this methodology are represented by the circled numerals 1-18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Figure 13:
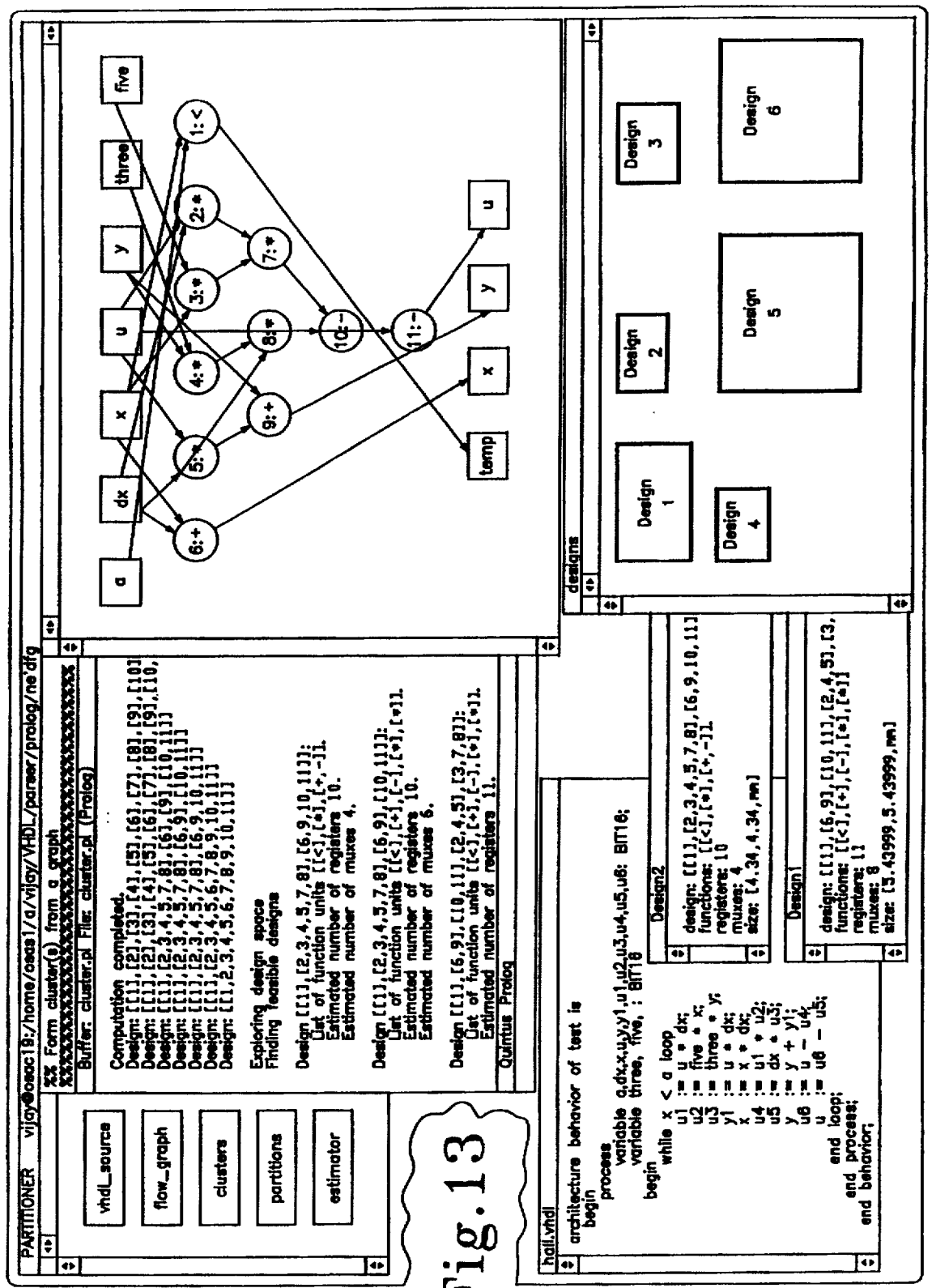
FIGS. 13–15 are exemplary screen displays generated by a computer system employing the methodology of the present invention.
Figure 14:
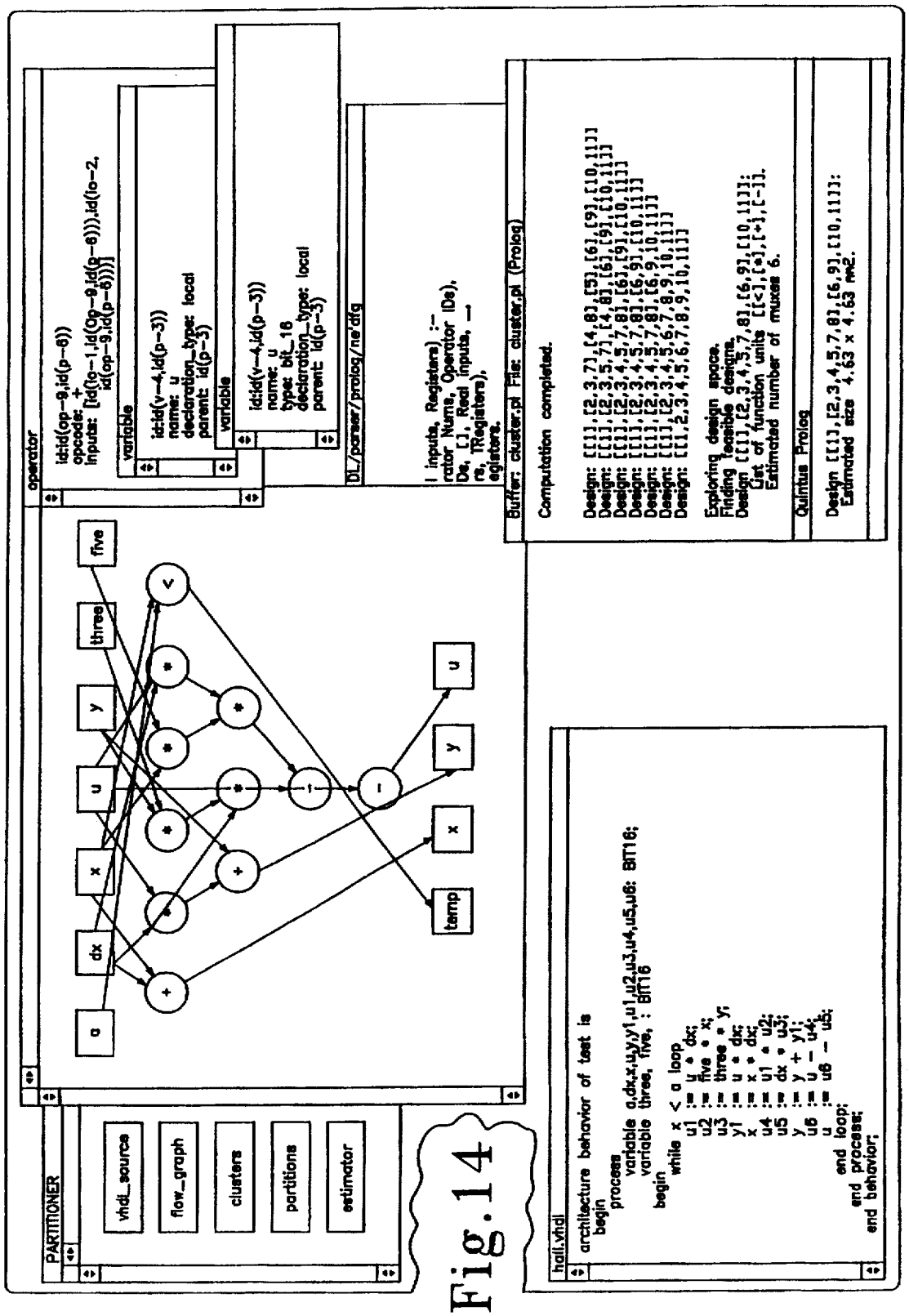
Figure 15:
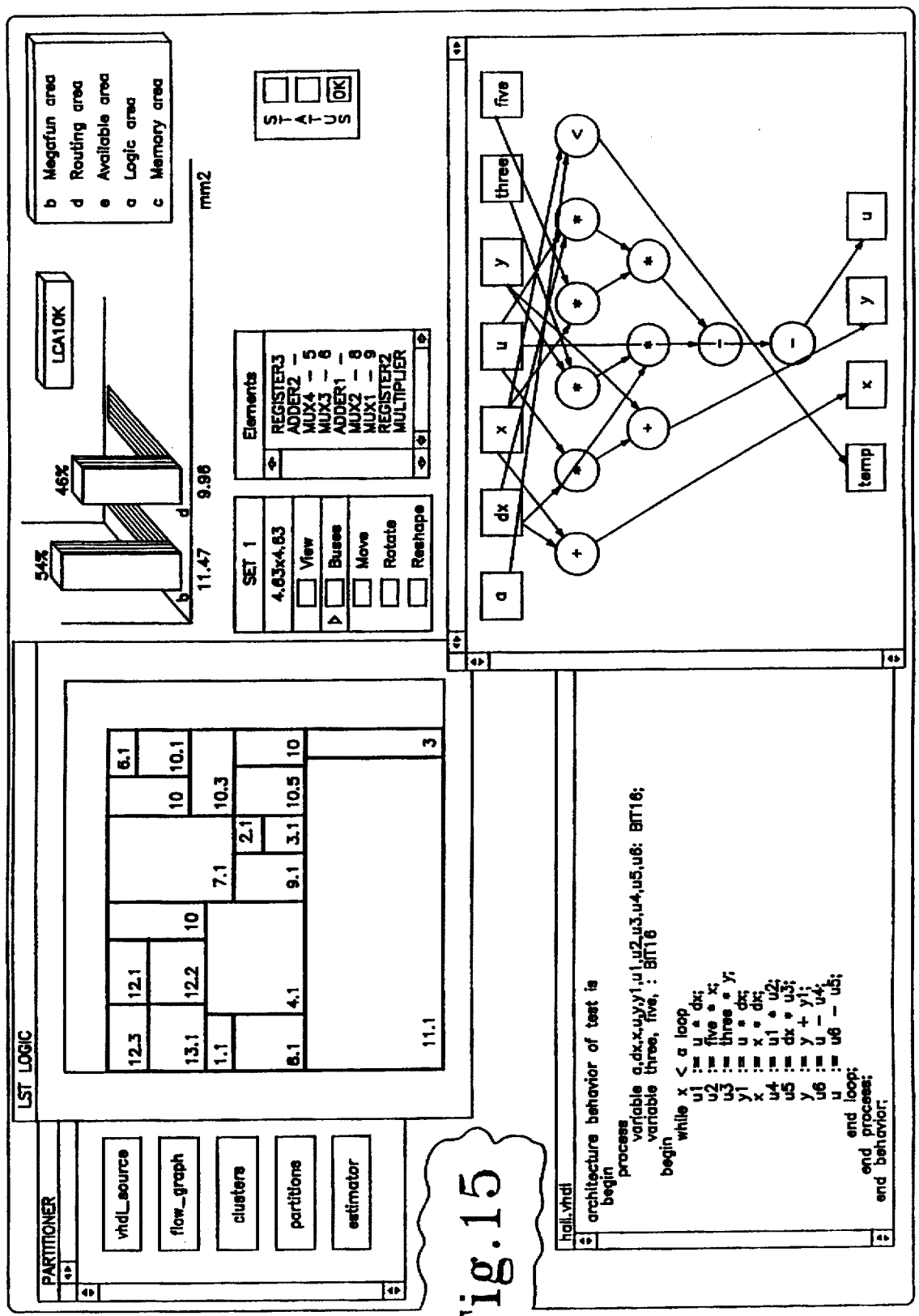

Step 3 is Partitioning. Given the behavioral description of the design, partitioning (the Partitioner) breaks the design into separate modules that will make the overall synthesis, analysis and verification tasks more manageable. In doing so, the Partitioner consults technology files (described hereinafter) containing packaging, I/O capabilities and other technology-dependent information to optimally partition the design. In addition to functionally partitioning the design, the Partitioner can help the designer (see FIGS. 13-15 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages—while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

Figure 2:
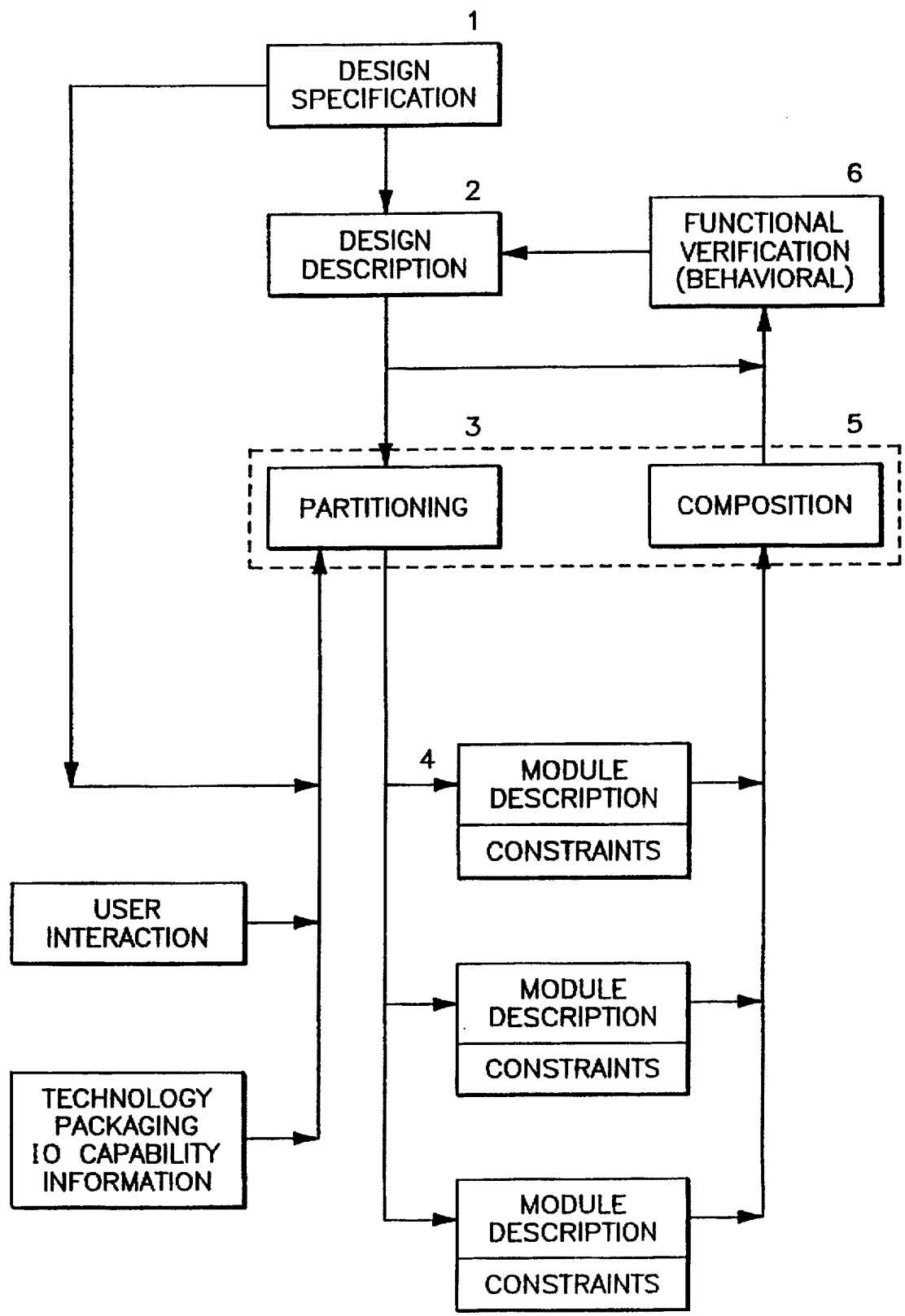
Figure 4:
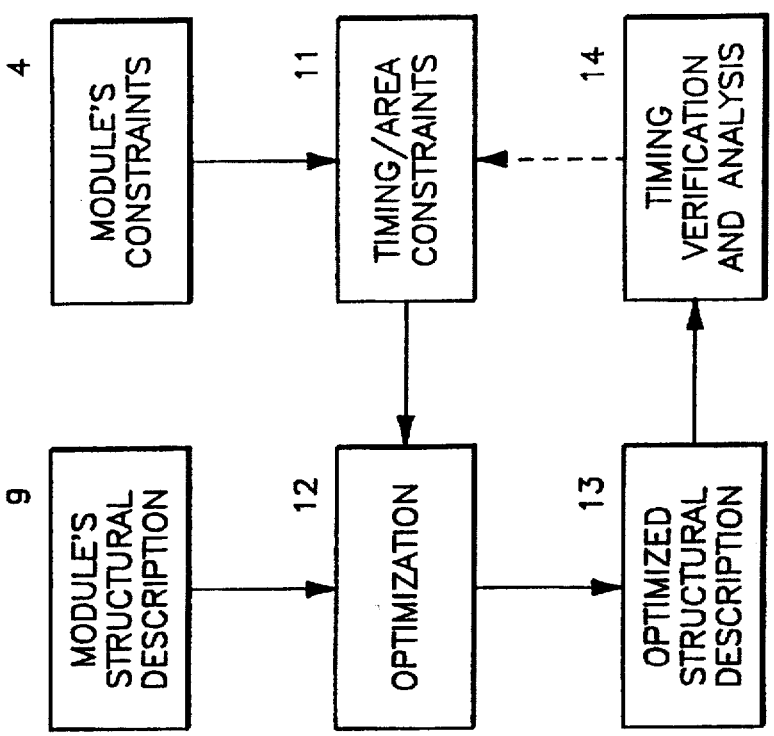
Figure 3:
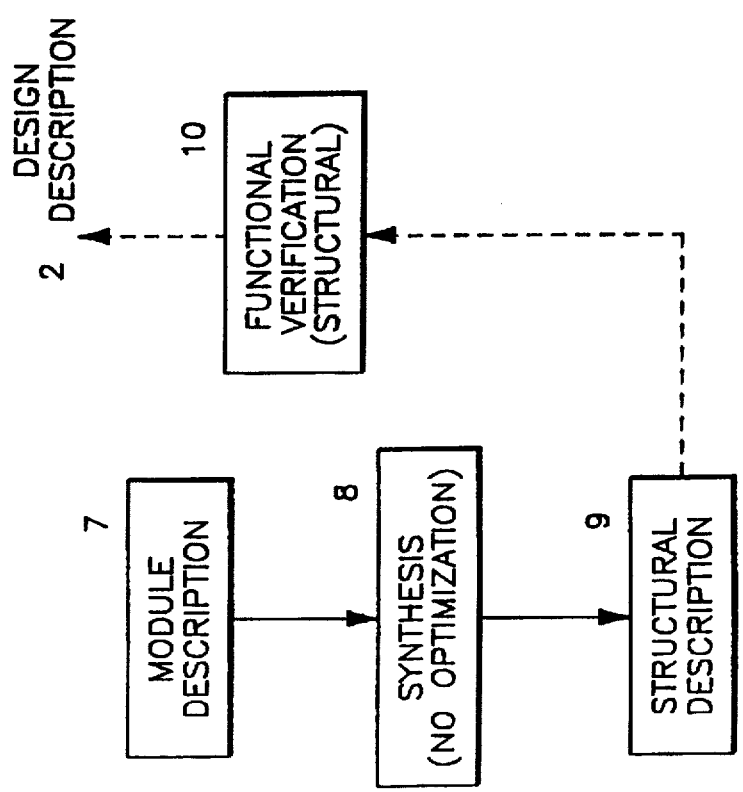
Figure 5:
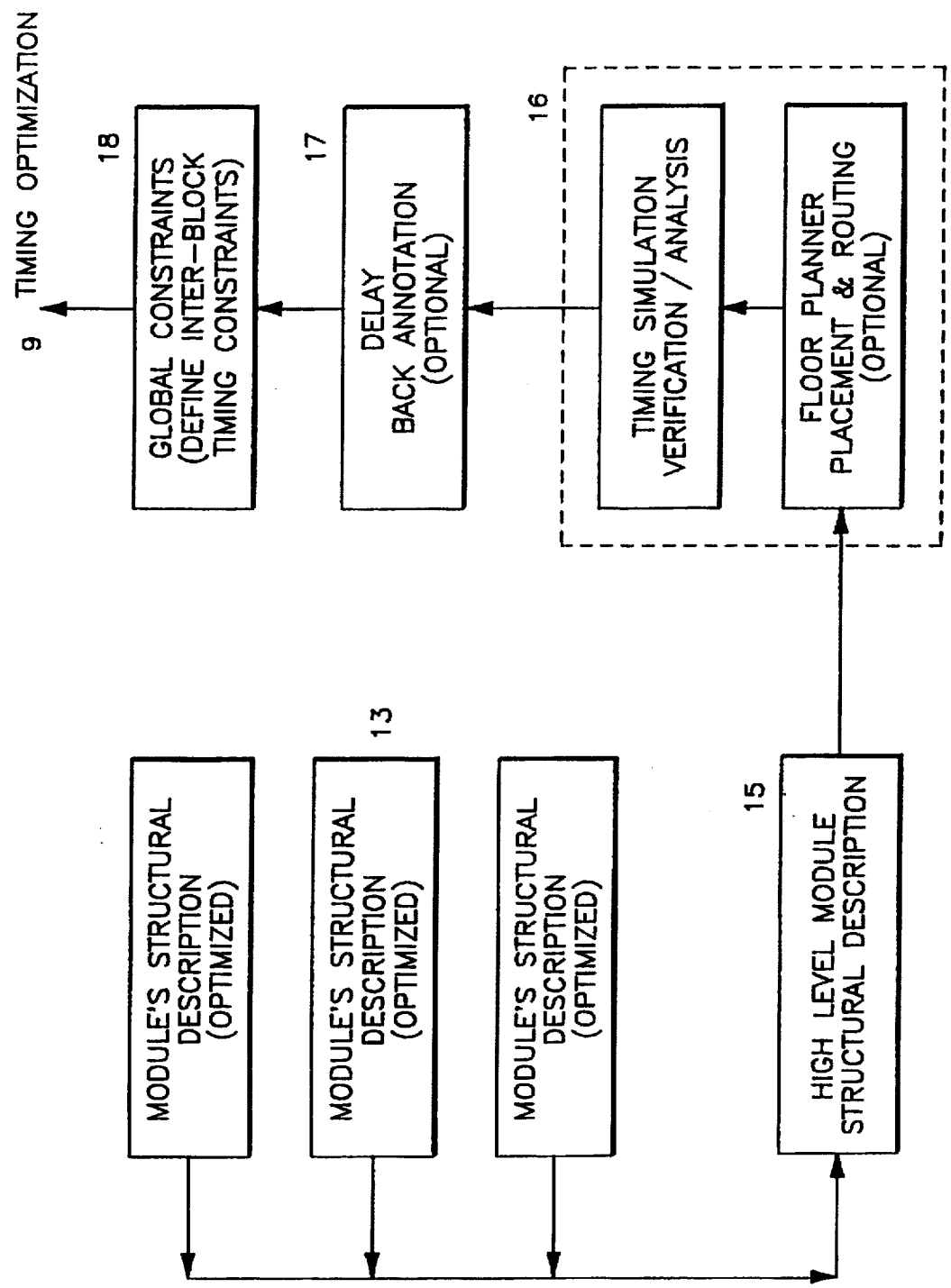

It will be noticed, in the above description of the steps shown in FIG. 2, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., restructuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimization in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Simulation, Verification and Analysis. At this stage, the optimized modules are composed (see step 5) together and implement the intended functionality of the high level module, or target device. Here, analysis includes logic level simulation, static timing analysis, electrical rule checking, etc. For more accurate analysis, it might be necessary to use a floor-planner or placement and routing programs to estimate wire delays. The wire delays are then back annotated into the design database prior to simulation. If the overall timing characteristics of the modules do not meet the specified requirement, a the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 6

Figure 6:
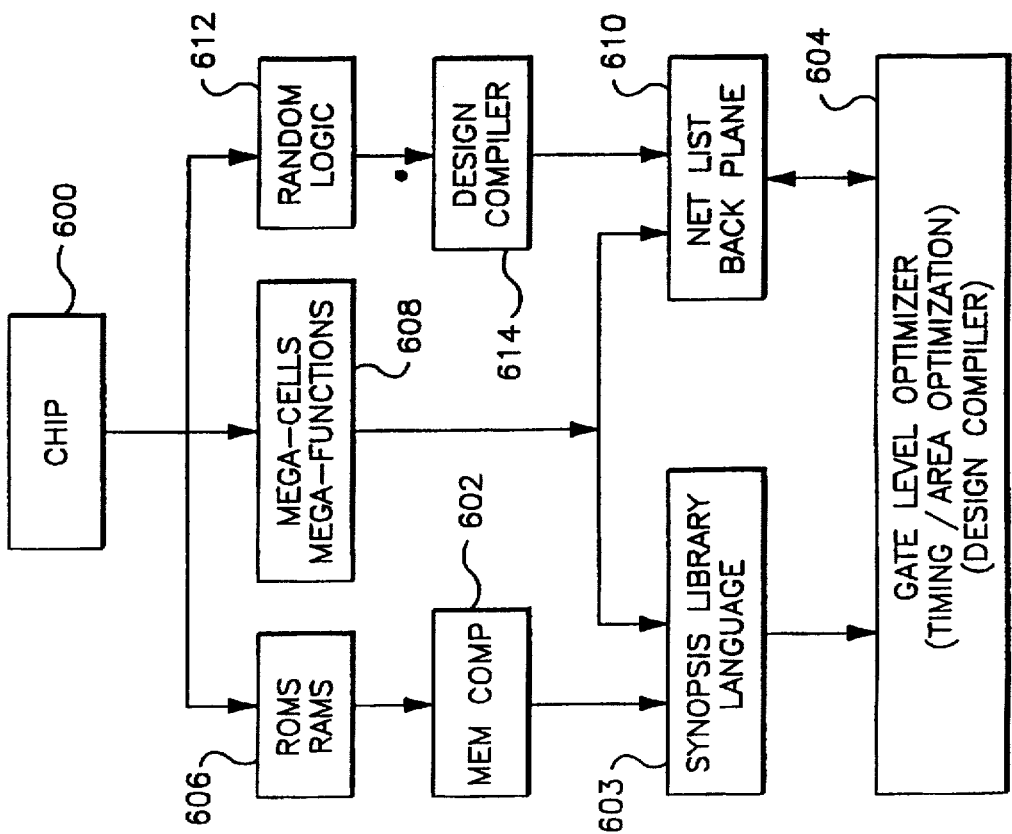

FIG. 6 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 600. The usage of these tools and their interaction with the Design Compiler are of particular interest.

A Memory Compiler (MemComp) 602 takes the high level specification for memory mega-cells and produces logic and layout files for the purpose of simulation, testing and layout. The objective is to provide the Design Compiler (Optimizer) 604 with an accurate timing description of and drive capability information for the memory block. Mem-Comp synthesizes high density or low power RAM or ROM blocks 606. As will become evident, the surrounding logic is optimized with respect to the memory block. The memory block created by MemComp 602 is provided in the same format as the internal macro-cells, i.e. a net list of primitive transistors, which cannot be read directly by the Design Compiler 604. Therefore, one of two possible intermediate steps is required: 1) (not shown) the data sheet generated by MemComp is used to manually extract the timing description of the memory block. This basically involves defining a set of "set_load", "set_drive" and "set_arrival" constraints and associating them with the relevant pins of the surrounding logic at the start of the optimization process; or 2) a Memory Modeler (see FIG. 8) is used to generate a model 603 in Synopsys Library Language (SLL; available from LSI Logic Corporation). The Memory Modeler reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 608 are treated as basic building blocks, similar to the macro-cells in the synthesis library. Both are generally developed beforehand for optimal performance, so no optimization is required on these blocks. They are presented to the Design Compiler 604 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 610 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 612, in other words the remaining modules that were not synthesized using the previously described tools and libraries, are synthesized by a general purpose logic synthesis tool 614 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 604 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Figure 8:
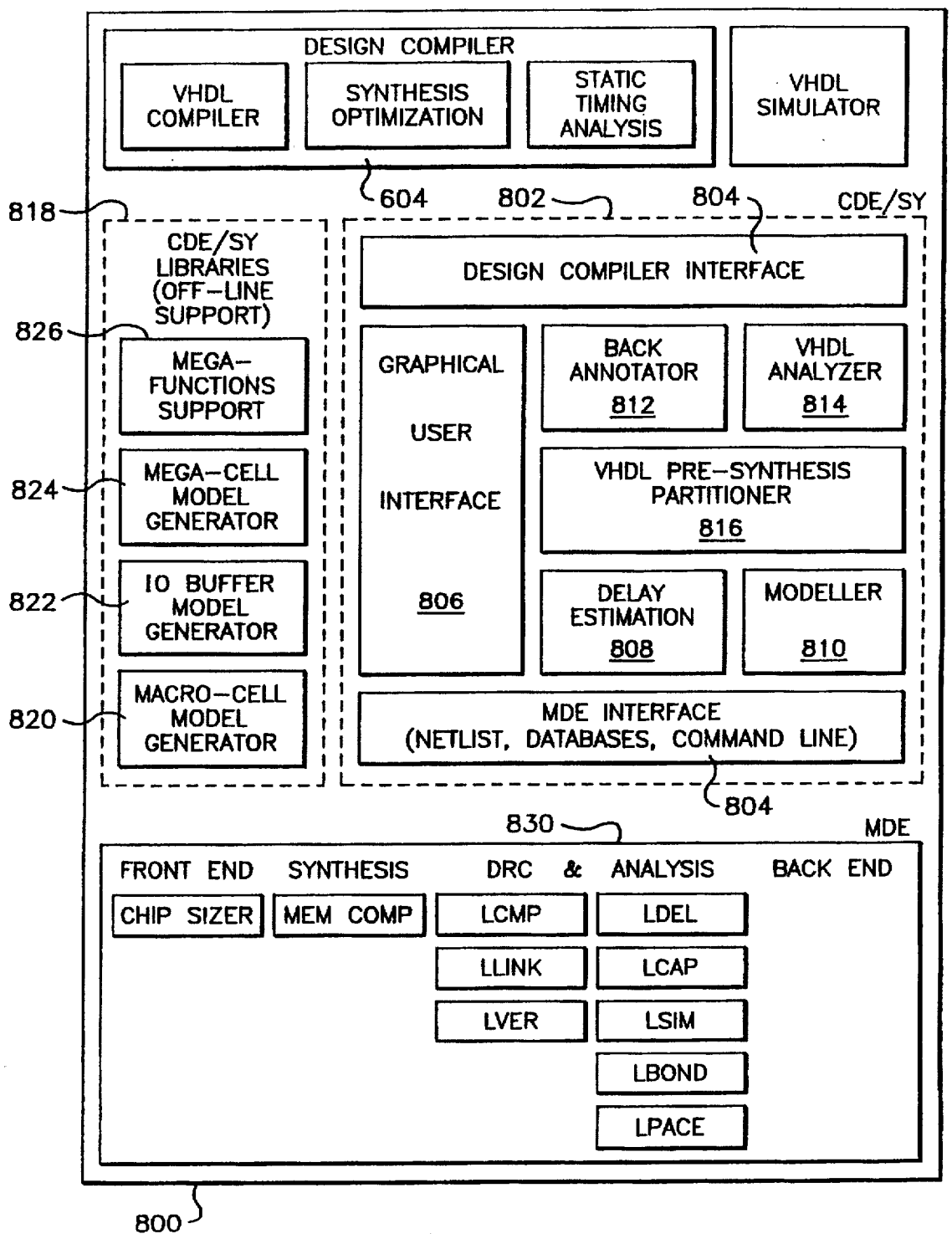
FIG. 8 is a block diagram of a suite of exemplary software tools for implementing the methodology disclosed in FIGS. 1–7.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 8) and those dictated by existing blocks. This is an iterative process. Constraints need to be refined until the desired timing and area requirements are achieved.

FIG. 7

Figure 7:
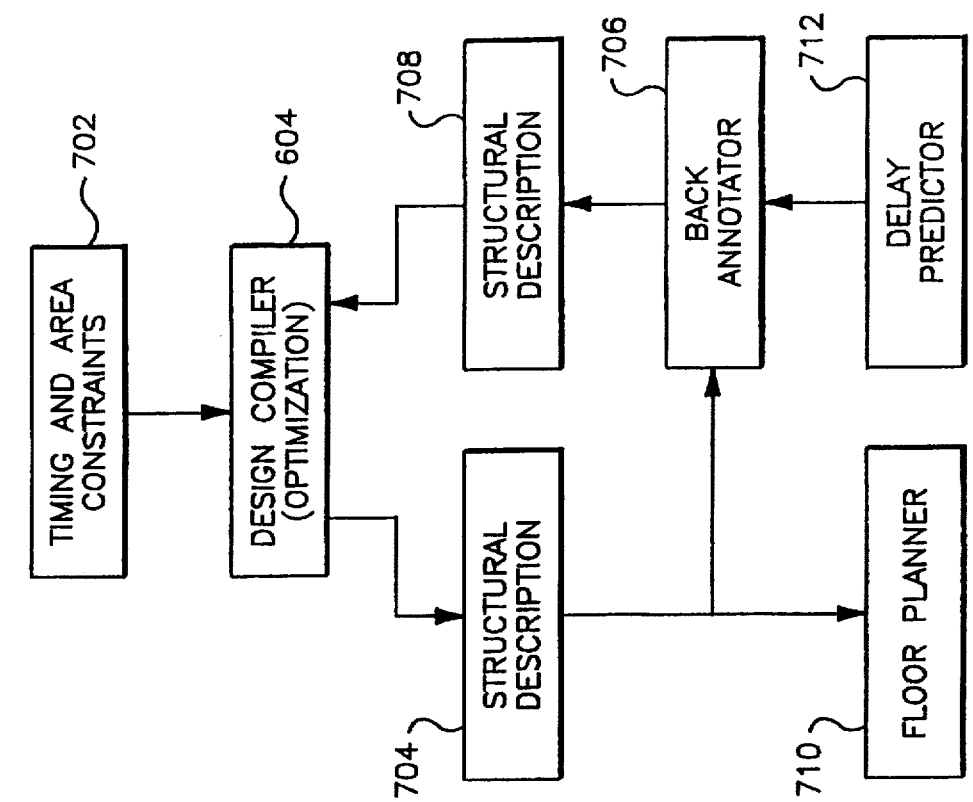

FIG. 7 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area trade-off evaluations based on more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-end synthesis form VHDL.

Generally, the design framework illustrated in FIG. 7 follows from the design methodology described hereinbefore. The methodology includes the following important steps:

- partitioning the design into memory blocks, mega-functions, mega-cells and random logic;
- using a layout tool, such as LSI's ChipSizer (see FIG. 8), to obtain the required die size, which is a function of the area, the number of pins and pads and other factors;
- choosing the mega-cells and mega-functions to be used, and characterizing the cells for the Design Compiler;
- generating memory blocks, and characterizing them for the Design Compiler;
- partitioning the random logic into smaller functional units;
- using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 702 imposed by the building block; and repeating these steps until all of the functional units are synthesized into a structural description 704. The resulting structural description 704 may be back annotated 706 as a structural description 708 (of timing/area constraints) to the Design Compiler. In the loop shown:

- for larger functional blocks, a floor planner 710 is used for placements and more accurate wire delay prediction 712 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and

- incorporating the timing delays and drive capabilities of I/O buffers into the timing constraints. (The I/O buffers should be selected as early in the design cycle as possible.)

FIG. 8

FIG. 8 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE) 800 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 802 of on-line tools, labeled CDE/SY, constitutes the dynamic part of the Co-Design Environment and includes the following:

A Design Compiler Interface 804 (shown in two parts) controls the data flow and interactions between the MDE and the Design Compiler 604. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 806 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 808 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire loading) to be used by the Design Compiler.

A Memory Modeler 810 reads the net list of a memory block created by MemComp (See 602, FIG. 6), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 812 comes into play after the floor planning stage, and provides more accurate wire delays into the optimization database. The DBA is used for two distinct purposes: 1) to back annotate wire delays for a block that is going to be re-optimized, using the latest (and most valid) delay values); and 2) to back annotate wire delays for a block that has been optimized and has met the design constraints, thereby providing the latest delay values for accurate modeling of the block so that surrounding blocks can better be optimized.

A VHDL Analyzer 814 provides source code (VHDL) debugging and assists in functional verification of the VHDL description. The VHDL Analyzer is discussed in greater detail in FIGS. 10 and 11, and in the annexed code listing.

A VHDL Pre-Synthesis Partitioner 816 partitions behavioral descriptions (VHDL code) into RTL descriptions of modules and sub-modules. During partitioning, appropriate architectural decisions are based on time/area analysis.

The off-line part of the CDE is a collection of libraries 818, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 820 reads the structural description of the macro-cells from the MDE libraries and generates the appropriate models in SLL. The behavior of sequential cells may be modeled by the Model Generator, subsequently to be manipulated by the Design Compiler.

An I/O Buffer Model Generator 822 provides timing and drive capability information on the I/O buffers, which are modeled as ordinary macro-cells in the CDE environment. Data derived therefrom is used for optimization of the logic inside the chip. The Optimizer (Design Compiler 604) is not expected to manipulate the I/O buffers. This Model Generator is capable of handling configurable buffers, which are modelled as "n" cells, where "n" is the number of all the possible configurations of that buffer.

A Mega-Cell Model Generator 824 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 826 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 604, and a VHDL Simulator (for behavioral and structural verification, discussed hereinbefore) is shown at 828.

Illustrative tools (ChipSizer, MemComp, LCMP, LLINK, LVER, LDEL, LCAP, LSIM, LBOND and LPACE), commercially available within LSI Logic's Modular Design Environment 830 are shown. Generally, these tools consist of a set of programs that compile, link, simulate and verify digital logic at the chip (structural) level. Any number of other, commercially available programs could be employed at this level to perform similar functions.

FIG. 9

Figure 9:
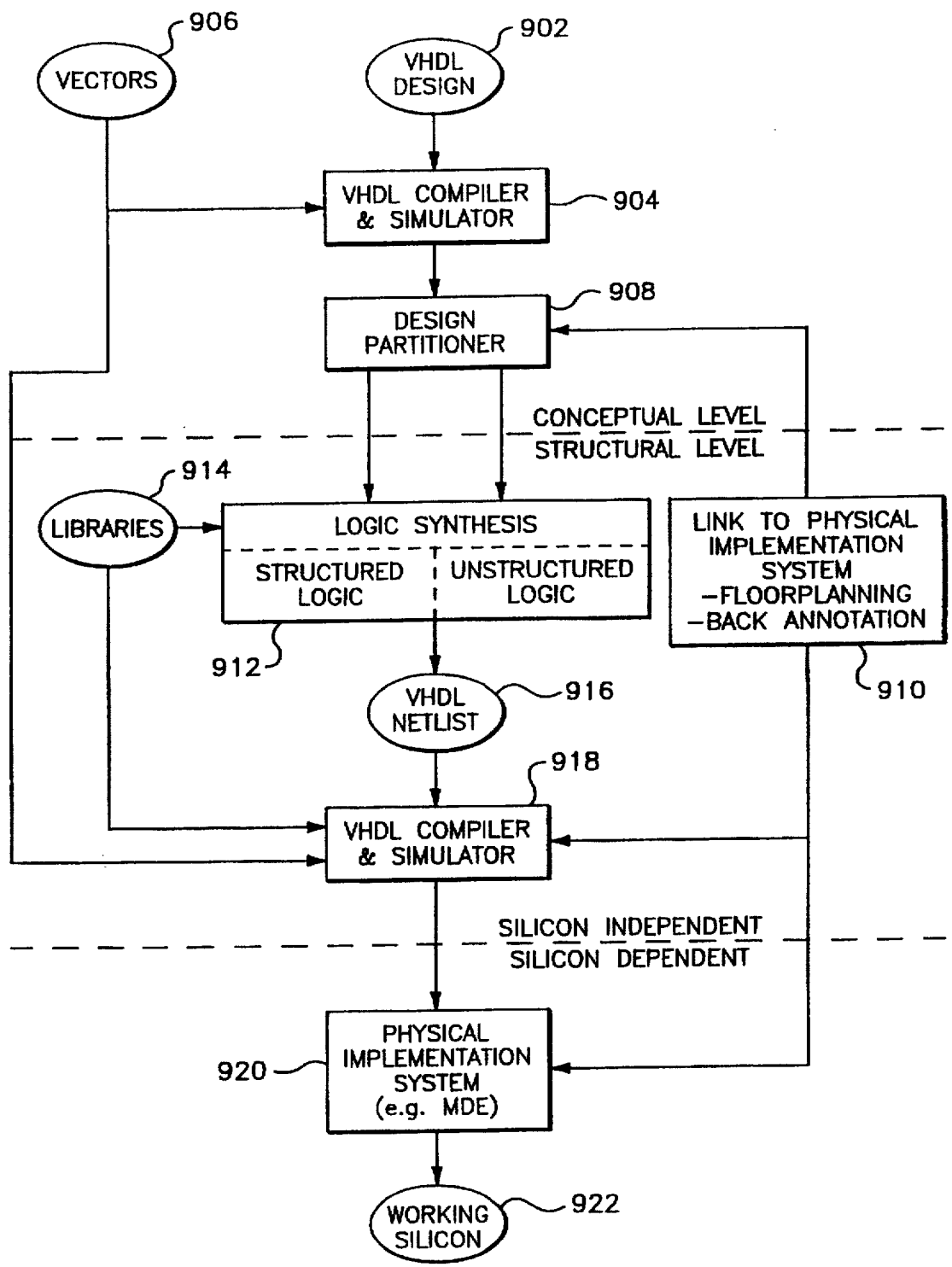
FIG. 9 is a block diagram of the methodology of the present invention.

FIG. 9 shows a more generalized arrangement of the methodology of the present invention, in such terms that one skilled in the art to which the invention most nearly pertains could readily implement the methodology.

At the conceptual level, a behavioral description 902 of the target device is formulated in a high-level language, such as VHDL. The behavioral description is compiled and simulated 904 using test vectors 906 to verify the design description. The behaviorally-verified design is partitioned 908 into suitable architectural blocks, as described above. Partitioning allows for the critical link 910 to the physical implementation of the target device, incorporating critical size (area) constraints (i.e. floor planning) and critical timing (speed) information (i.e back annotation).

At the structural level, the partitioned design is provided to logic synthesis tools 912 which formulate both structured and unstructured logic (functional blocks). Additional information regarding the functional blocks is derived from libraries 914. Importantly, the timing/area constraints introduced through the partitioner 908 are embedded at the logic synthesis stage. The output of the logic synthesizer 912 is a net list 916 for the target device, such as in VHDL, which is compiled and re-simulated 918 (904), using the test vectors 906 and pre-defined information about blocks contained in the libraries 914. If necessary, updated timing/area constraints are provided back through the partitioner 908 and the target device is re-synthesized 912 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 920, such as LSI Logic's MDE, to create a working device 922. At this stage, the tools required are technology (silicon) dependent.

FIGS. 10-11

Figure 10:
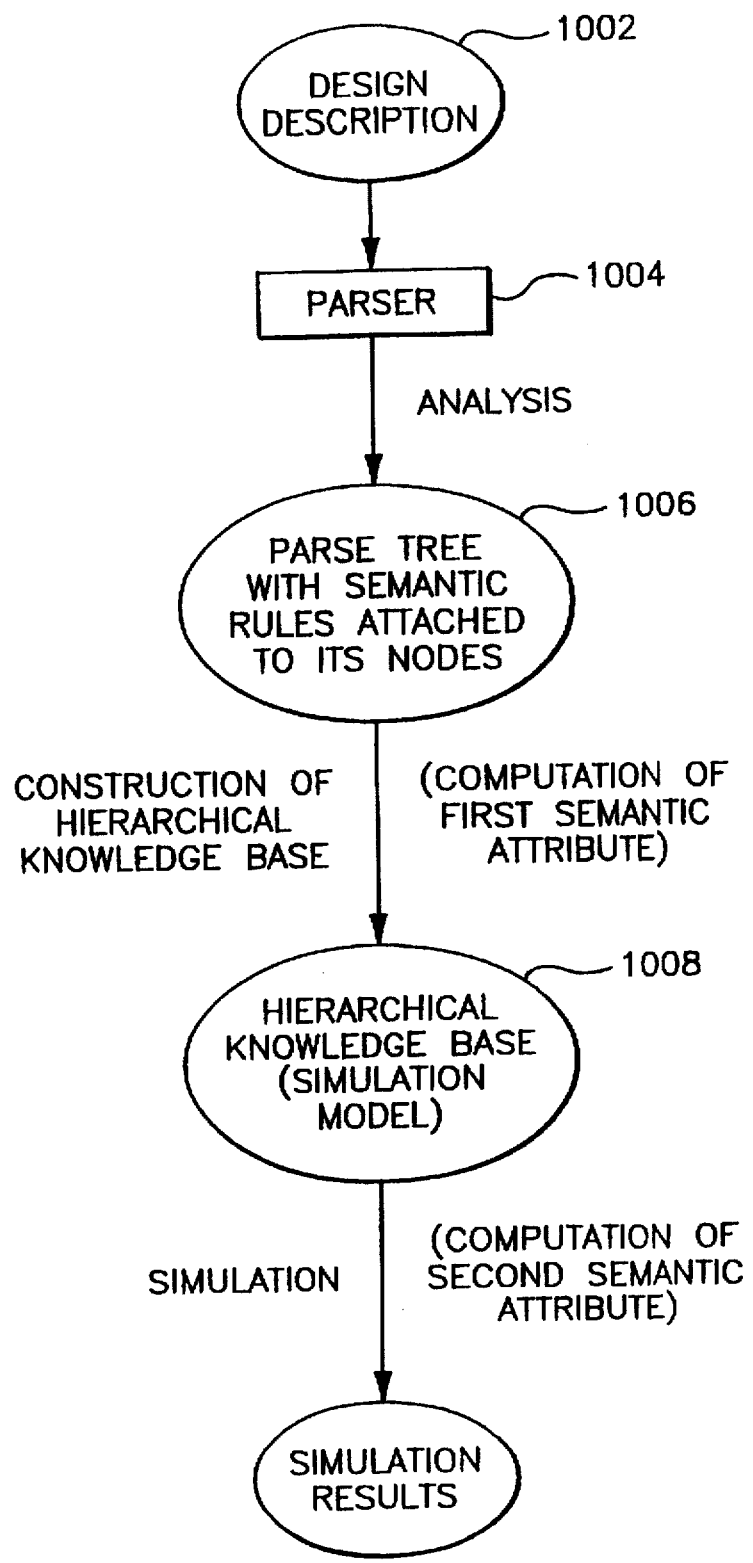
FIG. 10 is a block diagram of the Analyzer portion of the present invention.
Figure 11:
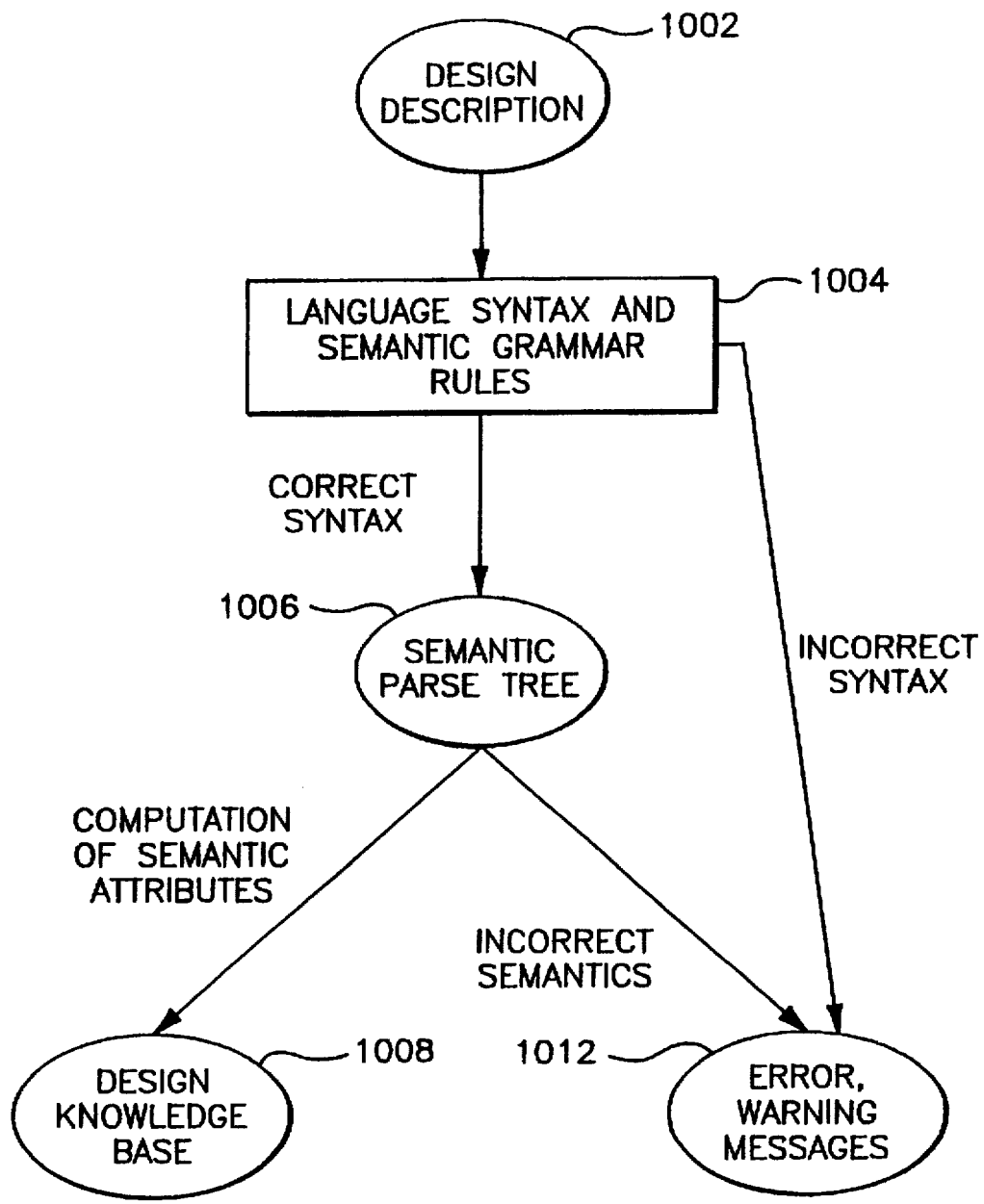
FIG. 11 is a block diagram showing the Analyzer.

FIGS. 10 and 11 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs. The design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

Analysis, wherein the input description is analyzed for syntactic and semantic correctness, and a parse tree is formed. Each node in the parse tree is associated with a semantic rule.

Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.

Simulation, wherein using these simple assertions and computation methods contained in the knowledge bases, the output signal values are calculated for a given set of input signal values. The input stimulus can be either symbolic expressions or numerical values.

FIG. 10 shows the steps in simulating a design description.

Beginning with a design description 1002 written in a formal, high-level language, the description is analyzed (parsed) 1004 using, for instance, definite clause translation grammars (DCTG) to form a parse tree 1006. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes, namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 11; 1012) would be generated. These violations include redefinition of objects within the same scope and incorrect argument types to a procedure. Only a correct description is passed on to the hierarchical knowledge base 1008. Thus the analysis of the description ensures that it conforms to the syntax and semantics of the HDL description, and leads to the construction of a valid hierarchical knowledge base. Further discussion of design rule violations can be found in the descriptions of FIGS. 23a and 23b, hereinbelow.

The hierarchy in a design description can be of two kinds. One is imposed by the structural design description in which a design entity (component, process, function, architecture, configuration) is composed of several other design entities. The second relates to scoping and visibility rules of the language. The knowledge base 1008 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. This Corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 1008 makes up a simulable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique names. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases, and a second semantic attribute ("execute") is computed. This set of semantic rules constitutes the simulation engine. It includes computation of values of arithmetic expressions, Boolean expressions, symbolic expressions, time expressions, execution of sequential and concurrent statements, and generation of transactions. The computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 1010.

FIG. 11 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

An executable listing of the Analyzer/Interpreter, as described with respect to FIGS. 10 and 11, is included in the parent case 07/507,201, and is incorporated by reference herein.

FIGS. 13–15

FIGS. 13 through 15 show representative screen displays of the methodology of the present-invention, as they would be presented to the user. In the main, the display of FIG. 13 is discussed.

In the lower left "window" of the display of FIG. 13 is shown a VHDL description of a counter ("while x<a loop . . ."), created by the user. The user then simulates the code, at the high-level, to ensure that the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1] . . . "). One of these design alternatives, selected by the user for viewing, is displayed in the upper right window (as interconnected circle and square primitives) In the lower right window is displayed the estimated area that would be required to implement the design, and is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 15 are shown size estimates for particular functional blocks labelled "8.1", "11.1", etc.) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

Summarizing the above, a methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step, such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Appended to parent case 07/507,201, and incorporated by reference herein, are code listings of the Partitioner program (441 pages), the Synthesis Controller program ("SYN CONTROLR") which is a background program that processes the functional calls from the VHDL description of blocks (see FIG. 6) to memory blocks, mega-cells, megafunctions and other arithmetic unit functions in MDE and replaces these blocks by a component that can be simulated and merged (443 pages), and the "LIVE" (LSI Intelligent VHDL Environment) program, which is the Analyzer referred to hereinbefore (178 pages). These are all in executable code converted into hex through a standard UNIX utility.

At any point in the logic synthesis process discussed hereinabove, the system can be represented as a number of interconnected functional blocks. At early stages of the process, some or all of the interconnected blocks may be described in terms of behavioral or functional characteristics, rather than detailed circuit elements. At later stages of the process, however, very detailed low-level circuit descriptions of these blocks (i.e., comprising logic gates, transistors, etc..) are available. Regardless of the degree of completion of the logic synthesis process, the system can always be represented as a schematic diagram comprising a number of interconnected blocks. The blocks can be simulated, either functionally, logically, or behaviorally to provide simulation results representing signals on the interconnections between the blocks (i.e., the "pins" of the blocks. Some of the blocks may have lower-lever hierarchical descriptions, or even complete circuit-level descriptions, in which case it is possible to traverse the hierarchy to "see" down to lower levels of the block. As the synthesis process continues, greater detail becomes available. It is highly desirable, at various points in the design process, to do a "sanity check" by simulating all or part of the system being designed.

The discussion hereinabove with respect to FIGS. 1–15 is directed mostly to synthesis of lower-level logic functions from high level functional and/or behavioral descriptions thereof. Attention is now directed to issues relating to interactive graphical simulation of the synthesized logic systems and larger systems into which the synthesized systems are subsumed.

Figure 16:
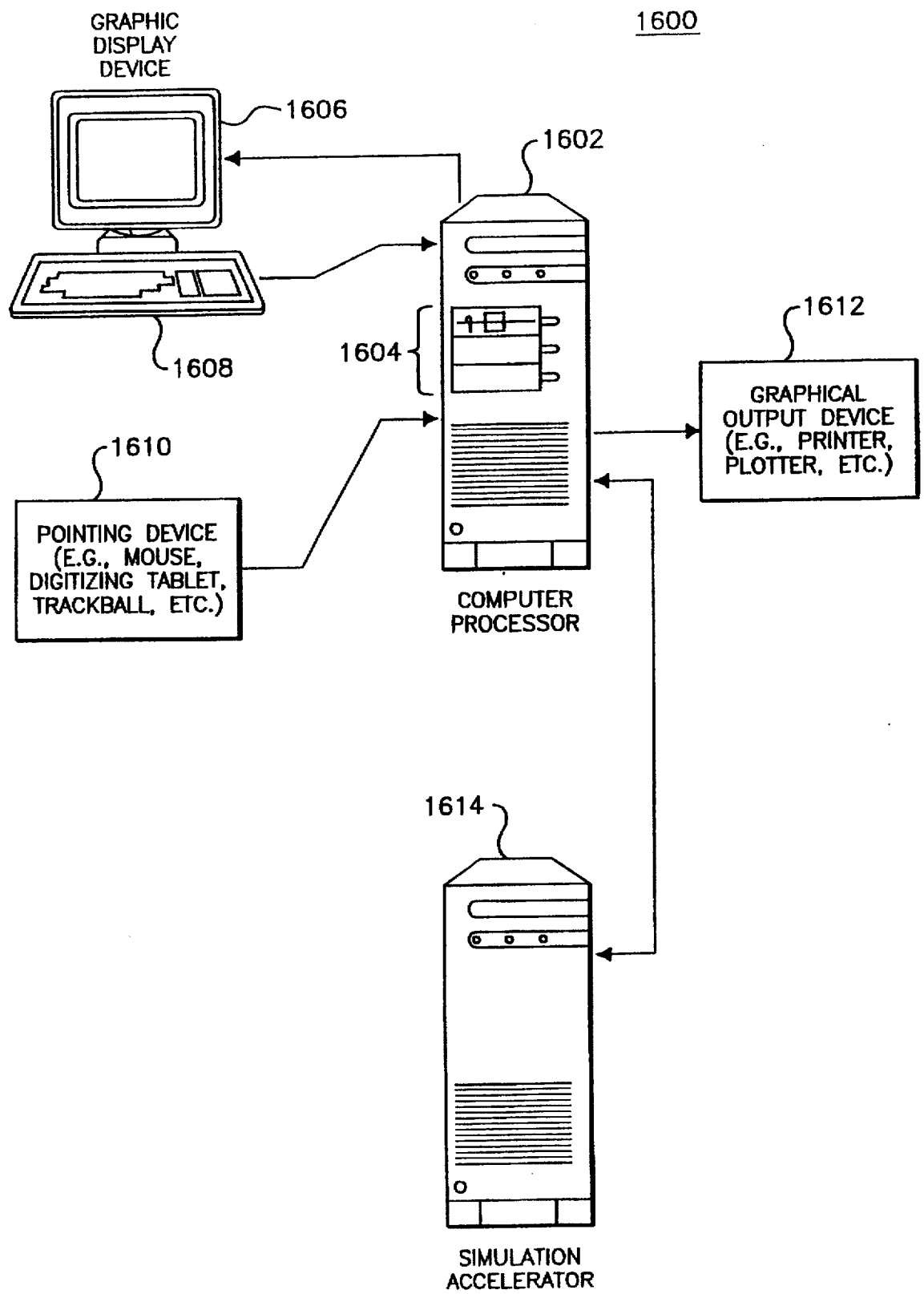
FIG. 16 is a block diagram of the ECAD system hardware of the present invention.

FIG. 16 shows an ECAD system 1600 comprising: a computer processor 1602 with mass storage devices 1604, a graphical display device 1606, a keyboard 1608, a pointing device 1610, a graphical output device 1612, and a simulation accelerator, 1614. The pointing device 1610 may be a mouse, digitizing tablet, trackball, joystick, or any other similar cursor positioning device. The graphical output device 112 is intended for hard copy output of schematic diagrams and for the printing of layout artwork.

Figure 17:
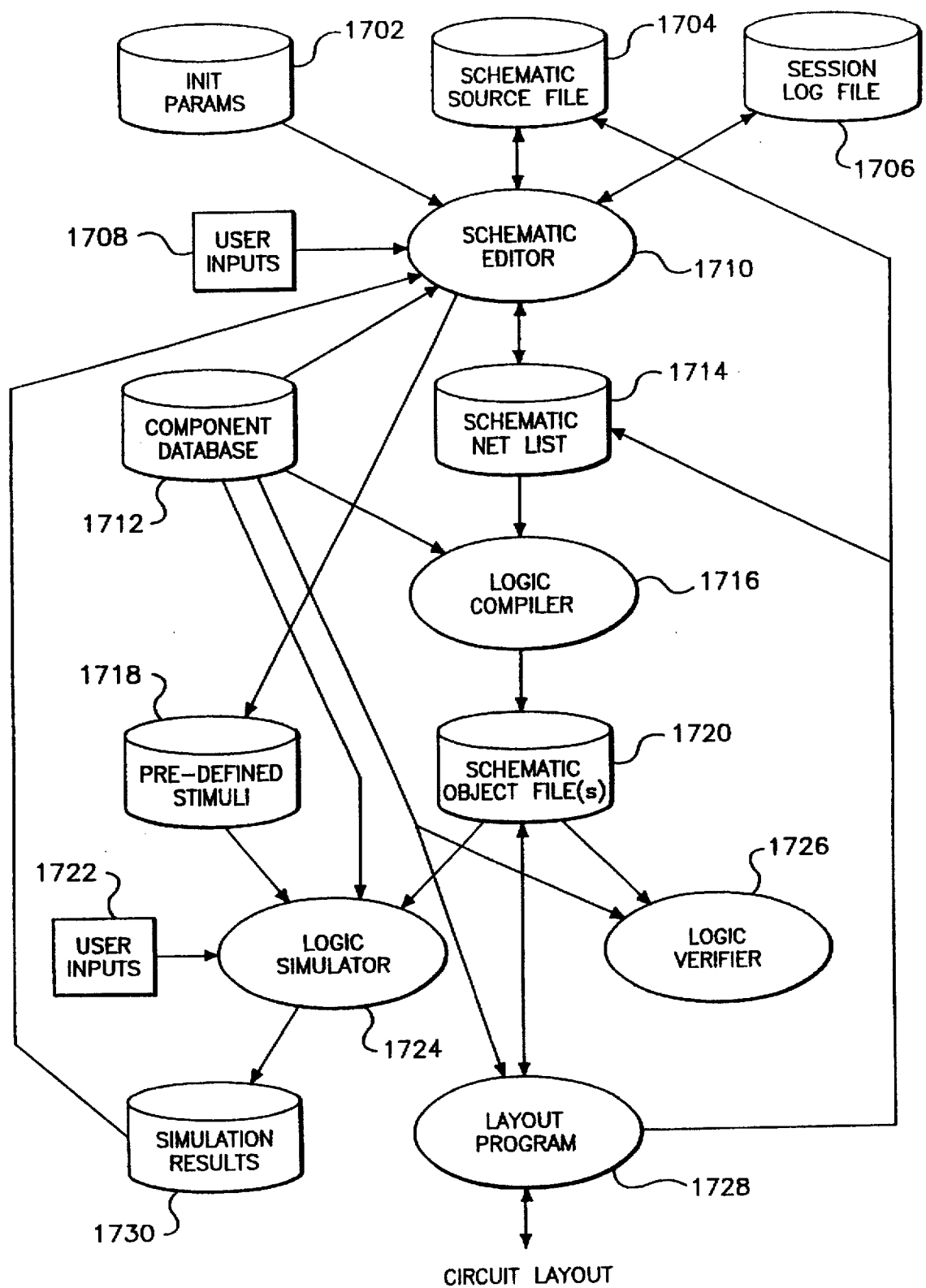
FIG. 17 is a software structure chart illustrating the major software components of the system of FIG. 16 and the data flow between them.

With respect to FIG. 17, there is resident within the ECAD system (1600 of FIG. 16) a software system 1700 comprising a Number of data structures and programs. Upon initial startup, a schematic editor 1710 reads in a series of initialization parameters 1702 which set default mode selections and various configuration parameters. Said schematic editor may be the LSED editor by LSI Logic Corp., with modifications which will be described later. The schematic editor 1710 accepts input from a schematic source file 1704, and displays its graphical representation on the ECAD systems's graphical display screen (1706 with respect to FIG. 16). If there is no schematic source file, it is assumed that a new schematic is being entered, and a blank entry sheet is presented on the display screen and a new, blank schematic source file 1704 is created. The schematic editor operates according to commands coming from user inputs 1708. Every command entered is recorded in a session log file 1706 such that the editor may undo any number of commands entered by the user. Some commands from the user inputs 1708 will be requests to place and interconnect schematic symbols on the display screen. To accomplish this, the schematic editor looks up the requested component (s) in a component database 1712 and retrieves graphical symbol representations of the requested component(s) contained therein. As the user enters the schematic diagram on the screen, the schematic editor creates a net list and invokes the function of a logic compiler 1716.

One of ordinary skill in the art to which this invention most nearly pertains will understand that modifications to the current LSED (or similar) editor may readily (in light of the clear and concise descriptions contained herein) be implemented in additional software code suitable to the particular software system being modified, and should include:

1. Extensions to the net-list output structures to include Status indicators on each component and net indicating "activated" or "deactivated" and "eligible for simulation" or "ineligible for simulation".
2. Extensions to the user command set to enable the user to simulation data values by pointing to nodes or nets and specifying data values and conditions. These data values and conditions will be stored in a data structure (1718 with respect to FIG. 17) as pre-defined stimuli. Said data values and conditions may be the same data values and conditions already accepted by the LSIM simulator, produced by LSI Logic Corp.
3. Extensions to the user command set to enable the user to request simulator functions. The set of simulator functions will be those already accepted by LSI Logic Corporations LSIM simulator.
4. Extensions to the LSED editor function to permit it to signal (in software) the logic compiler and logic simulator to begin operation.
5. Extensions to the LSED editor function to permit it to detect when requested simulator and/or compiler operations have been completed and to detect status information returned by those programs (such as: specified simulation conditions met/not met, etc.).
6. Extensions to the user command set to enable the user to identify small display areas adjacent to schematic notes and/or nets for the display of simulation data relating to such nodes or nets. The internal representations of such display areas will contain indications of the type of display requested: textual state data or graphical timing data.
7. Extensions to the user command set such that a display area or display areas may be set aside for the display of state table information. Such commands will require that the user identify the signals to be included in the state table, provide stepping conditions for the simulator, optionally provide initial conditions for the first simulation run (through the mechanism of LSED editor modification number 2 above), and the number of steps to perform or Some special ending conditions (through the mechanism of LSED editor modification number 3 above).

8. Extensions to the LSED editor function to permit iterative calls to the simulator according to user specifications (entered by the mechanism of LSED editor modification number 7 above), to wait each time the simulator is invoked until the requested operation is completed, and to read the simulator state information contained in the simulation results file (1730 with respect to FIG. 17) and retrieve the state data corresponding to the user specified values to be entered into a state table or state tables and format it for display in columns under the corresponding signal name heading in the state table, each time advancing one line. After "n" iterations, there will be "n" lines of state information displayed in the state table.

9. Extensions to the LSED editor function to permit it to retrieve state information from the simulation results file (1718 with respect to FIG. 17), to identify it by node or net name, and to format it for display as a textual logic state in its corresponding pre-allocated display area marked for textual state display (set up by the user through the mechanism of LSED editor modification number 6 above).

10. Extensions to the LSED editor function to permit it to retrieve state history information for the simulation results file (1718 with respect to FIG. 17), to identify it by node or net name, and to format it for display as a graphical timing diagram in its corresponding pre-allocated display area marked for graphical timing display (set up by the user through the mechanism of LSED editor modification number 6 above).

11. Extensions to the LSED editor to permit it to store the interactive state data for viewing at another time, create macros to move through the interactive simulation in defined steps or to cycle a clock, pop up existing or user-defined data sheets on any library element being used.

Again, with respect to FIG. 17, the logic compiler 1716 may be the LCMP compiler produced by LSI Logic Corp., with modifications described below. Using the information in the schematic net-list 1714 and the component data in the component database 1712, the logic compiler creates a schematic object file or files, the structure(s) of which is(are) optimized for simulation, verification and layout (respectively). Said modifications to the LCMP compiler are made such that the compiler will accept its command stream from the schematic editor 1710 rather than directly from user inputs. The LCMP compiler is also modified such that it will provide notification to the schematic editor that it has completed its operation. The LCMP compiler is further modified so that it will read parameters in the net-list identifying components and nets which have been de-activated. In response to a "deactivated" component or net, the compiler will simply skip over that component or net, effectively ignoring it and removing it (temporarily) from the design until it is again marked as "activated". Further modifications may be made to the compiler so that it will operate only on data in the schematic net list which has changed since the last compilation (incremental compilation), thus providing significantly reduced compile times, which, while desirable, is not strictly necessary for function.

Again, with respect to FIG. 17, a logic simulator 1724 operates on the schematic object file 1720 and component simulation performance contained in the component database 1712 according to a set of initial conditions and/or signal conditions specified as pre-defined stimuli 1718. For standalone operations, simulator 1724 may also operate off of user inputs 1722. The logic simulator may be the LSIM logic simulator produced by LSI Logic Corp., with modifications as described below.

Modifications to the current LSIM (or similar) logic simulator will also be understood by those of ordinary skill in the art to which the present invention most nearly pertains, and should include:

1. Changes to the LSIM simulator's user interface such that it will accept its commands and parameters from the editor program (1710 with respect to FIG. 2) rather than from direct user input.
2. Changes to the LSIM simulator's function such that it will return status about stopping conditions to the schematic editor upon completion of its simulation.
3. Changes to the simulation output such that results will be provided in a data structure (1730 with respect to FIG. 2) rather than to a graphical device.

Again, with respect to FIG. 17, a logic verifier, 1726, performs design-rule checking of the schematic diagram captured by schematic editor 1710 by checking the components and their interconnections contained in the schematic object file 1720 against component interconnection and loading rules stored in component database 1712.

Finally, a layout program, 1728 with respect to FIG. 17, places components and routes their interconnections on a semiconductor chip. After completion of the layout, the schematic source file(s) 1704, schematic net-list 1714, and schematic object file(s) 1720 are updated with information about placement location, placement orientation, and placement induced electrical characteristics.

Figure 18:
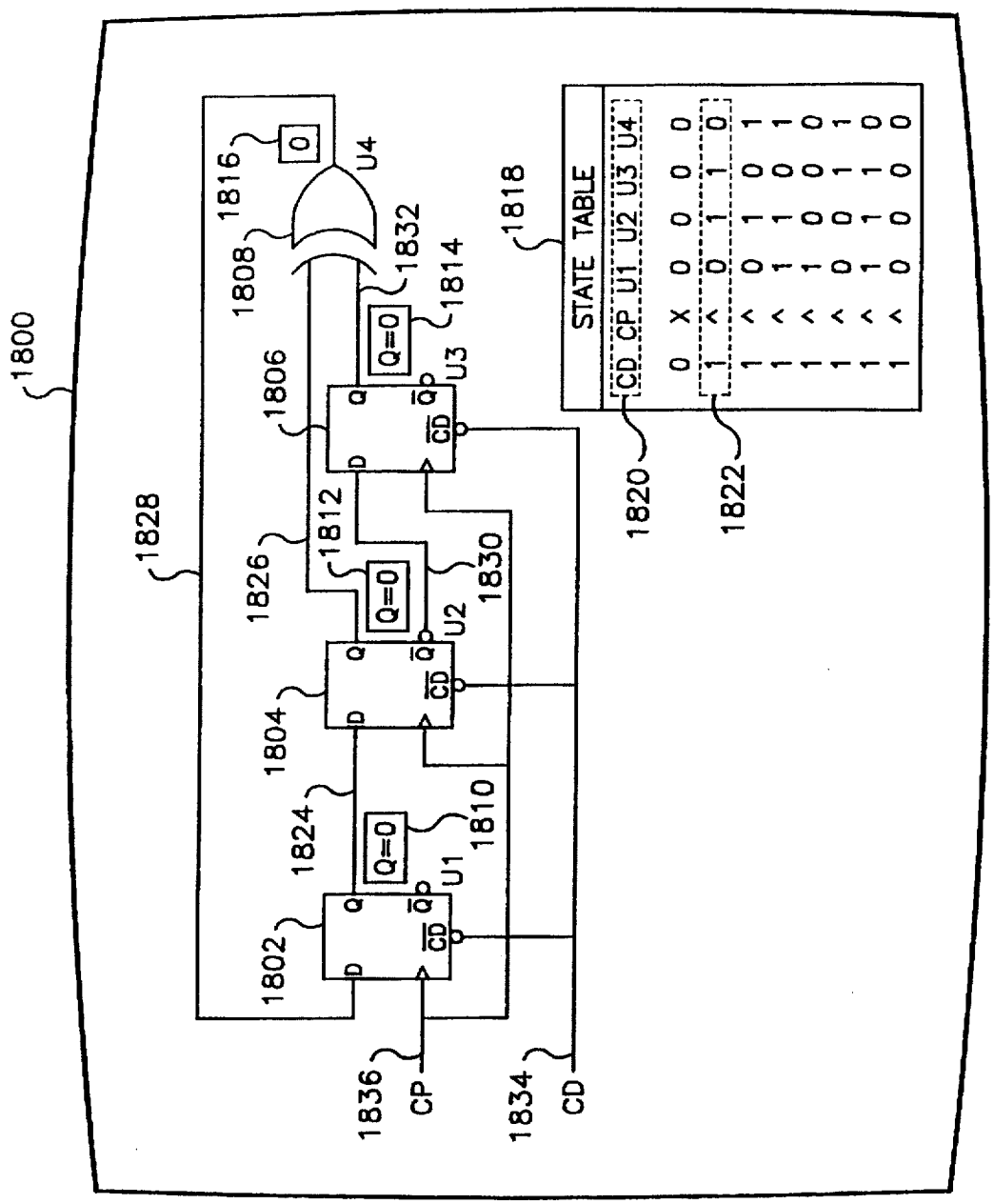
FIG. 18 shows a typical display screen image with text-based state data from simulation on the display device of FIG. 16.

FIG. 18 shows a representative editor display 1800, namely a display of the screen of graphical display device 1606 of FIG. 16, with graphical schematic components 1802, 1804, 1806, and 1808 and their interconnections 1824, 1826, 1828, 1830, 1832, 1834, and 1836. In this particular display, the user has requested that textual state information be displayed. State display 1810 corresponds to and is adjacent to net 1824. State display 1812 corresponds to and is adjacent to net 1826. State display 1814 corresponds to and is adjacent to net 1832. State display 1816 corresponds to and is adjacent to net 1828.

FIG. 18 further shows the result of a state table having been built by simulation through the schematic editor. State table 1818 contains monitored node/net names 1820 and rows of simulation data (1822 is a representative sample) arranged in columnar format under the corresponding node/ net names. State table 1818 is built by iterative invocations of the simulator by the schematic editor according to user specified monitoring and simulation conditions.

Figure 19:
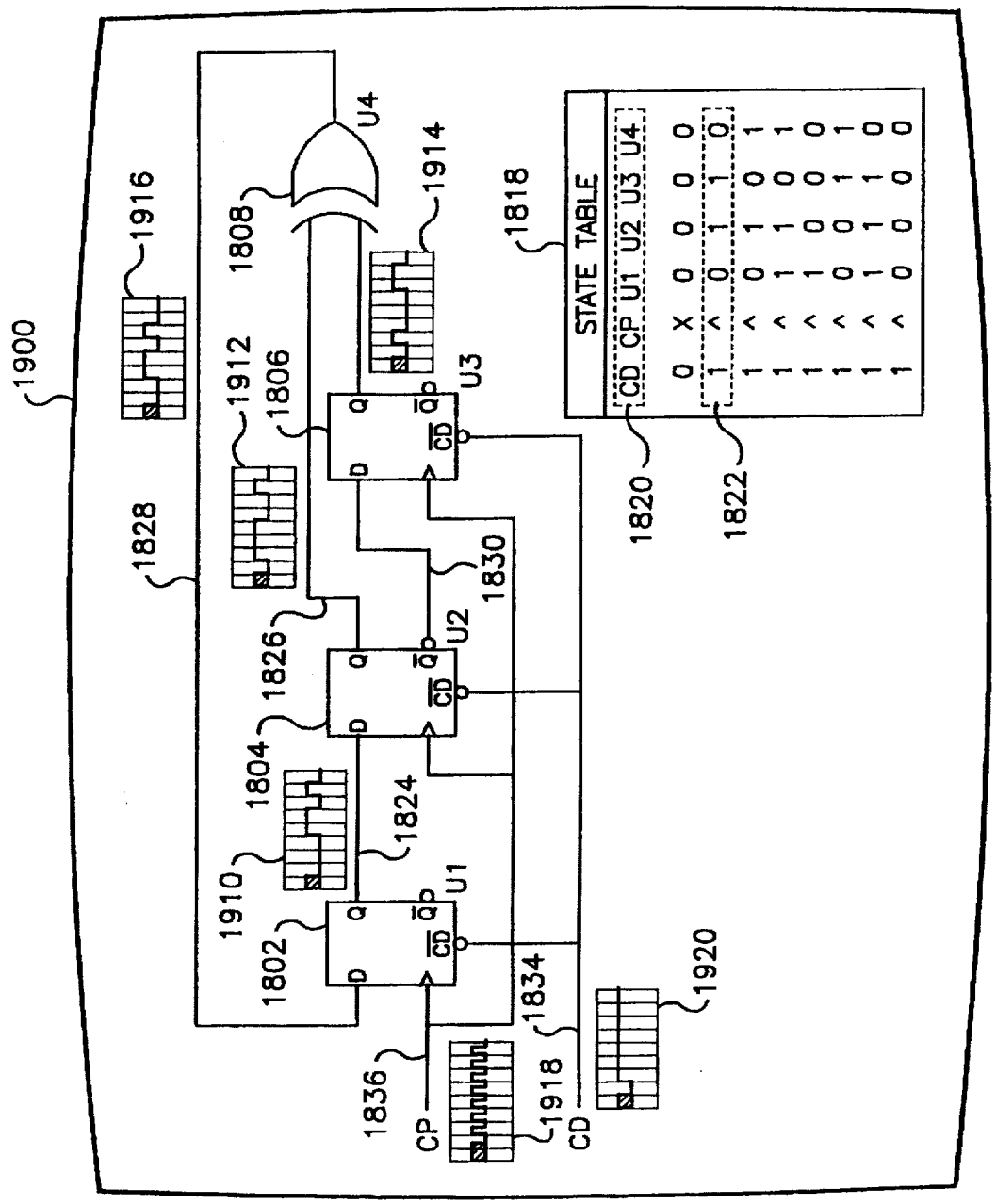
FIG. 19 shows a typical display screen image with graphic-based timing data from simulation on the display device of FIG. 16.

FIG. 19 shows a representative display screen image 1900, namely a display of the screen of graphical display device 1606 of FIG. 16, of the same circuit represented in FIG. 18 and under the same simulation conditions. Display screen image 1900, however represents the visual results if graphical timing diagram displays are requested by the user rather than textual state display. Timing diagrams 1910, 1912, 1914, 1916, 1918, and 1920 correspond to and are adjacent to nets 1824, 1826, 1832, 1828, 1836, and 1834, respectively. Each horizontal division in each timing diagram contains a graphical depiction of the state events which occurred during one stepped simulation cycle. All other features of FIG. 19 are identical to the same features in FIG. 18.

The present invention is of benefit to any computer aided design system where the simultaneous display of a schematic diagram of a circuit, or any similar representation thereof, and its simulation data is desired.

It will readily be appreciated by one of ordinary skill in the art that "schematic diagrams" can be representative of a great variety of electronic systems. For example, at the lowest level, a schematic diagram can represent a transistor-level circuit diagram of an integrated circuit. Another schematic diagram can represent a system of interconnected core functions in an integrated circuit. Yet another schematic diagram can represent a plurality of electronic components connected together as a system, such as a multi-chip module (i.e., a "flip-chip" system built from directly-connected integrated circuit dies) or a board-level system comprising a plurality of integrated circuits on a printed circuit board. All of these examples of schematic diagrams are representative of the wide variation of scale and hierarchy of electronic systems which can be represented by a schematic diagram.

It will readily be understood by one of ordinary skill in the art that an "electronic system" represented by a schematic diagram (and corresponding simulation models) on an ECAD system can be a transistor representation of a logic gate, a series of interconnected logic gates forming a portion of an integrated circuit design, a "core-cell" (e.g., a pre-designed high level function such as a microprocessor, memory, or peripheral controller to be incorporated into an integrated circuit design), all of the circuitry on an integrated circuit chip, a multi-chip module, a circuit board design using packaged electronic components, or a system including multiple circuit boards.

Most modern ECAD systems make use of "hierarchical designs" whereby high-level symbols can be used to represent detailed circuits contained on other (lower-level) schematics (schematic diagrams). Most of these ECAD systems provide for "looking down" into these symbols to display schematic diagrams for circuitry contained within these high-level symbols. For example, a high-level symbol may be used to represent a semi-custom integrated circuit in a schematic diagram. Lower-level schematic diagrams might include symbolic representations of one or more core-cells (e.g., microprocessor and/or memory core-cells) and other logic. Each of the core-cell symbols might, in turn, have associated lower-level schematic diagrams of circuitry making up the core cell. By traversing the schematic "hierarchy" during a simulation run, it is not only possible to view signals at the boundaries of a logic block (e.g., core cell), but to peer into the underlying logic behind the symbol and to view signals which are internal to the logic block.

In designing modern board-level systems or other complicated electronic systems (such as multi-chip modules) it is common to use such hierarchical design representations to minimize the level of complexity of any one schematic diagram. Such electronic system designs may include commercial off-the shelf logic components, custom and semi-custom integrated circuits (e.g., ASICs), etc. Simulation of such systems is accomplished by using simulation models of all of the components included in the design. For custom and semi-custom integrated circuit components, the simulation models are generally derived from the design database used to create the custom and semi-custom components. (In general, ASIC designs and other custom designs are accomplished on ECAD systems. A by-product of the design process is a simulation model for each component, either manually or automatically generated.)

Simulation models for the components of an electronic system may be behavioral models or full logic models. Often, a simulation models for a high-level commercial component (such as a microprocessor or a memory) describes the external behavior of the component, but does not provide sufficient internal description of the component to permit hierarchical "dissection" of the component as described above. In such cases, the lowest level of "visibility" for the component is the lowest level of hierarchy modeled in the simulation model. If, however, a full logic representation of a component is modeled, then lower hierarchical levels of the component can be simulated and viewed.

On occasion, it is necessary to simulate a system which includes electronic components for which no simulation model is available. It is well known in the art to provide "hardware simulators" which permit the users thereof to "plug in" physical electronic devices into a simulated system. Such hardware simulators convert software-generated representations of signals into electrical signals which are provided to a physical electronic device (e.g., an off-the-shelf microprocessor). The electronic device interacts with the "simulated" signals. The electrical responses of the electronic device are in turn converted into software representations of electronic signals and provided to the simulated components. In similar fashion, a single simulated software component can be "plugged into" a physical electronic system. For example, a new microprocessor system can be tested with a simulation of a new microprocessor chip before the microprocessor chip itself is available. Mixed hardware and software simulations of this type are capable of accommodating nearly any arbitrary combination of simulated and physical components.

Such mixed hardware and software simulations can include mixed-level software simulations. That is, the software portion of the simulation can include behavioral-level simulations, functional-level simulations, circuit-level simulations, logic-level simulations, etc. The technique is not dependent upon any particular "level" or "scale" of simulation, or upon any particular "level" or "scale" of electronic system. It should be noted, however, that the viewability of simulation results for a "hardware simulation" is generally restricted the signals at the points of connection of the physical device or system to the "hardware simulator".

Having now discussed various types of electronic systems and simulations thereof, attention is directed to some examples of the various types of electronic systems.

Figure 20A:
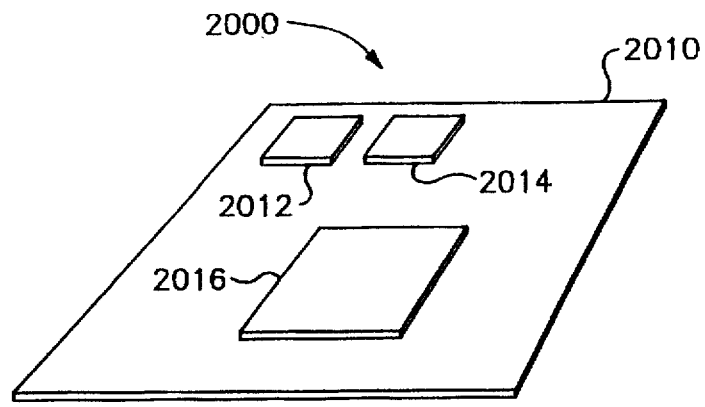
FIG. 20a is a view of a representative multi-chip module.
Figure 20B:
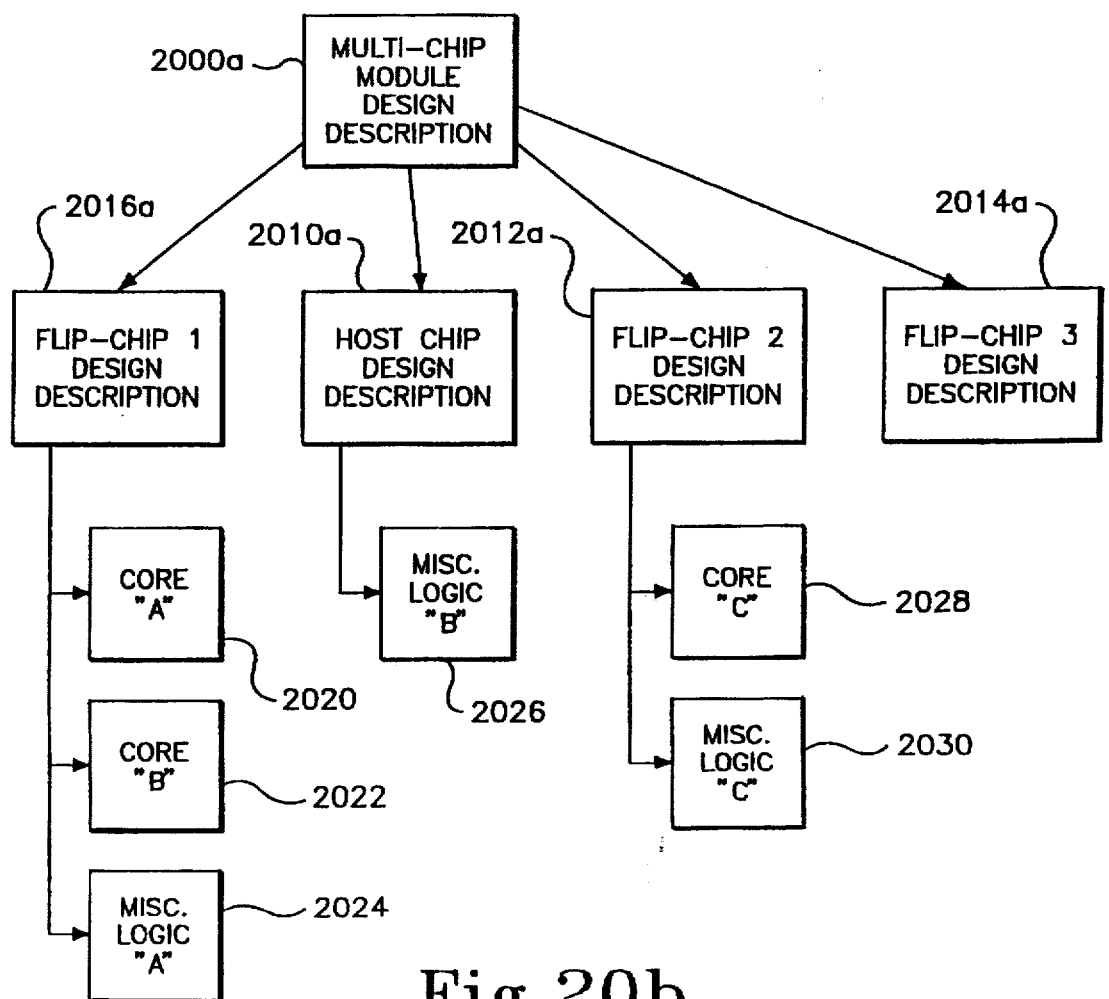

An example of a multi-chip module system is shown in FIGS. 20a and 20b. FIG. 20a is a view of a representative multi-chip module 2000. The module 200 is made up of a "host" chip 2010, onto which "flip-chips" 2012, 2014, and 2016 are mounted. (Flip-chip mountings generally involve face-to-face interconnections between integrated circuit dies by means of conductive solder bumps joined in a reflow process.)

FIG. 20b shows the design hierarchy for the multi-chip module for FIG. 20a. A top-level design description 2000a represents the overall design of the multi-chip module 2000, and references design descriptions 2010a, 2012a, 2014a, and 2016a of the host-chip 2010 and the three "flip-chips" 2012, 2014, and 2016, respectively. A first of the flip-chip design descriptions 2016a references two core cells 2020 (core "A") and 2022 (core "B"), and additional random logic 2024 (misc. logic "A"). The design description 2010a for the host chip 2010 includes random logic 2026 (misc. logic "B"). A second of the flip-chip design descriptions 2012a, refers to one core cell 2028 (core "C") and additional random logic 2030 (misc. logic "C"). The remaining flip-chip design description 2014a is strictly behavioral and does not refer to any lower level functions.

Figure 21A:
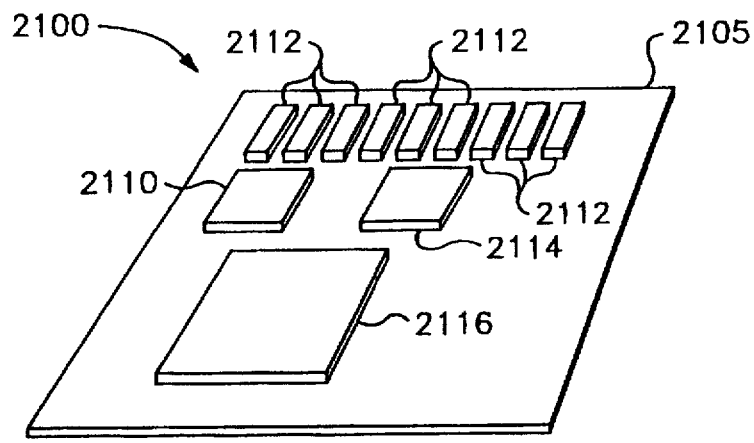
FIG. 21a is a view of a representative board-level system.
Figure 21B:
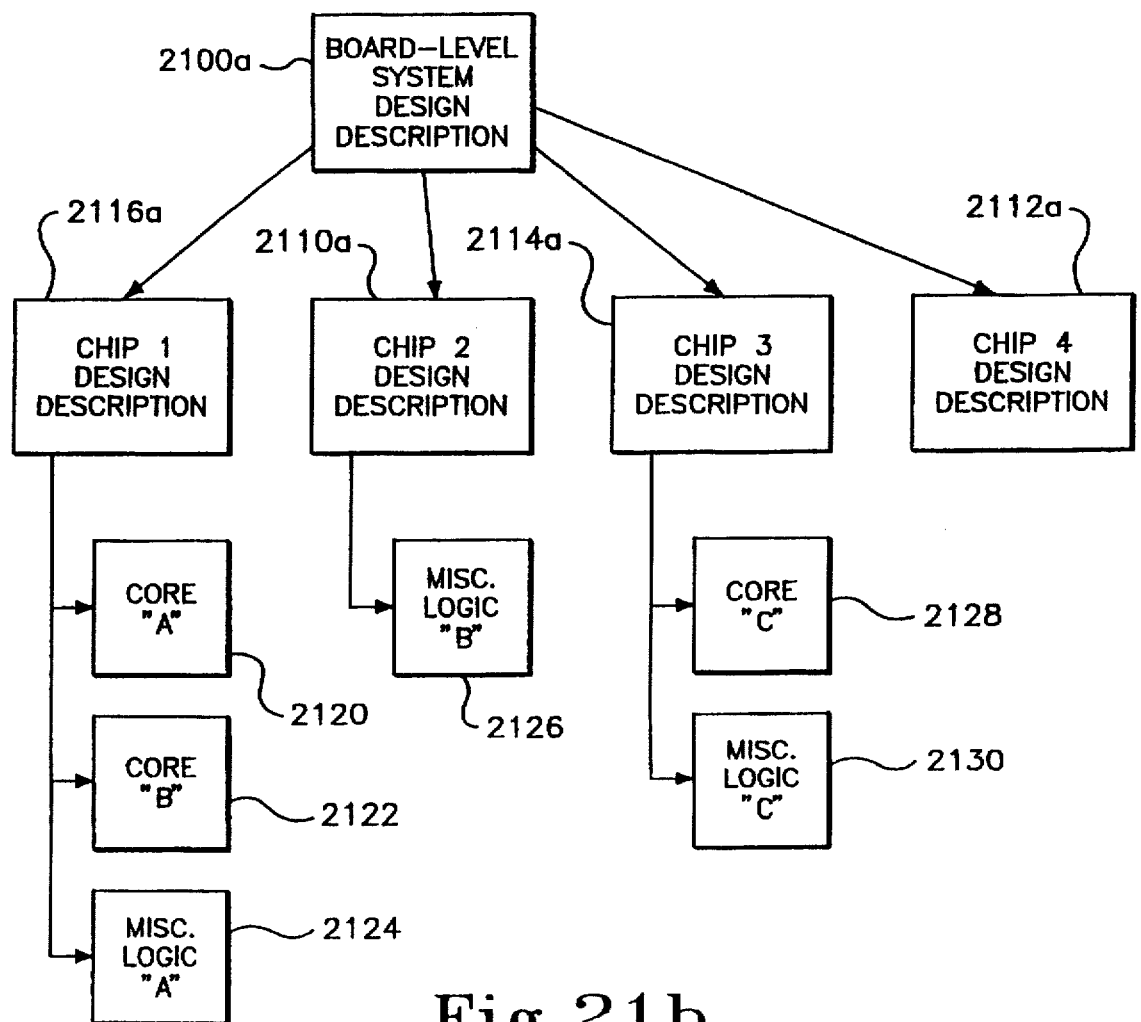

FIGS. 21a and 21b are representative of a board-level system design. FIG. 21a is a view of a board level system 2100 built on a printed circuit board 2105. A microprocessor 2116 (CHIP 1), two controller chips 2110 and 2114 (CHIP 2 and CHIP 3, respectively) and nine memory chips 2112 (CHIP 4) are included in the design.

FIG. 21b shows the design hierarchy for the board level system of FIG. 21a. The board-level system design description 2100a makes reference to design descriptions 2116a, 2110a, 2114a, and 2112a for the microprocessor 2116 (CHIP 1), the two controllers 2110 and 2114 (CHIP 2 and CHIP 3, respectively) and the memory chips 2112 (CHIP 4). The microprocessor 2116 is a custom design which includes two core cells and additional logic. This is indicated in the hierarchy by the design description 2116a for the microprocessor 2116, which refers to two core cells 2120 (CORE "A") and 2122 (CORE "B"), and a logic block 2124 (misc. logic "A"). The design description 2110a for one of the controllers 2110 (CHIP 2) refers to a logic block 2126 (misc. logic "B"). The design description 2114a for the other controller 2114 (CHIP 3) refers to a core cell 2128 (CORE "C") and a logic block 2130 (misc. logic "C"). The design description 2114a for the memory chips 2114 (CHIP 4) treats the memory as a storage function block, and provides no visibility into circuitry inside of the memory.

By applying the graphical interactive schematic simulation techniques described hereinabove with respect to FIGS. 16–19 to the board level system 2100 of FIG. 21a, a screen display such as that shown in FIG. 22 results.

Figure 22:
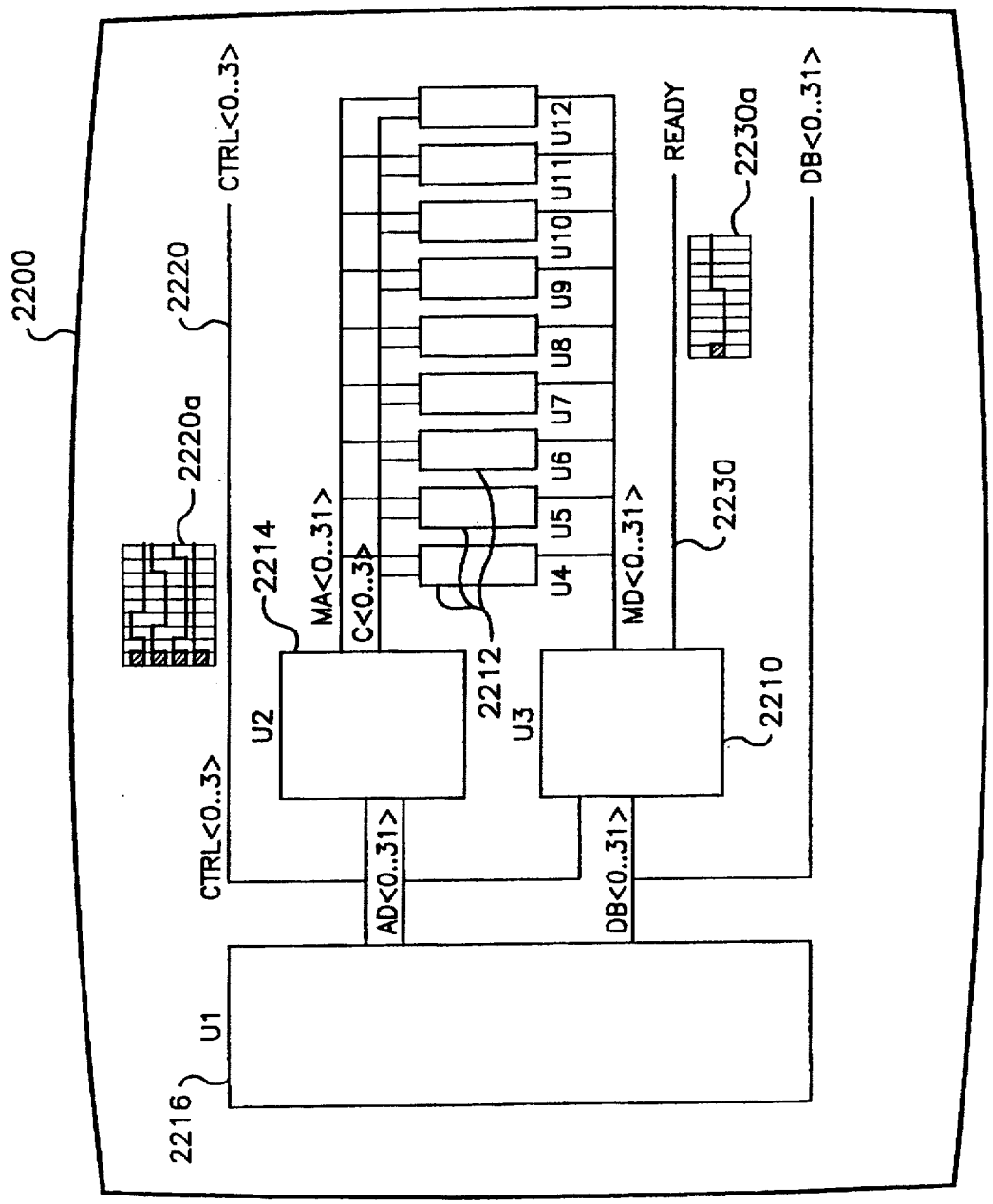
FIG. 22 is an ECAD display screen representation showing simultaneous schematic display and simulation of the board-level system of FIGS. 21a and 21b.

In FIG. 22, graphical representations 2216, 2214, 2210, and 2212, corresponding to the microprocessor 2116, controller 2114 (CHIP 3), controller 2110 (CHIP 2) and memories 2112 (CHIP 4), respectively, of FIGS. 21a–b, are shown on an ECAD display screen 2200 in schematic diagram form. A bus signal line 2220 (CTRL<0..3>, representing four physical "wires") connects between the graphical representation 2216 of the microprocessor 2116 and the graphical representation 2214 of the controller 2114 and extends off towards the right hand side of the display screen 2200 (as depicted). An underlying simulation of the system represented on the screen 2200 (such simulations are described hereinabove) produces simulation results. A subset of the simulation results corresponding to signals on the bus 2220 are displayed on the screen 2200 in the form of a graphical timing diagram display 2220a positioned adjacent to the bus 2220 on the display screen 2200. Another subset of the simulation results corresponding to a signal on a READY line 2230 is displayed as a graphical timing diagram display 2230a, adjacent to the READY line 2230 on the display screen.

It will readily be appreciated by one of ordinary skill in the art that any of the display techniques described hereinabove with respect to FIGS. 16–19 can be applied to the system of FIG. 21a. Any signal line on a display screen schematic representation (e.g. 2200) of all or a portion of an electronic system can have either textual or graphical simulation "notations" placed beside signal lines on the display screen. Further, the design "hierarchy" may be used to traverse various "levels" of the system to provide schematic diagrams and simulation data for signals "inside" or "behind" high-level symbols. Such "viewability" of schematic diagrams and simulation results is therefore available down to the lowest modelled level of the electronic system.

The simultaneous schematic diagram and simulation display technique described hereinabove with respect to FIGS. 16–19 and 22, can be applied to any electronic system, including board level systems, integrated circuits, multi-board systems, multi-chip modules, or any portion of an electronic system. The simulation results can include results obtained from a "hardware" simulation whereby one or more physical components are "plugged into" a software simulation.

Effectively, then, any electronic system or portion thereof at any hierarchical level, which can be represented by a schematic diagram and which can be simulated, either by software or mixed software/hardware means, can be presented in the fashion shown and described with respect to FIGS. 16–19 and 22. That is, if a system can be displayed on a display screen in schematic form and the system can be simulated, then the simulation results can be collected and displayed along with the schematic representation on the display screen as textual signal values, timing diagrams, state tables, etc.

This method of displaying simulation results on a schematic diagram can also be applied to electronic systems design by the logic synthesis process described hereinabove with respect to FIGS. 1–15.

Figure 23A:
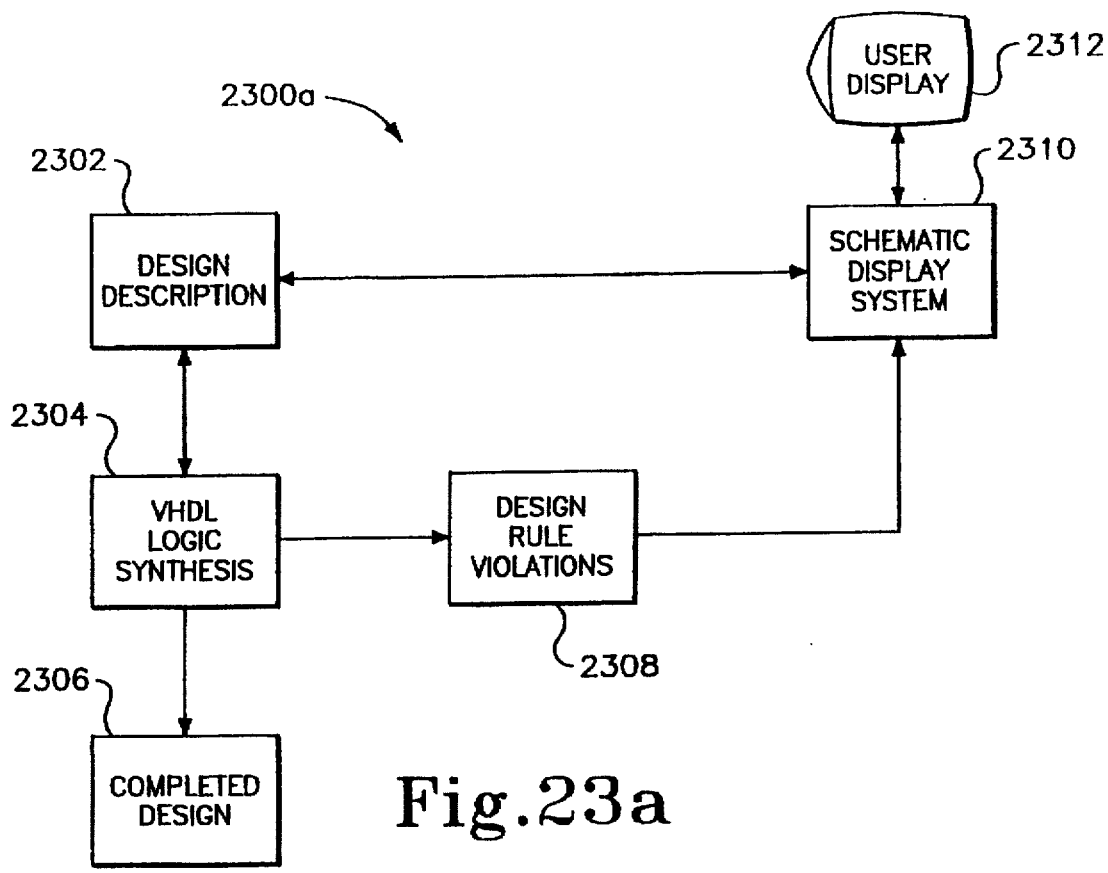
FIG. 23a is a block diagram of a system for graphically displaying circuit diagrams and simulation results corresponding to a design rule violation detected in the synthesis of an electronic system.

FIG. 23a shows a system 2300a wherein a design description 2302 is operated upon by a VHDL logic synthesis process 2304, such as described hereinabove, to provide a completed electronic system design 2306. In the process, the logic synthesis process 2304 "fleshes out" the design description 2302 with intermediate design descriptions for lower levels of the design. A schematic display system 2310, such as that described hereinabove with respect to FIGS. 16–19 and 22, provides the capability of displaying simulation data on a schematic diagram on a user display 2312, in close association with graphical representations of the signal lines represented by the simulation data.

In the process of synthesizing digital logic, it is not uncommon to discover that one or more design rules (e.g., timing rules, loading rules, etc.) have been violated. The logic synthesis process 2304 provides indications an information about design rule violations 2308. This information includes data about what signals and components of the design are in violation of the rules. In response, the schematic display system calls up an appropriate schematic diagram (i.e., a schematic diagram on which the offending signal, signals, and/or components can be found) and displays the schematic diagram and simulation results corresponding to the design rule violations 2308. The user can then interact with the schematic display system (via the schematic editor) to make alterations to the design description 2302 which will eliminate or correct the design rule violations 2308.

The system described above with respect to FIG. 23a can be significantly enhance by the addition of an "expert system", or "knowledge-based system". Expert systems are widely known in the art, and generally comprise an "inference engine" and a "knowledge base". The knowledge base contains information pertinent to the solution of a particular set of problems, and is derived from "training sessions" whereby a human expert "trains" a computer expert system by going through a wide variety of problems and solutions, and providing the computer (directly and indirectly) with rules and guidelines for solving the problem. The rules and guidelines constitute a knowledge base with which an inference engine can attempt to suggest solutions to a new problem according to the training by the expert. Such a knowledge-based system is described in U.S. Pat. No. 4,965,741 issued Oct. 23, 1990 to Winchell et al., incorporated by reference herein. Such an expert system, "trained" in logic design techniques, can be used to augment the system of FIG. 23a by providing design assistance to the user in the form of suggestions for altering the design to correct the design rule violations.

Figure 23B:
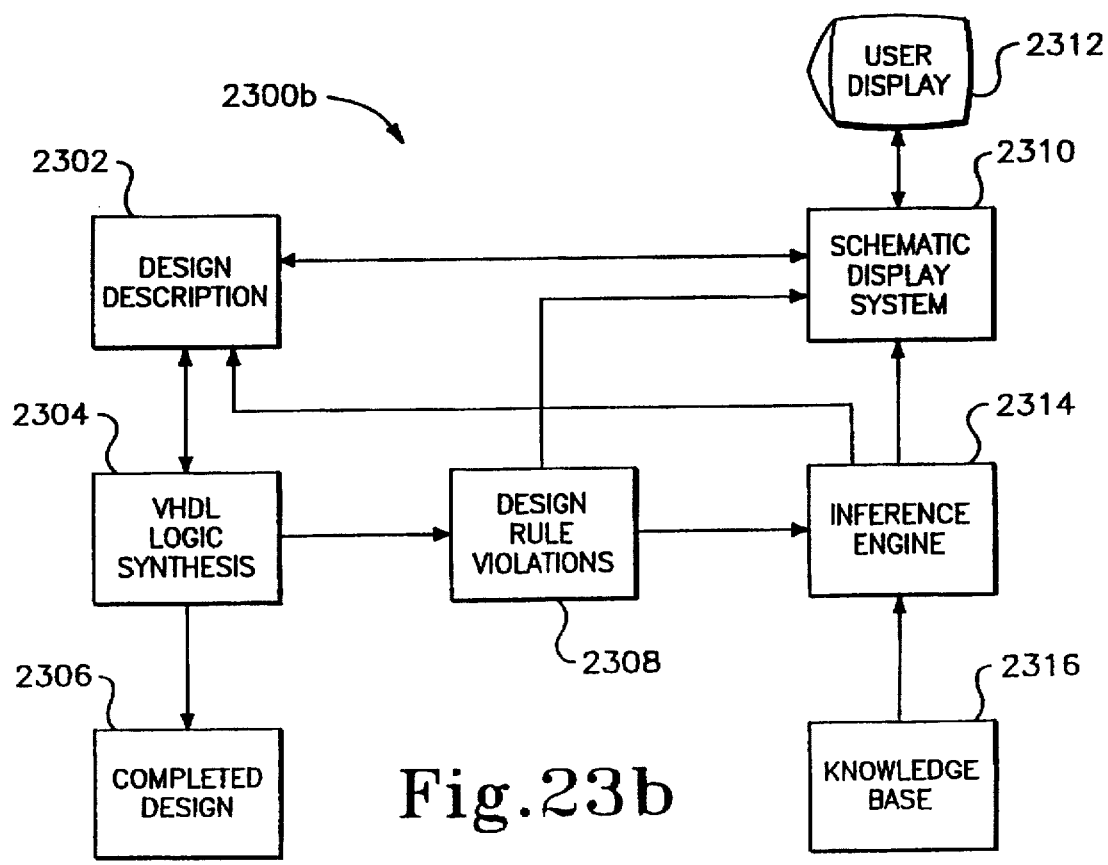
FIG. 23b is a block diagram of a system similar to that of FIG. 23b, but incorporating an expert system for suggesting possible design alterations or corrections to the user.

FIG. 23b is a block diagram of an improved design system 2300b, similar to that of FIG. 23a, but including an inference engine 2314 and a knowledge base 2316. The inference engine 2314 and the knowledge base 2316 comprise an expert system. The knowledge base is trained with logic design techniques, design rules and methods for correcting design rule violations 2308. When design rule violations 2308 are indicated by the logic synthesis process 2304, the inference engine 2314 analyzes information about the design rule violations 2308 according to information contained in the knowledge base 2316, and suggests design alterations to the user, via the user display 2312 and schematic display system 2310. If the user accepts the suggested alterations, then the inference engine makes the corrections to the design description 2302.

Figure 24:
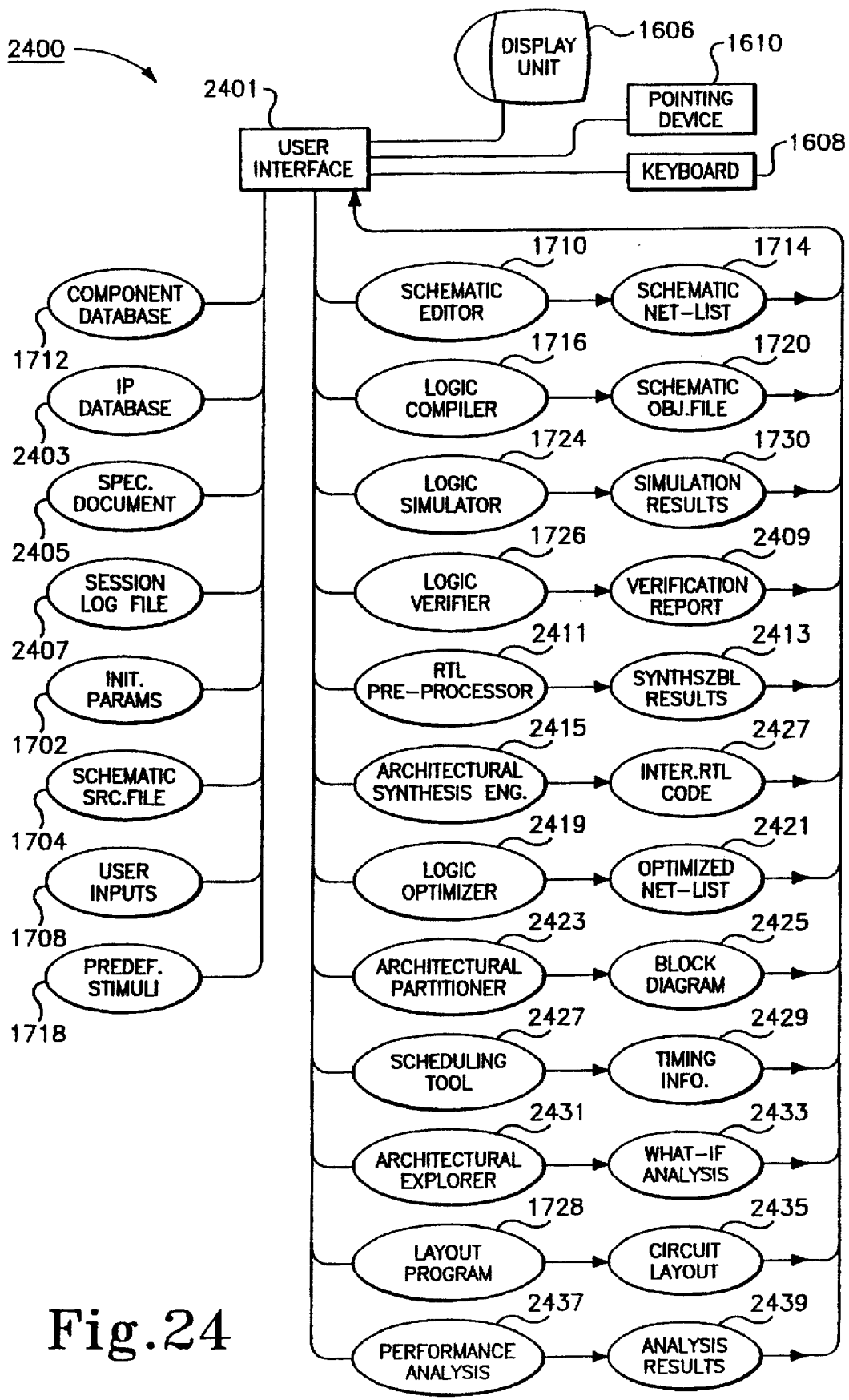
FIG. 24 is a software structure chart illustrating user interface and major software components of the invention.

FIG. 24 is a schematic of the user interface and the tools accessed by the user interface in the ECAD system of the present example of a preferred embodiment of the invention. FIG. 24 illustrates several of the elements previously shown and described with respect FIG. 17. The descriptions given above are also applicable to items identified with like reference numerals. FIG. 24 shows extensions to the system of FIG. 17. The ECAD system 2400 includes a user interface 2401. The user interface 2401 is a computer program designed to interface between other programs (e.g., the various tools of the ECAD system 2400) and a graphical Display Device 1606, a keyboard 1608, and pointing device 1610. A person of ordinary skill in the art will recognize that many alternatives to this architecture exist. For example, in FIG. 17, the schematic editor 1710 interacts directly with the simulation results 1730 from logic simulator 1724 and the output from layout program 1728. Thus, an alternative embodiment may have the user interface 2401 incorporated into the schematic editor 1710.

The user interface 2401 interacts with a number of databases, for example, component database 1712 (described in greater detail hereinabove with respect to FIG. 17); intellectual property database 2403, in which is stored information about intellectual property ownership to certain elements in the component database; specification document 2405, in which is stored constraints and other information regarding the specification of the circuit under design (for example as described with respect to FIGS. 25a–25g below); session log file 1706; initialization parameters 1702; schematic source file 1704; user inputs 1708; and predefined simulation stimuli 1718. Elements 1706, 1702, 1704, 1708, and 1718 are described in greater detail above with respect to FIG. 17.

In addition to the program and tools described with respect to FIG. 17, the user interface 2401 interacts with the following programs: RTL preprocessor 2411, architectural synthesis engine 2415, logic optimizer 2419, architectural partitioning tool 2423, scheduling tool 2427, architectural exploration tool 2431, and performance analysis tool 2437. This list of programs is meant only to be exemplary of CAD tools which may be utilized in conjunction with the ECAD system described herein. It should not be construed either as exhaustive or to mean that any or all of these tools are essential to the present ECAD system. One of ordinary skill in the art will realize that there are many possible combinations of tools, and the use of any such combination is within the spirit and scope of the present invention.

In FIG. 24 information and output from these various tools and databases are directed through the user interface 2401 to the Graphical Display Device 1606. Output files accessible to the user interface 2401 include: verification report 2409, which is the output from logic verifier 1726; the synthesizable results 2413, output from the RTL preprocessor 2411; the intermediate RTL code 2417, which is output from the architectural syntheses engine 2415; the optimized netlist 2421, which is output from logic optimizer 2419; block diagram 2425, which is output from architectural petitioner 2423; the timing information 2429 obtained from scheduling tool 2427; the what-if-analysis results 2433 obtained from utilizing architectural exploration tool 2431; the circuit layout 2435 obtained from the circuit layout program 1728; and the analysis results 2439 obtained by executing the performance analysis total 2437.

In one embodiment of the present invention, data passed between the user interface 2401 and the various pieces of information may be managed by a database management system (not shown). Associated with each tool is a list of information which the tool updates. Whenever the tool is executed, the databases affected by that tool are updated. In some cases the execution of a tool may make other pieces of information obsolete. For example, as discussed above with respect to FIGS. 17–19, a change in schematic source file renders the schematic net list obsolete. That fact is recorded in the appropriate database. Making a piece of information nonobsolete may require the execution of other tools. Information concerning the tools required to accomplish this is stored in the database, so as to enable the user interface 2401 to inform the user as to what steps to take in order to update or create a particular piece of information.

FIGS. 25a–25g are a series of views of different levels of design abstraction. It should be noted that the design examples given in FIG. 25a–g do not directly correspond to one another. They are provided in isolation of one another as independent examples of designs at their respective levels of design abstraction.

Figure 25A:
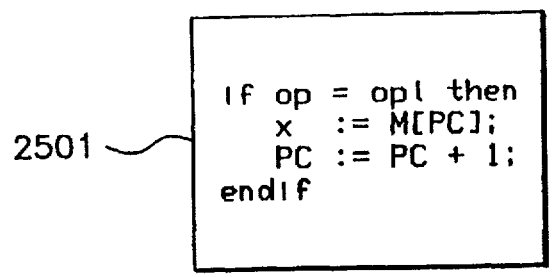
FIGS. 25a–g are illustrations of designs, at different levels of abstraction, according to the invention.

In FIG. 25a a design is shown at the System Specification level. The system is described in the VHDL language or VHSIC (Very High Speed Integrated Circuit) hardware description language. An example VHDL code segment is shown as code sequence 2501 in FIG. 25a. The description can also be in other computer languages. For example, in the U.S. patent application Ser. No. 07/507,201, entitled "METHODOLOGY FOR DERIVING EXECUTABLE LOW-LEVEL STRUCTURAL DESCRIPTIONS AND VALID PHYSICAL IMPLEMENTATIONS OF CIRCUITS AND SYSTEMS FROM HIGH-LEVEL SEMANTIC SPECIFICATIONS AND DESCRIPTIONS THEREOF", the behavior of a circuit is described in part in the PROLOG programming language. Furthermore, high-level descriptions are often made in English (or any other natural language). An example of such a description is given below:

"The design comprises a microprocessor with a 32-bit data bus and 16 data registers. The processor is to be implemented on one chip. It should have an on-chip floating-point accelerator. The clock speed should be 33 MHZ or higher. The design may not include in excess of 100,000 gates. It would be preferable if the power supply be 3.3 volts. The design should not have more than 128 pins. This specification was made by Jack Crouch on Apr. 20, 1993. Revision 3.0."

Figure 25B:
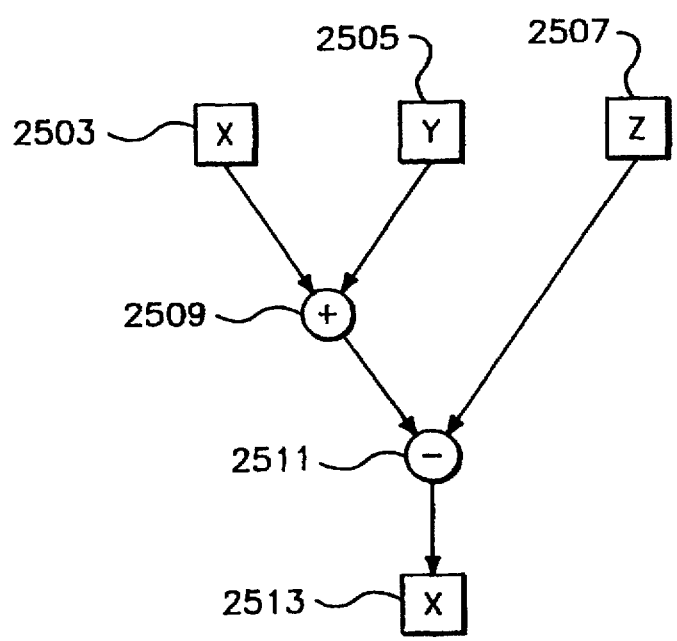

FIG. 25b illustrates a design at the behavioral level. The behavior is indicated by a control and data flow graph (CDFG). This is an example of the behavior of a portion of the logic of a circuit design. Variables X 2503 and Y 2505 are fed into adder 2509, the result of which is fed into subtractor 2511. Also fed into subtractor 2511 is the quantity Z 2507, the result from subtractor 2511 is fed into quantity X 2513.

Figure 25C:
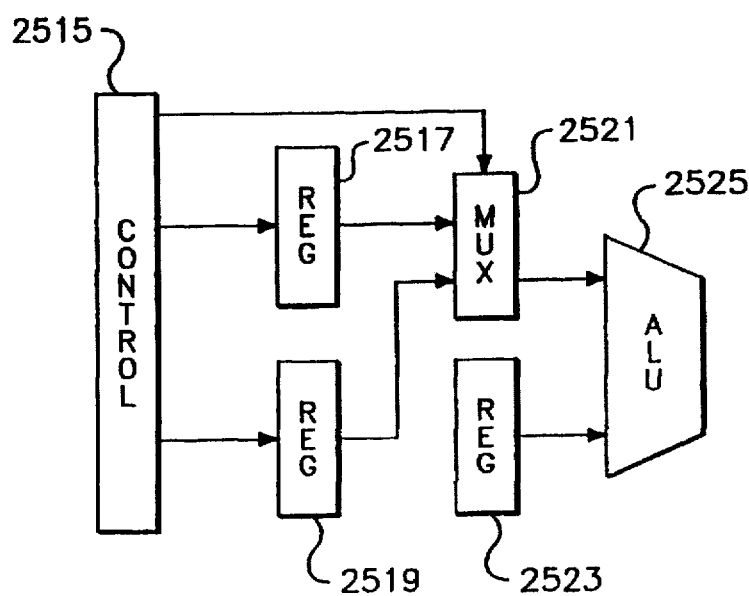

FIG. 25c illustrates a design at the Register Transfer Level (RTL), which describes a system as a set of interconnected storage elements and functional blocks. An RTL description represents hardware behavior as a series of data transfers of transformations between storage elements. The example register transfer structure is composed of control logic 2515, registers 2517 and 2519, multiplexer 2521, register 2523 and ALU 2525. In a high-level synthesis system (e.g., that described hereinabove with respect to FIGS. 1–15), an RTL description is derived from a high-level design description (e.g., a behavioral description) by "binding" the description into specific circuit elements such as registers, multiplexers, ALUs and control logic.

Figure 25D:
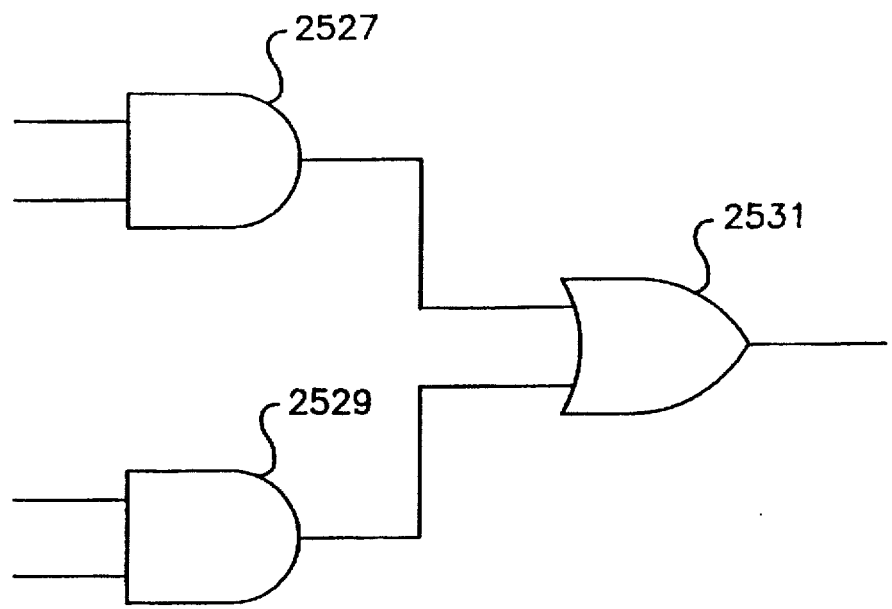

FIG. 25d illustrates a design at the logic level, in which the behavior of the circuit is shown as schematic representations of logic equations. A logic level design, as shown in FIG. 25d is composed of a number of gates. In the example of FIG. 25d, a circuit is shown as AND gates 2527 and 2529 and OR gate 2531. This representation is a lower level view of a circuit design. For example, the circuit shown in FIG. 25d could be a portion of ALU 2525.

Figure 25E:
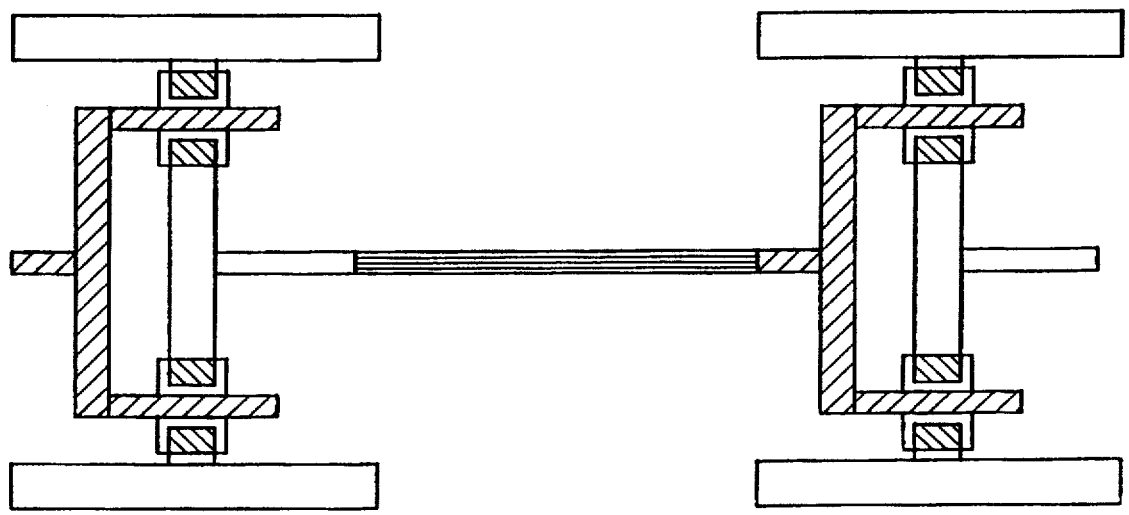

FIG. 25e illustrates a circuit layout. The layout polygons 2533 as shown in FIG. 25e represent various elements at the process level. For example, certain polygons represent vias between layers and other polygons represent wires between the various transistors which make up a circuit.

Figure 25F:
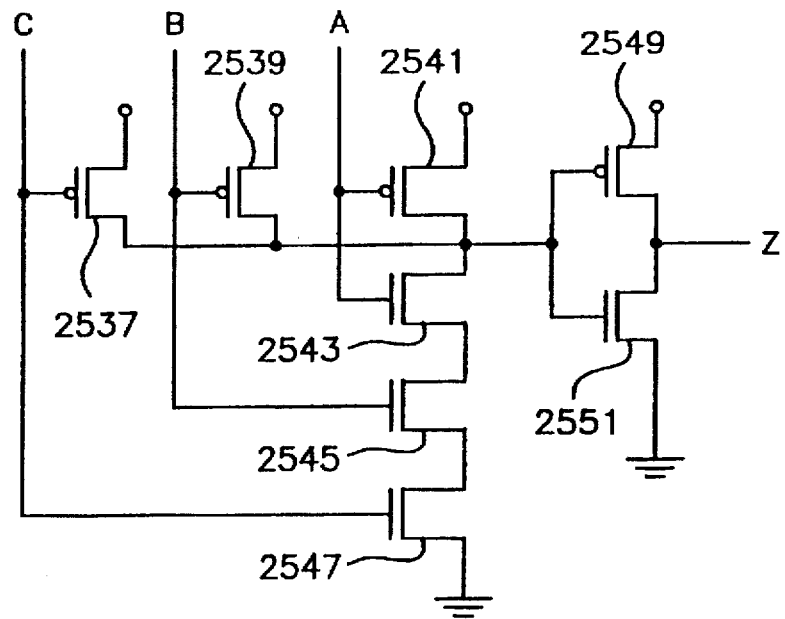

FIG. 25f illustrates a transistor-level view of a logic circuit. In the example of FIG. 25f, a 3-input AND gate is illustrated at the transistor-level. It is composed of interconnected MOS transistors 2537–2551.

Figure 25G:
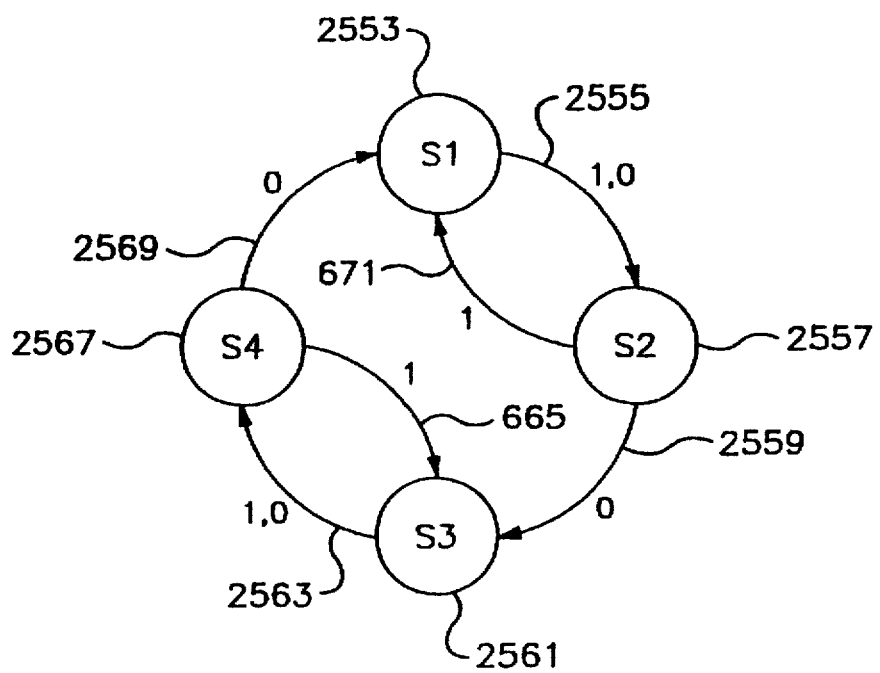

FIG. 25g illustrates a finite state machine which models the behavior of a sequential circuit. The state machine in this example is responsive to a single input value, and includes four states S1–S4 shown as elements 2553, 2557, 2561, and 2567, respectively. Given a particular state, for example S1, a transition to another state dependent upon the input value received. In the case of state S1 either a one or a zero will cause a transition to state S2. Other states, for example S2, as shown as element 2557, will have transitions to different states depending on which input value is received. In the case of element state S2, an input value of one will cause the transition to state S1, whereas an input value of zero will cause a transition to state S3. Finite state machines may be utilized to model any part or any group of parts of a design or may serve as a specification for the behavior of a design. The transitions caused by the various inputs are shown in the figure as arcs 2555, 2559, 2563, 2565, 2569 and 2571.

Returning to FIG. 24, user interface 2401 is operable to display, on graphical Graphical Display Device 1606, any level of design abstraction, e.g., any of the design abstraction levels illustrated in FIGS. 25a–25g, or a textual description as the one given above.

Figure 26:
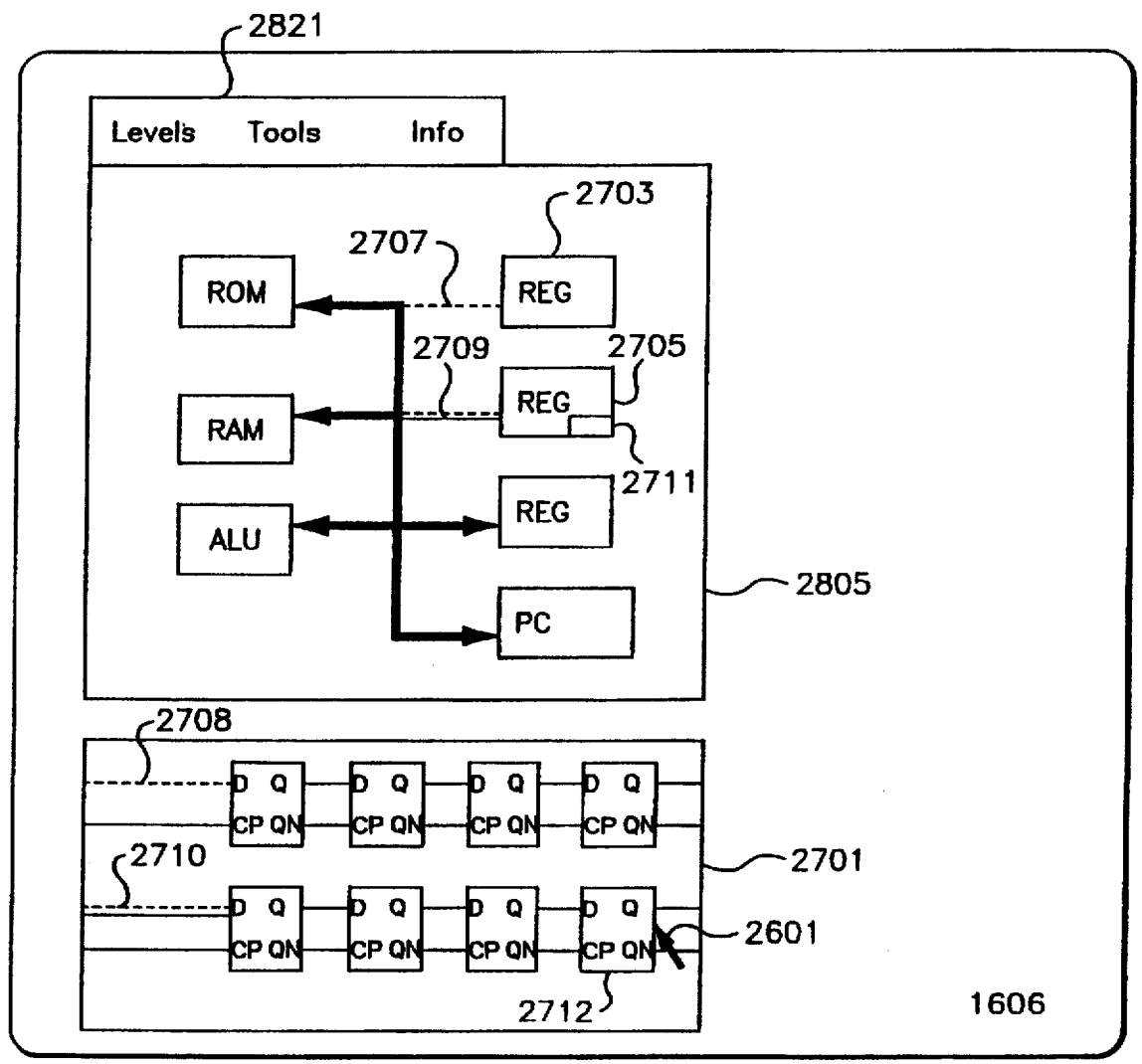
FIG. 26 is a display screen image illustrating information presented to the user at different levels of abstraction, according to the invention.

FIG. 26 is a schematic illustrating the correlation of like kinds of information from a representation of a design at one level of design abstraction to the representation of the same design at a different level of design abstraction. The screen of the Graphical Display Device 1606 contains, by way of example, two windows 2805 and 2701. In the example of FIG. 26, window 2805 contains a Architectural Level view of a circuit. Window 2701 is a logic level view of the same circuit shown is window 2805. The circuit in window 2805 contains registers 2703 and 2705. These correspond to a series of flip-flops, respectively. Datapath 2707 leading into register 2703 is the same datapath as datapath 2708. To enable the user to readily ascertain that these datapaths are the same, paths 2707 and 2708 are each displayed as a dashed line. Similarly, paths 2709 and 2710 refer to corresponding representation of another datapath displayed in windows 2805 and 2701, respectively. In order to visually indicate correspondence of the paths 2709 and 2710, they are each displayed with the same line style, different from the line style used for paths 2707 and 2708 (in this case, a dashed line adjacent to a solid line). In alternative embodiments, like signal paths can be displayed using color-based coding or by using other types of graphical coding to indicate commonality.

Additionally, selecting an object in one window will cause that object to be automatically highlighted in all other windows in which it appears. In FIG. 26, a cursor 2601 is shown pointing to flip-flop 2712. The user has caused the selection of flip-flop 2712, thereby causing it to be highlighted. The selection of flip-flop 2712 in turn causes a section 2711 to be highlighted (shaded, in the figure) in block 2705 of window 2805. Because of the scale differential between the two representations, the highlighting in window 2805 may be displayed as the lighting or flashing of a very small dot inside of box 2705. Alternatively, the smallest object in the higher level representation, which contains the selected object in the lower level representation, is highlighted in its entirety.

Also shown in FIG. 26 is menu bar 2821, which is described in greater detail below with respect to FIG. 28.

Figure 27:
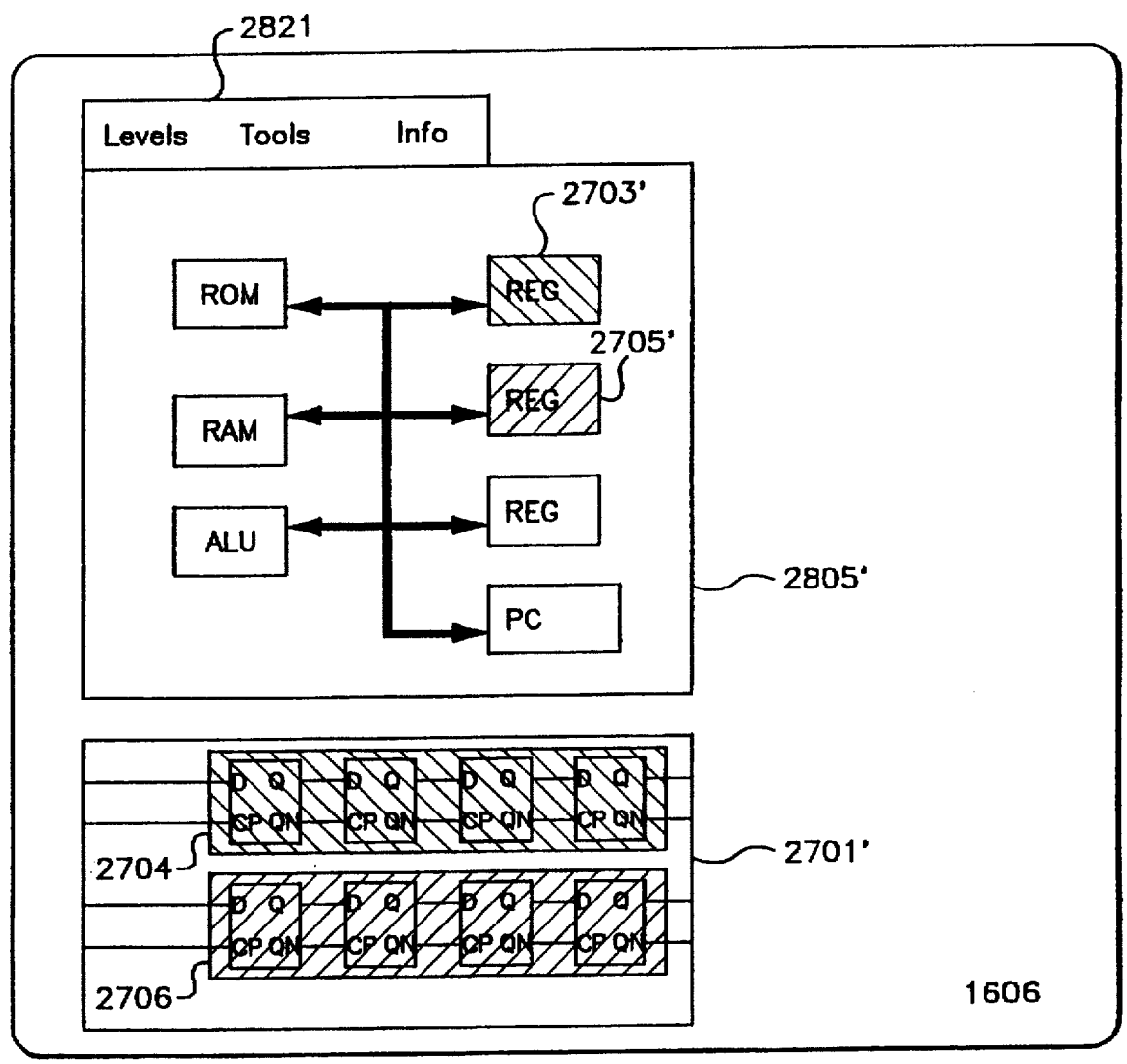
FIG. 27 is a display screen image similar to that of FIG. 26, illustrating the use of overlays highlighting corresponding elements in the display, according to the invention.

FIG. 27 is a schematic utilizing overlays to illustrate the different levels of design abstraction on the same display. Window 2805' on Graphical Display Unit 1606 contains a circuit at the block diagram level of abstraction. It contains, among other elements, registers 2703' and 2705'. Window 2701' contains a portion of the same circuit at the gate level. It contains two series of flip-flops shown in the interior of boxes 2704 and 2706, corresponding to register 2703' and register 2705', respectively, and indicating direct correspondence between the register 2703' in window 2805' and the "boxed" flip-flops 2704 in window 2701', and between the "boxed" flip-flops 2706 in window 2805'. A common shading style is used to visually highlight the corresponding boxes (2704 and 2706) and registers (2703' and 2705', respectively).

Figure 28A:
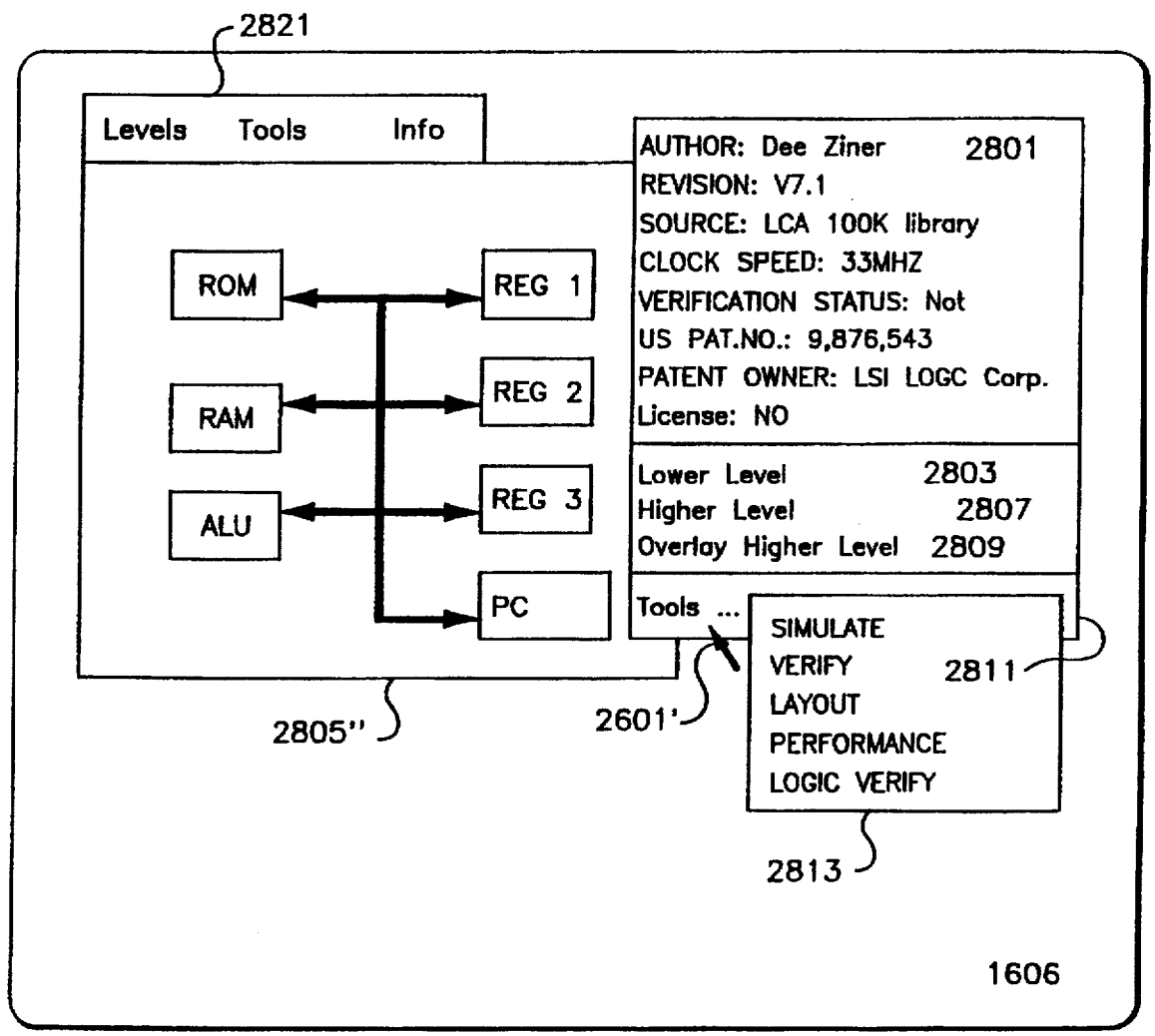
FIGS. 28a–b are display screen images illustrating various formats of information available to the user, according to the invention.

FIG. 28a illustrates user interface (i.e., 2401, FIG. 24) interaction with a user via the Graphical Display Device 1606. Window 2805" contains a block diagram for a design architecture. The user has selected an object REG 1. The object REG 1 is highlighted (shaded) to indicate that the object has been selected. The selection of the object causes the display of information associated with that object to appear in a window 2801. The window 2801 is displayed adjacent to the selected object REG 1 without overlaying the selected object. It is preferable to not overlay any part of the design displayed in the window 2805". It is also preferable to display the associated object information as close to the selected object as possible. The user interface 2401 attempts to satisfy both of these constraints, with preference given to avoiding occlusion of the selected object if it becomes necessary to overlay any part of the window 2805".

Window 2801 also contains several menu items 2803, 2807, 2809, and 2811. Selection of menu item 2803 causes the present example of a preferred embodiment to display the next lower level abstraction in the representational hierarchy of the present invention for the selected object, for example, a gate level representation of the selected object. Menu item 2807 causes the display of the next higher level of abstraction in which the selected object is an element, for example, a system level block diagram. Selection of menu item 2809 causes an overlay (e.g. a highlighted area or a boundary "box") relating to a higher level abstraction to appear on the currently displayed schematic. As shown in the figure, the user has selected menu item 2811, which causes the present invention to display a menu 2813 containing a list of various design tools available for use with the selected object. Selection may be accomplished for example, by positioning a cursor 2601' using a mouse, and then clicking on the right mouse button in a manner known in the art.

In an alternative embodiment, the information related to the selected object is displayed directly on the schematic representation of the design. FIGS. 18 and 19 illustrate examples of this in a display of simulation stimuli and simulation results. This method of displaying information is available for other types of information as well. For example, the system of the present invention is operative to display the part numbers of all objects within a window, the power requirements of each of the objects in a window, the source of (name of the parent object containing) each of the objects within a window, etc. Any such selected information is displayed immediately adjacent to the displayed schematic representation of the corresponding object.

Figure 28B:
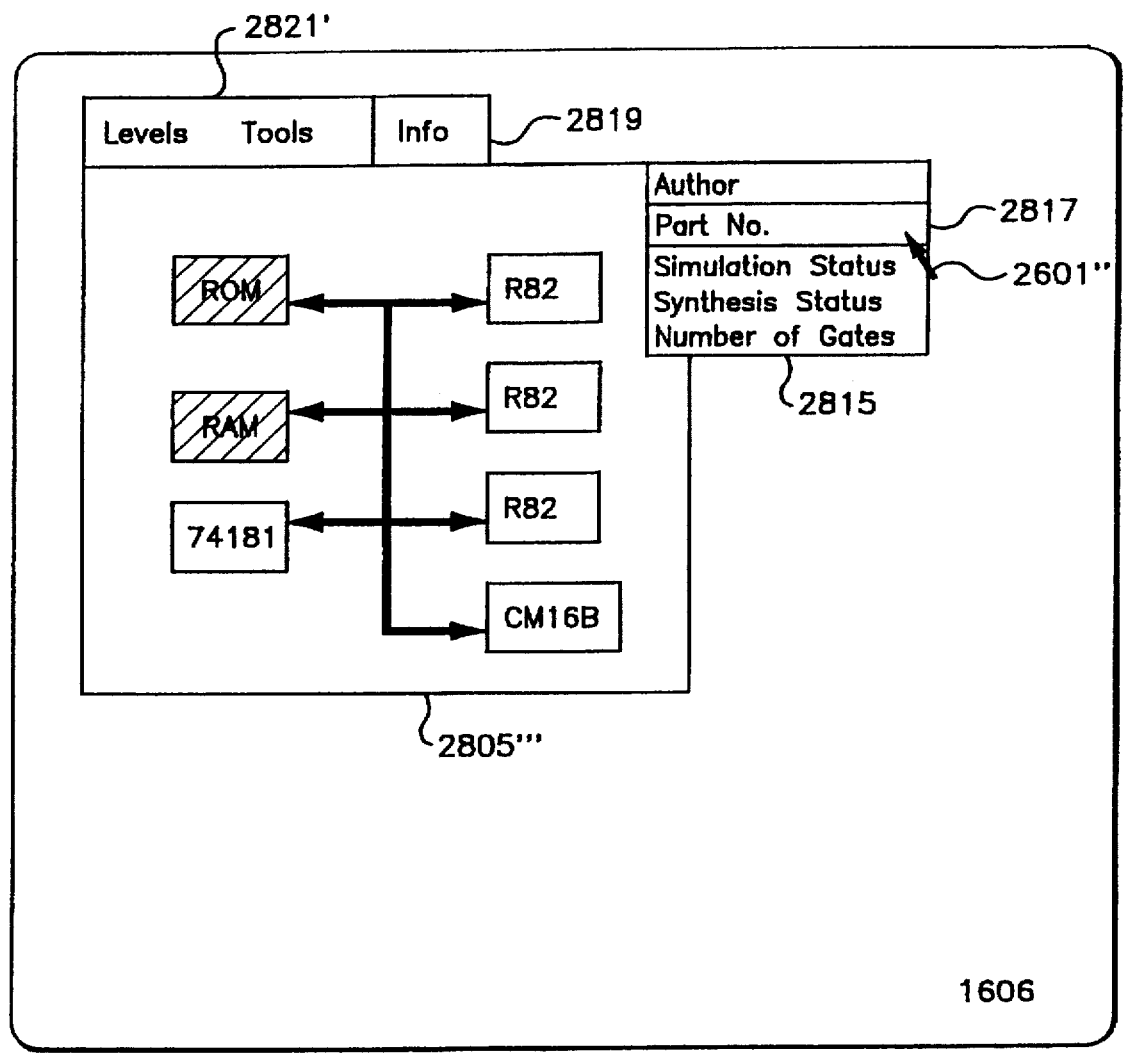

FIG. 28b illustrates a different interaction between the user and the user interface 2401. The design shown window 2805" in FIG. 28a is displayed at the same level of abstraction in window 2805''' in FIG. 28b. Menu-bar 2821' contains several pull-down menus which can be worked to operate on the entire schematic as shown in the window to which it is attached, here window 2805'''. The "Levels" menu enables a user to move to different levels of design abstraction. The "Tools" menu enables the user to execute design tools available at that level of abstraction. FIG. 28b illustrates that the user has selected the "Info" pull-down menu 2819 (as indicated by shading of the word "Info" on the Menu-bar 2821). Menu 2819 causes information available about all the objects in a representation to be displayed on or adjacent to the various objects. FIG. 28b illustrates that the user has selected the Part No. menu item 2817 (visually indicated by shading of the words "Part No." in the menu 2815) by positioning cursor 2601" over menu item 2817, and clicking the appropriate mouse button or otherwise indicating this selection. In response to this selection, user interface 2401 has displayed the part number of the various objects in the design, e.g., "R82", "CM16B" and "74181". In this example, the user has not yet designed the ROM and RAM objects. Therefore, no part number is available and thus none is displayed. To visually indicate this "no information available" state to the user, the ROM and RAM objects are shaded or highlighted.

In the paragraphs which follow, some of the information available in the present example of a preferred embodiment of the invention is listed and discussed. This list is not meant to be exhaustive nor is it to be construed to imply that all these pieces of information are required in the ECAD system of the present invention. In this embodiment of the invention, the following information is available through user interface 2401 to be displayed to a user:

Circuit loading: This item of information includes, for example, the standard load or the picofarad load for gates. The standard load or picofarad load affects the rise time and fall time of the gate and the propagation delay through the gate.

Performance and timing: These information items include performance characteristics and timing parameters for a particular object in a design. This information includes the rise and fall times for signals, propagation delays, and set-up times. It also includes acceptable clock rates at which a design may be driven. This information is available at all levels of design abstraction. The source of the performance and timing information varies with the abstraction level. For example, at the highest level this information may be included in a list of constraints given in the specification documents. At other levels, the performance of a circuit may be determined by simulation tools. Propagation delays through gates and other standard cells may be obtained from the component database 1712. Additional timing information is available for flip-flops and latches, including setup time, hold time, and minimum clock pulse width.

Drive strength: This information item includes, for example, the power output from a device. The various components of a circuit require particular strengths of input signals. Thus, the user needs to be able to verify that the components have sufficient output power to drive the inputs of other components to which they are connected.

Revision history: During the development of a design, many components go through many iterations of redesign. It is helpful to enable the user to verify that the appropriate version of a component is the one being used in the design. Additionally, this may include information about the differences between the various versions of an object.

Source module: This information item contains data necessary to regenerate the object, i.e., the tool with which it was generated, the version number of that tool, the source file for the behavioral description of the object (e.g., VHDL file), and the constraints file.

Reference to direct usage and application information: This item contains application notes to help with various design choices, e.g., testability or gated clock design issues. For example, to assist the user to verify the testability of the design, the application information guides the user in verifying that the circuit is testable and/or guides the user in modifying the design to achieve the testability requirements. Further, information may be given on gated clock design issues, e.g., Design Critic of LSI Logic Corporation which, based on user rules and inherent system rules, verifies the design and determines how to modify the design to conform to the various specified constraints.

Technology option: Examples of technology options are voltage of the circuit (e.g., 5 volt or 3.3 volt), process technology (e.g., LCA 100K and LCA 300K of LSI Logic Corporation), packaging (e.g., Plastic, MQUAD, PQFP, ceramic, MCM).

Design options information: These information items are used to specify how to implement lower levels, e.g., into logic representation, state machine representation, ROM, PROM or NAND/OR Arrays.

Constraints: Specification constraints, either on the system level or on individual components, include die size, number of i/o pins, that all gates have a certain drive capability, and environmental constraints such as RADHARD (Radiation Hardened).

Tool used to build: This item is used to store the tool which was utilized to construct the individual objects or how one representation of the design was transformed into another representation.

Author of work, owner of work, owner of intellectual property: This item is utilized to store the name or group responsible for the creation of an object or set of objects, the entity with proprietary interest in the object and the owner of patents, trademarks, mask works rights and copyrights covering a design or elements of a design. The system further provides patent numbers for any patented elements.

Intellectual property issues: This contains information such as licensing of rights in intellectual property. For example, if a user wishes to employ a particular device in a circuit, the system may not allow access to that device unless the user's employer has a license to that technology. Further, the system may warn the user that certain circuit designs may violate third-party intellectual property rights and advise the user on how to license the required technology.

Information applicable to usage such as driver behavior or timing, margin (slack) information: This information provides the user with data regarding behavior information e.g., whether a particular gate has a particular rise time, fall time or slope. This information is necessary to verify that the driving circuitry produces signals which conform with the requirements of the particular gate, and enables the user to decide whether a circuit modification is necessary. The timing information of an object may be displayed as a waveform. Margin (slack) information refers to delays introduced into the circuit to ensure that signals arrive at various locations in a circuit at the appropriate times, e.g., so that a clock signal does not arrive prior to the bit that it is supposed to clock into a flip-flop.

Clues on design improvement, heuristics: These items may also be referred to as "rules of thumb" or experience-based rules. An example is: "The round-trip delay of a line should not exceed the rise or fall time of the driving signal." Knowing the rise/fall time of a signal, this rule of thumb can be utilized to display to the user a suggested maximum round-trip delay or path length. Another example (related to technology option choices, above) is: "Overall power dissipation of an ASIC may be reduced by utilizing 3.3 V buffers."

Simulation or emulation information: Simulation stimuli and results may be displayed directly onto the schematic as discussed with respect to FIGS. 18 and 19. In one example of emulation, hardware emulation, the logic description of a design is written onto a programmable hardware device, e.g., an PROM or a gate array. This emulated form of the device is then available for other users to use in systems for which the device is being designed, e.g., software developers. The hardware device on which the design is being emulated is much faster than the simulation models.

The designer (user) has information such as whether there is an emulation version of an object in the design and which tools are required to be run in order to emulate the current design.

Snapshot functional information, for quick understanding: This information item includes a brief description about the functionality of individual objects in the design to enable the designer to quickly visualize the flow of information between various design objects. For example, quick-look of a register functional block would tell the user the number of bits stored in the register, how information is clocked into the register, how to retrieve information from the register, etc.

Wave forms representing design behavior, either digital or analog: This is the information shown in FIG. 19 as items 1910, 1912, 1914, 1916, 1918, and 1920, and which are discussed above with respect to FIG. 19.

Schmoo plots: These are plots which show the performance of a given device over a temperature range and a voltage range. They are typically used in the characterization of chips.

Spice runs: These are outputs from the SPICE simulation program.

Model type comparisons: This is information enabling the user to compare the functionality of the representations at various levels of abstraction.

The above list contains examples of information available on the ECAD system of the present invention. Other pieces of information may be useful in a multi-level design environment. The present invention should be construed to include all such types of information within its scope.

Figure 29:
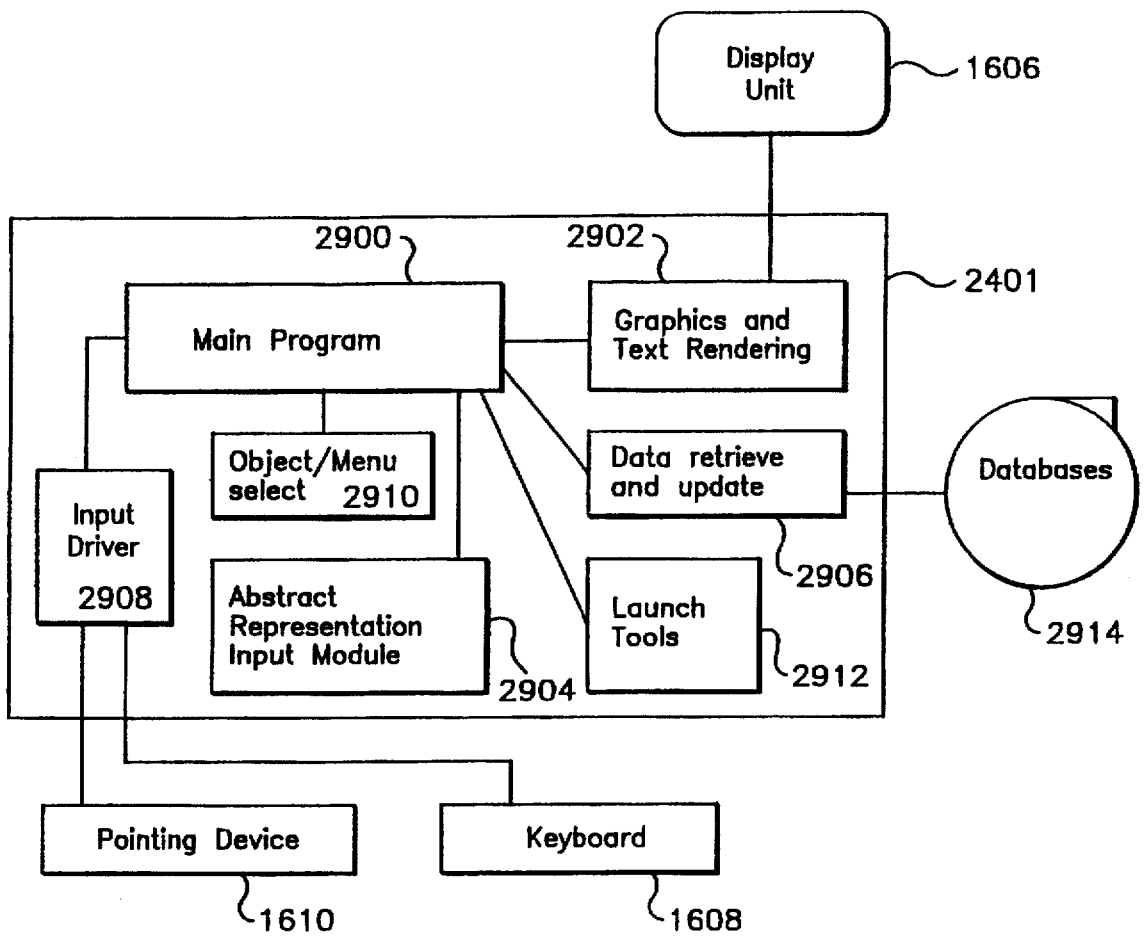
FIG. 29 is a block diagram of a user interface, according to the invention.

FIG. 29 is a block diagram of the user interface 2401. User interface 2401 consists of a main program 2900 interacting with a number of auxiliary programs. In an alternative embodiment, the user interface 2401 may be a set of callable user interface routines. In that embodiment the main program 2900 may be considered as an application program which calls these user interface routines. For example, in FIG. 17 the Schematic Editor 1710 accepts user inputs 1708 and causes the display of the schematics shown in FIGS. 18 and 19. In one implementation of the Schematic Editor 1710, it acts as the main program for user interface 2401.

Many common graphics user interface concepts are part of the user interface 2401 but are not discussed herein in detail. For example, the user interface 2401 includes such standard items as scroll bars, window scaling, window hiding, and window movement, as well as other graphics user interface functionality available using an Apple Macintosh™ or Microsoft® Windows™. These concepts are well known to those of ordinary skill in the art.

Main program 2900 is connected to input driver 2908 to accept inputs from pointing device 1610 and keyboard 1608. This input may either be by way of interrupts or by utilizing a "gadfly" loop in the main program 2900 to determine if a key on the keyboard 1608 has been pressed or the pointing device 1610 has been moved. Main program 2900 calls upon object/menu selection module 2910, to analyze these inputs for selection of an object has been selected, and calls upon the abstract representation input module 2904 to determine whether a design representation is being entered by the user, or from some other source. Main program 2900 can further determine from the input when the user indicates a desire to execute any of the tools to which the user interface is connected and calls upon module 2912 to do so. By way of example, these tools may be any of the tools listed in FIG. 24 as items 1710, 1716, 1724, 1726, 2411, 2415, 2419, 2423, 2427, 2431, 1728, and 2437. The execution of tools and the input of design representations cause information about the design to change. To update this information main program 2900 is further connected to a data retrieve and update module 2906. Module 2906 causes the appropriate databases to be updated. Main program 2900 is further connected to graphics and text rendering module 2902 which causes information and graphics to be displayed on Graphical Display Device 1606. The graphics and text rendered be module 2902 can be, for example, any of those shown in FIGS. 26–28. Detailed explanation of the operation of various modules shown in FIG. 29 are described with respect to FIGS. 31 and 32a–32e below.

Figure 30B:
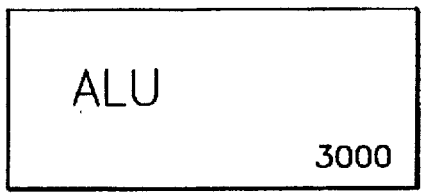
FIGS. 30b–d are schematics of an object at the architectural, logical and transistor levels, respectively, according to the invention.
Figure 30C:
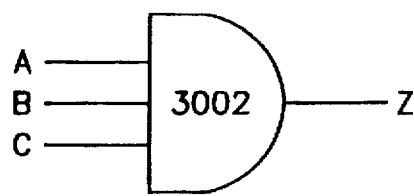
Figure 30D:
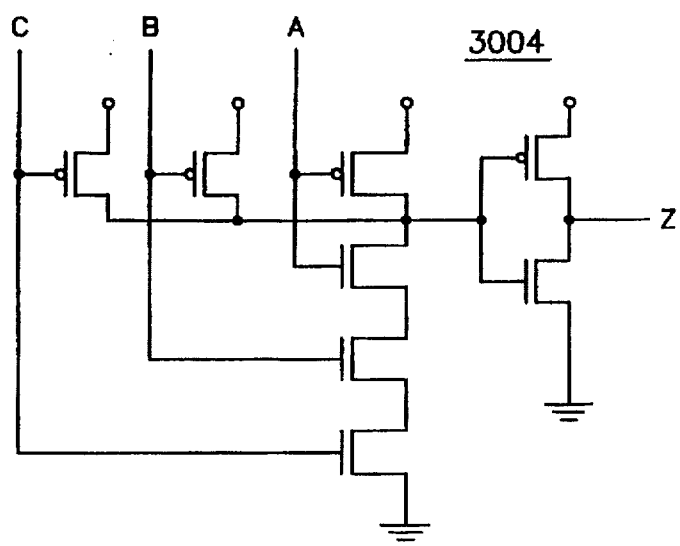
Figure 30A:
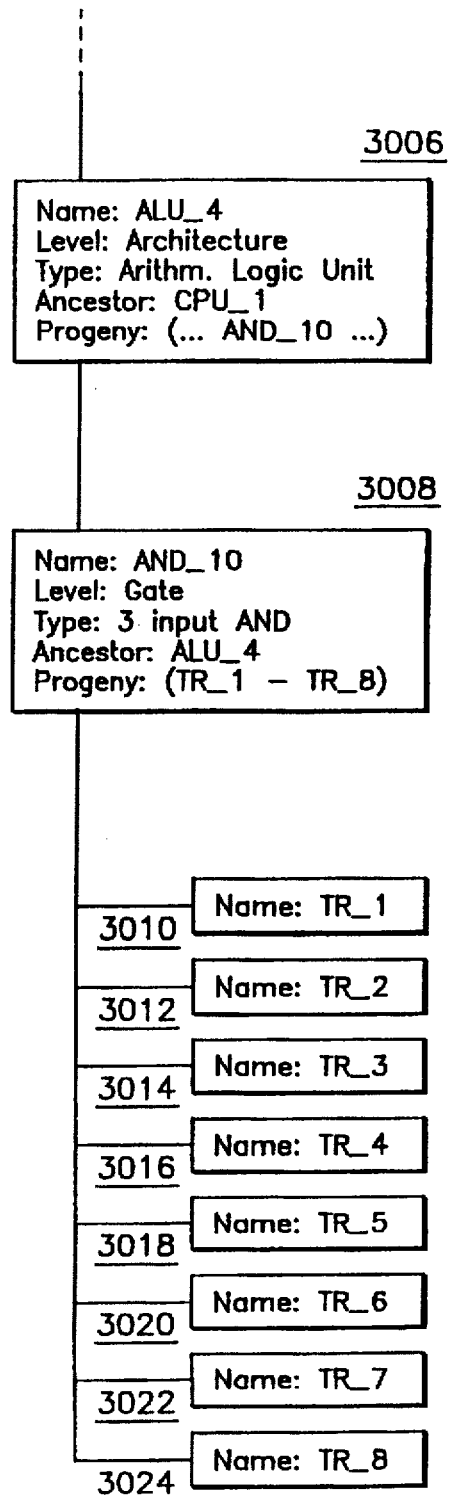
FIG. 30a is an illustration of a design knowledge base, according to the present invention.

One of the databases updated by module 2906 is the database used to link objects from different levels of design abstraction. FIG. 30a shows, as an example, a fragment of a data structure used to store information about the different levels of a design. FIGS. 30b, 30a and 30d show three different levels of abstraction related to the design of an arithmetic logic unit (ALU) 3000.

FIG. 30a illustrates a fragment of a design knowledge base for a design which includes ALU 3000. The design knowledge base includes objects 3006, 3008, 3010, 3012, 3014, 3016, 3018, 3020, 3022 and 3024. This knowledge base may for example be implemented in C++, a general purpose programming language with extensions for object oriented programming. Each object contains a number of attributes. Each attribute contains at least one piece of information about the object. The attributes shown in FIG. 30a are non-exhaustive. The slots shown are those used by the user interface 2401 to navigate between various objects and various levels.

ALU 3000 is displayed as a block in a block diagram at the architectural abstraction level, as depicted in FIG. 30b. It is a component of (its ancestor is) a central processing unit (CPU_1) (not shown). It is composed of, among other elements which are not shown, a 3-input AND gate 3002 depicted in FIG. 30c, which has the name AND_10. AND_10 in return is composed of eight interconnected MOS transistors illustrated in FIG. 30d, having objects 3010 through 3024 shown in FIG. 30a which are associated therewith, respectively. In the operation of user interface 2401 (see FIG. 24), a user may cause the schematics 3000, 3002, and 3004 to be displayed simultaneously.

Object 3006 is the object associated with an ALU 3000 in a design of a Central Processing Unit (its ancestor is "CPU_1"). The object name for ALU 3000 is "ALU_4". Object 3006 is linked, through its progeny list to Object 3008, the object corresponding to the gate level representation of AND gate 3002. Gate 3002 is linked to the objects for its component transistors, Objects 3010 through 3024 shown in FIG. 30d.

The knowledge base shown in FIG. 30a is explary of only a portion of the knowledge base for a complete design. The actual knowledge base underlying a complete design may consist of thousands of objects. Furthermore, there are no explicit restrictions on the information which can be stored in the objects. By way of example, the objects may store any information from the output from any of the tools or databases shown in FIG. 24. Alternatively, the output from various tools is stored in databases or output files associated with the respective tools.

The user interface 2401 (FIG. 24) maintains certain global variables. In the operation of the user interface 2401, a particular representation is considered the current representation. The current representation may be switched in any number of ways, e.g., by the user selecting an object in another representation or by using the "Levels" menu in menu-bar 2821 (FIG. 28). Other variables include selected object, which contains a list of all selected objects, and active representations, which lists all representations of a design.

Figure 31:
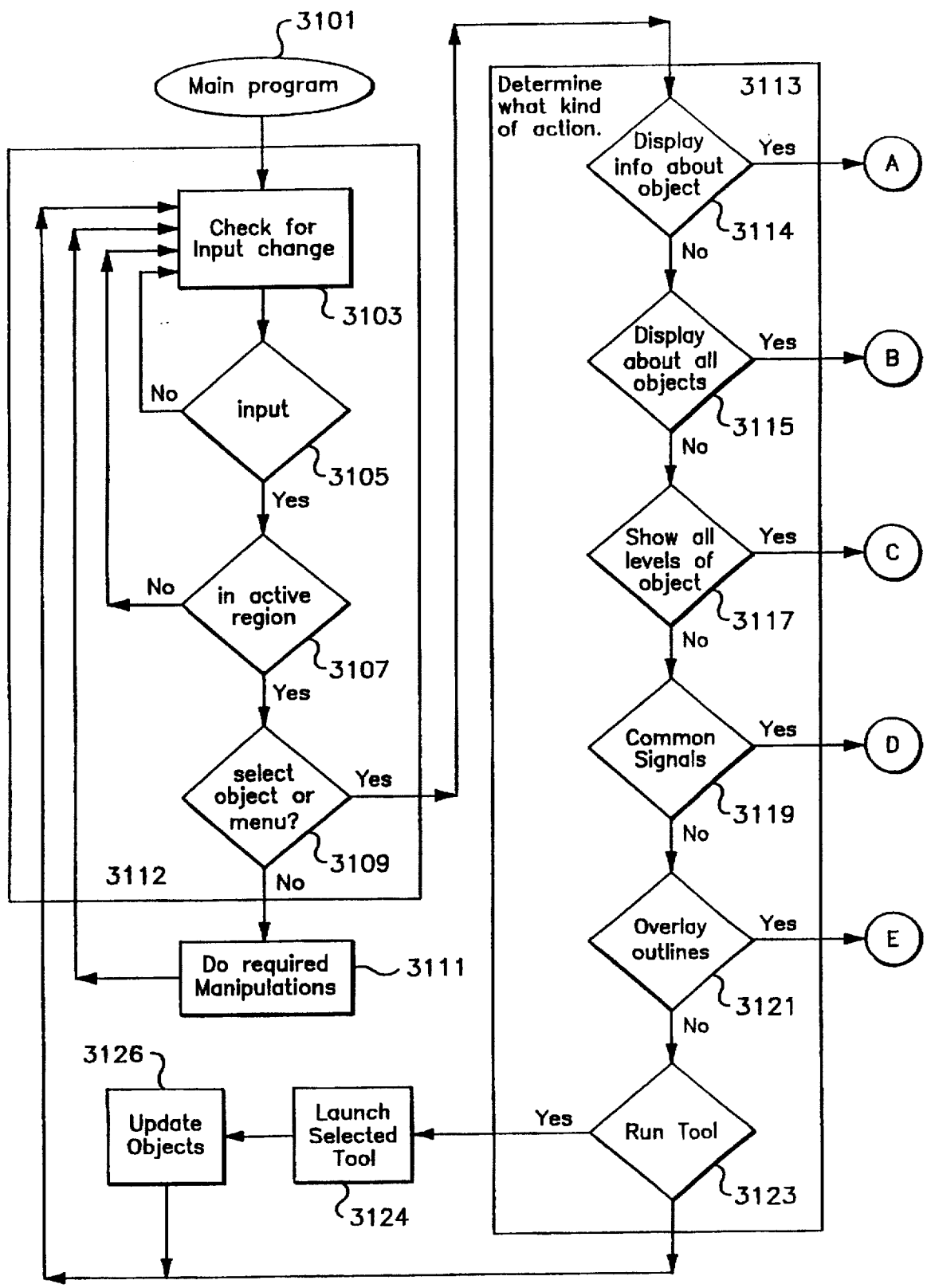
FIG. 31 is a flow chart of the main program of the user interface, according to the invention.

FIG. 31 is a flow chart of the main program of user interface 1606. The first major functional unit 3112 of the main program (comprising blocks 3103, 3105, 3107, and 3109) checks for any user action. Block 3103 determines if a change in location of the pointing device 1610 has occurred or if a key has been depressed on the keyboard 1608. If no change has taken place, i.e., there is no user interface activity, the user interface 1606 cycles back (decision block 3105) to recheck for user action. If there has been an input, user interface 1606 determines if the change has been made to an active region (block 3107) such as an object in a schematic representation or a menu item. Other active regions are the user interface items, such as the scroll bars and the dialog buttons. Alternatively, active regions may belong to one or more other applications running concurrently with the user interface. If it is determined that the active region belongs to an object or menu corresponding to one or more functional units of the user interface system of the inventive ECAD system (decision block 3109), the user interface proceeds to determine what kind of action is required (block 3113). If the input requested some other form of activity, then those actions are executed (block 3111) prior to checking for more input.

The user interface 2401 of the present invention comprises the following features: display all information about a selected object, display a piece of information about all selected objects, indicate where a selected object appears in all of the representations on the screen, indicate the common signals in multiple representations currently on the screen, overlay outline of higher level objects onto lower level design abstractions, and run any of the numerous tools available at a particular stabe in the design process. The determination which of these activities have been requested is performed in decision blocks 3114, 3115, 3117, 3119, 3121, and 3123, respectively.

If it is determined that a tool is to be executed (step 3123), then the tool is launched (e.g., processing with that tool is commenced) (step 3123). At the conclusion of the processing with the tool, all pieces of information created or destroyed by that tool are updated (step 3126) by refreshing the database to make those pieces of information created by the too available and to make those pieces of information made obsolete by the execution of the tool unavailable. An example of unavailable information is a piece of information which contains simulation results from a simulation run before a design alteration, thereby making those simulation results obsolete after the design alteration.

Figure 32A:
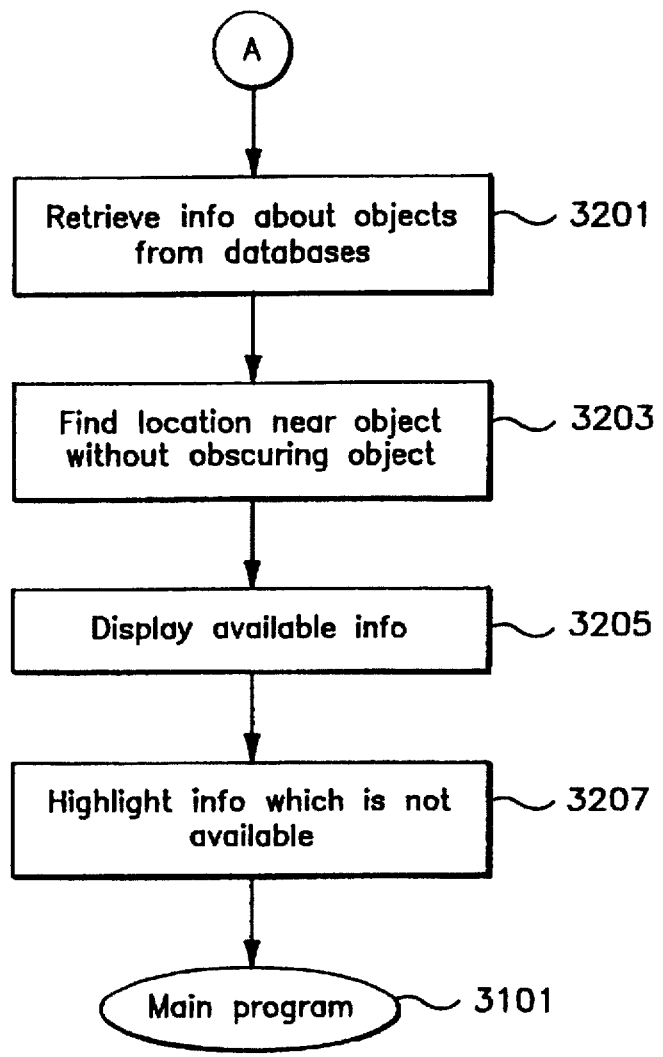
FIGS. 32a–e are flow charts of procedures (sub-routines) called by the user interface of FIG. 31, according to the invention.

If it is determined that the user has requested information about one particular selected object (step 3114), user interface 2401 transfers control to procedure A, a flow chart of which appears in FIG. 32a.

A first step 3201 in procedure A retrieves all the relevant information from the various databases. As discussed above with respect to FIG. 24, various embodiments of the present invention have varying implementations of the databases. Whereas, in one embodiment the retrieve step 3201 retrieves the information from a centralized database, in another embodiment step 3201 retrieves the information from various output files associated with the various tools which may be invoked from user interface 1606. A middle ground between these is also possible, wherein certain pieces of information are stored in a central database and others in output files. The method described in the flow chart of the FIG. 32a is for an example executed by main program 2900 (shown in FIG. 29), which calls upon data retrieve and update module 2906 to execute step 3201 and upon graphics and text rendering module 2902 to execute steps 3205 and 3207.

Following the retrieval of the information (step 3201), the information is formatted display near the object to which it relates to without occluding the object. It is important to the utility of the illustrated preferred embodiment that the user be able to view the representation of a particular design abstraction and to view the information about objects in that representation, simultaneously. Thus, preferably, a high priority is placed on finding a location on the screen that does not obscure any part of the abstraction representation in which the selected object appears. In certain situations this is not possible, (e.g., the representation takes up the entire screen). In those situations, the ECAD system of the present invention places a high value on not obscuring the selected object.

A competing requirement is that the information be displayed immediately adjacent to the selected object. The ECAD system of the present invention strikes a balance between these competing requirements. To determine an appropriate screen location, the EDAC system of the present invention explores alternative screen locations for the information and attempts to maximize the value of a heuristic function. The heuristic function contains a strong negative to overlaying and occluding the object, a less strong negative value for overlaying other objects in the representation which contains the selected object, and a positive value for nearness to the selected object. The latter value declines proportionally with distance from the object.

Referring again to FIG. 32a following determination of a screen location, the information is displayed (step 3205). In one embodiment the information is displayed in a window, which is "popped-up" at the location. In an alternative embodiment, the information is "transparent", e.g., if a circuit is being displayed, the elements and signal lines of the circuit appear underneath the text. If some requested piece of information is not available, this is indicated, e.g., by shading the location on the screen where the piece of unavailable information would have been displayed had it been available (step 3207).

Figure 32B:
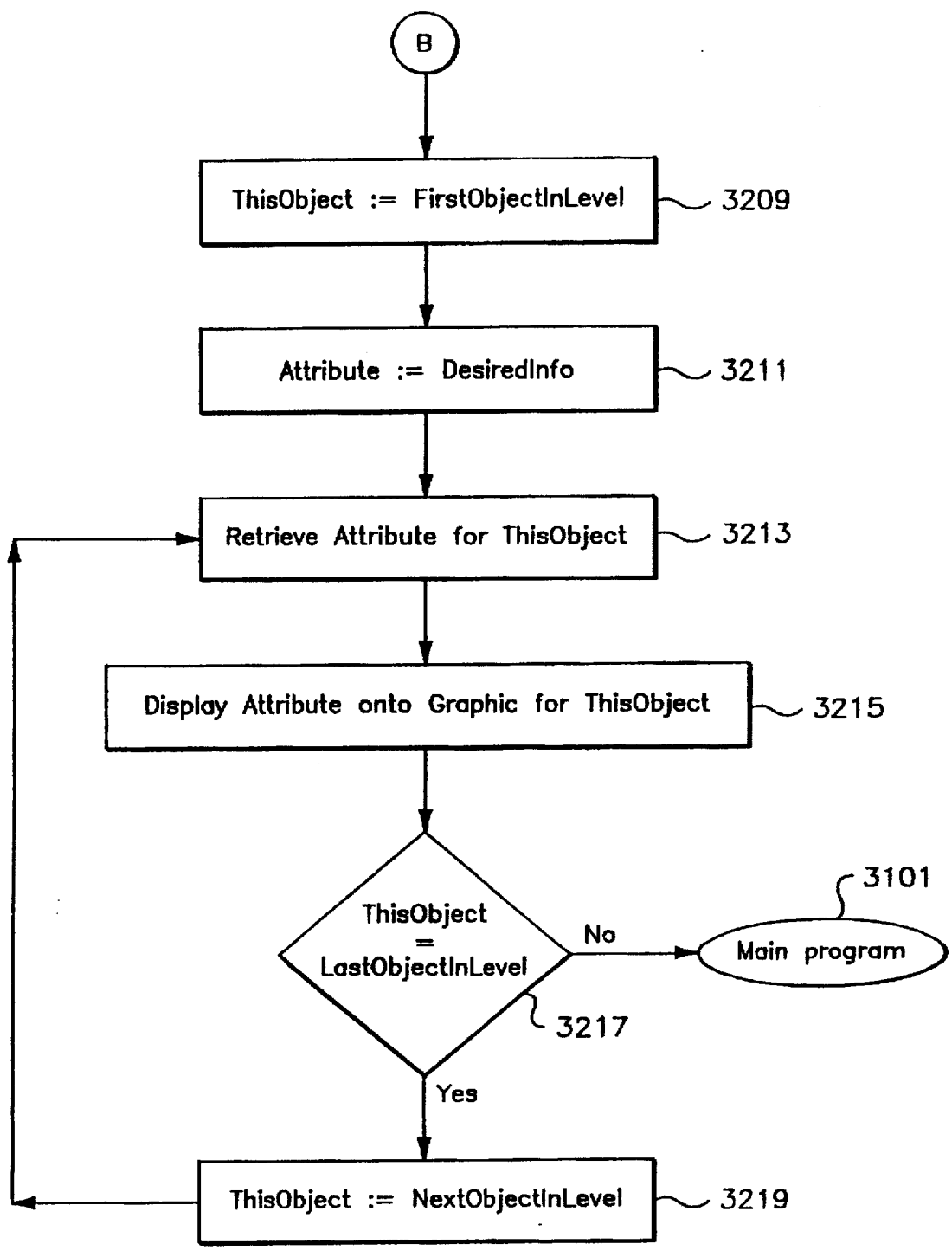

If the requested action is to display a piece of information regarding all objects in a particular representation, a decision step 3115, procedure B, shown in FIG. 32b is executed. The method shown in the flow chart of FIG. 32b is, for example, executed by the main program 2900 shown in FIG. 29, which calls upon data retrieve and update module 2906 to execute step 3213 and graphics and text rendering module 2902 to execute step 3215. Again, with reference to FIG. 32b, procedure B loops over all of the objects in the representation. Alternatively, the user (designer) may select a set of objects for which it is desired to display a piece of information. In this case, procedure B loops over all of the objects. The iteration variable is "ThisObject". In a first step 3209, "Thisobject" is assigned to be the first object in the abstraction level of the current representation. If the user has selected a set of objects for which to display a piece of information, "ThisObject" is set to the first object in that set. Next, in a step 3211, the variable "Attribute" is assigned to be the desired piece of information. "Attribute" stands for the retrieval of any piece of information. The information conveyed by setting "Attribute" to a value is sufficient to enable the information retrieval module 2906 to retrieve that piece of information about "ThisObject" from the appropriate location in the databases 2914. The retrieval is executed in step 3213.

Next, in a step 3215, the information is displayed. When it is desired to display information about all of the displayed objects, the information is preferably displayed directly onto the schematic representation of the object. This is shown in FIGS. 18 and 28b. If the current object ("This Object") is the last object in the list of objects (all objects in a level or set of selected objects), then the loop is terminated and control is returned to the main program at a step 3101. Otherwise, "ThisObject" is set to the next object in the list of objects, and the loop is repeated (e.g., steps 3219, 3213, et seq.).

In a step 3117, it is determined whether the requested action is to indicate all levels of a selected object (see, e.g., 2705 of FIG. 26), procedure C is executed. FIG. 32 is a flow chart of procedure C, which includes two sub-procedures—namely "Highlight Ancestor" (steps 3224, et seq.) and "Highlight Progeny" (steps 3232, et seq.). The general flow of procedure C is to first highlight all ancestors in a step 3221, then to highlight all progeny in a step 3223.

The "Highlight Ancestor" and "Highlight Progeny" procedures are recursive tree-traversal procedures, and thus call themselves to highlight the ancestors of the most immediate ancestor, and the progeny of the children of the object, in steps 3230 and 3240, respectively. The "Highlight Ancestor" recursion terminates when the "Root" object is encountered, and the "Highlight Progeny" recursion is terminated after the "Leaf" objects are encountered (i.e., the progeny of a leaf node is NIL), in steps 3227 and 3235, respectively.

For the "HIghlight Ancestor" procedure, in a step 3225, the variable "Object" is initially set to be the immediate ancestor of the object for which the procedure was called. In the "Highlight Progeny" procedure, in a step 3233, the variable "ObjectList" is set to the progeny of the object for which the procedure was called. The "Highlight Progeny" procedure is shown for the case where there are potentially more than one child object for each object, which will often be the case. Thus, the "Highlight Progeny" procedure includes a loop function 3241, which loops (repeats) over all of the objects which are the immediate progeny of the current object. It is also possible that an object would have more than one parent. In an embodiment which allows for such cases of multiple parents of an object, a similar (e.g., to 3241) loop (not shown) would be present in the "Highlight Ancestor" procedure.

In steps 3229 and 3237, it is determined whether the object (which is the ancestor of the calling object in the case of "Highlight Ancestor", or which is in the list of progeny of the calling object in the case of "Highlight Progeny") is on the screen. If the object does not appear on the screen, the procedures call themselves, respectively, and thus continue the recursion. If the object is on the screen, the object is highlighted, as shown in steps 3231 and 3239, respectively.

The highlighting of an object may take several forms. For example, the entire object can be highlighted by displaying it in the same color as the originally selected object. Or, both objects (i.e., the originally selected object and its ancestor or progeny) can be made to flash. Or, only a portion of the object can be caused to change shading, to indicate that the selected object makes up a portion of, but not the entire, higher-level object (see, e.g., 2705 in FIG. 26).

After the ancestors and progeny of the selected object have been highlighted, procedure C transfers control back to the main program at step 3101.

The procedure of FIG. 32a is, for example, executed by main program 2900, shown in FIG. 29. Main program 2900 further calls upon graphics and text rendering module 2902 to execute the steps 3231 and 3239.

Figure 32C:
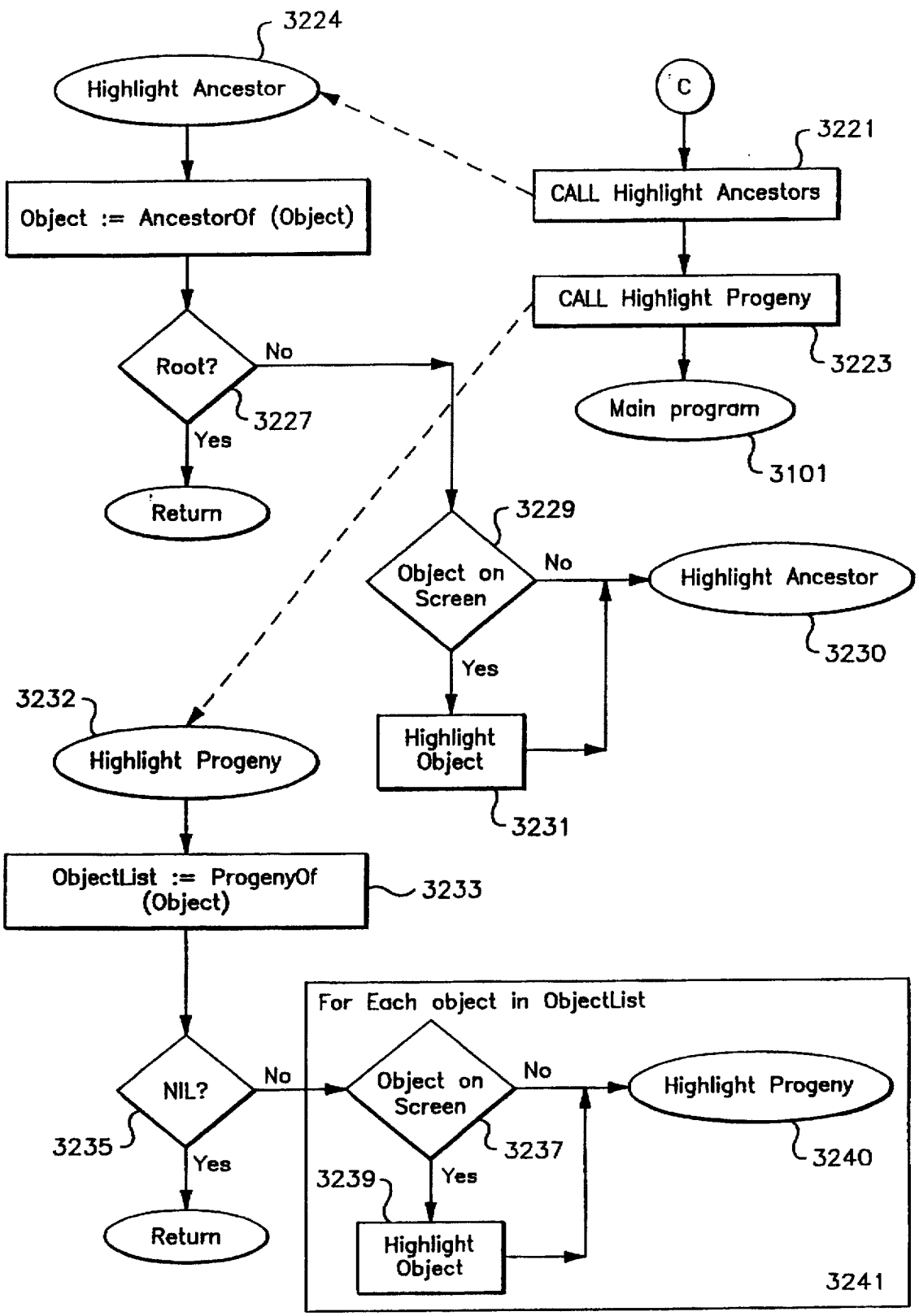
Figure 32D:
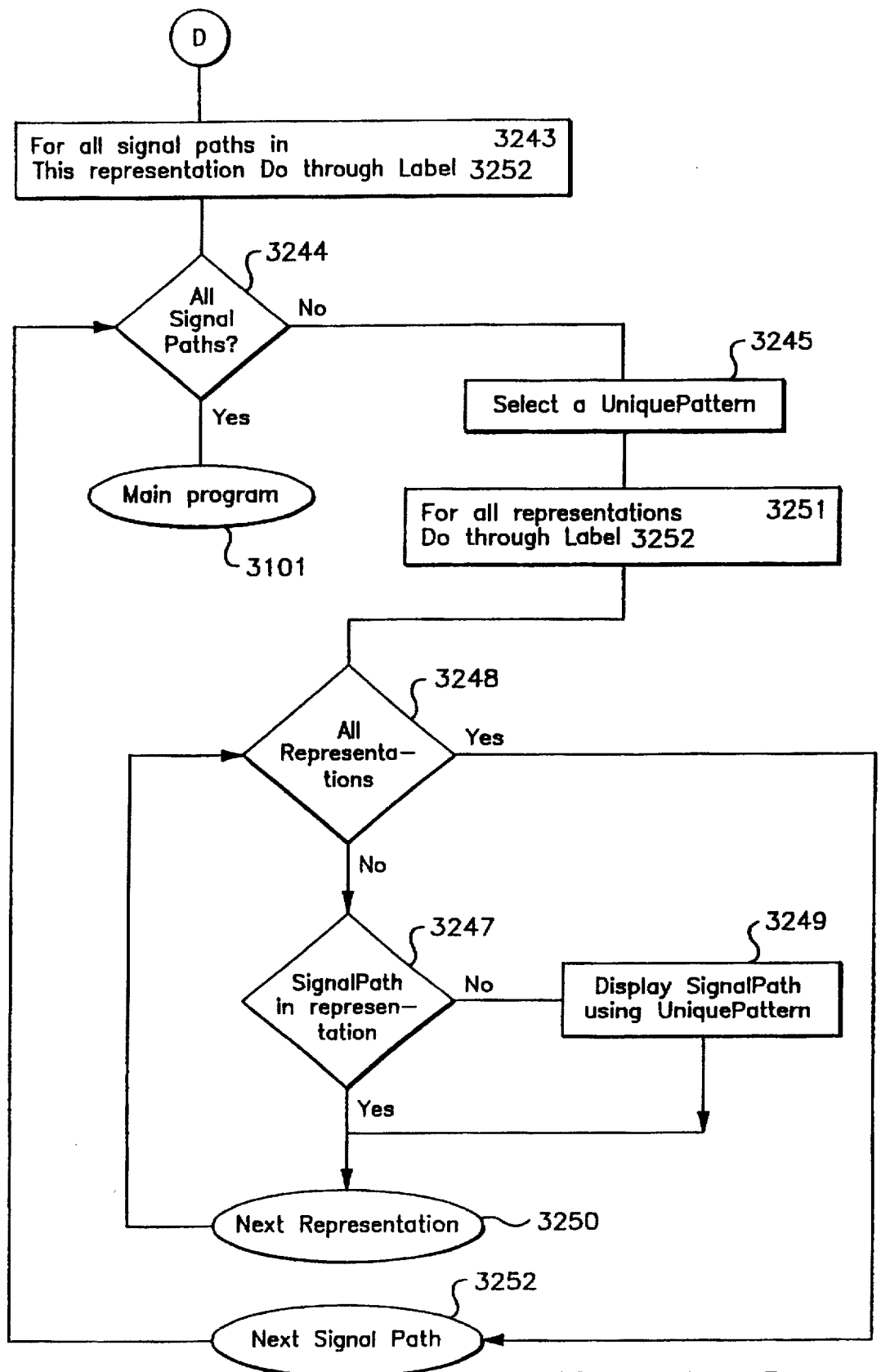

In a step 3119, it is determined whether the desired action is to display common signal paths (see, e.g., FIG. 26). If so, procedure D is called. Procedure D is shown in FIG. 32c. Procedure D loops over all of the signal pates shown in the current representation. Alternatively, if only certain signal paths are of interest, procedure D loops only those paths.

In a preliminary step 3245, a unique pattern is selected by which to display the signal path. In this manner, each displayed signal path will have a unique pattern associated therewith, and that pattern will be used to display all occurrences of the signal path.

In a step 3251, the procedure loops over all of the representations of the design being displayed on the display device (106). As determined in a step 3247, if the signal path currently being processed in the loop 3243 is in the representation which currently is the loop variable for loop 3251, then in a step 3249 that signal path in that representation is displayed using the unique pattern for that signal path.

Once all of the signal paths have been processed, control is returned to the main program at location 3101.

The procedure of FIG. 32c is executed, for example, by the main program 2900. The main program 2900 further calls upon the graphics and text rendering module 2902 to execute the step 3249.

In a step 3121, it is determined whether the desired action is to overlay outlines. If so, Procedure E, shown in FIG. 32e is executed.

In a step 3253, all of the objects for which an overlay is desired are looped over. In a step 3255, for each such object, the immediate ancestor of that object is located. It is determined in a step 3257 whether that ancestor has already been overlaid onto the current representation and, if not, in a step 3259 an outline is found around all of the progeny of the ancestor in the current representation. In a step 3261, the outline is displayed, and (optionally) the area inside the outline is highlighted. Next, in a step 3263, the loop continues with the next object in the current representation. After all of the steps have been processed, the procedure returns to the main program at step 3101.

Figure 32E:
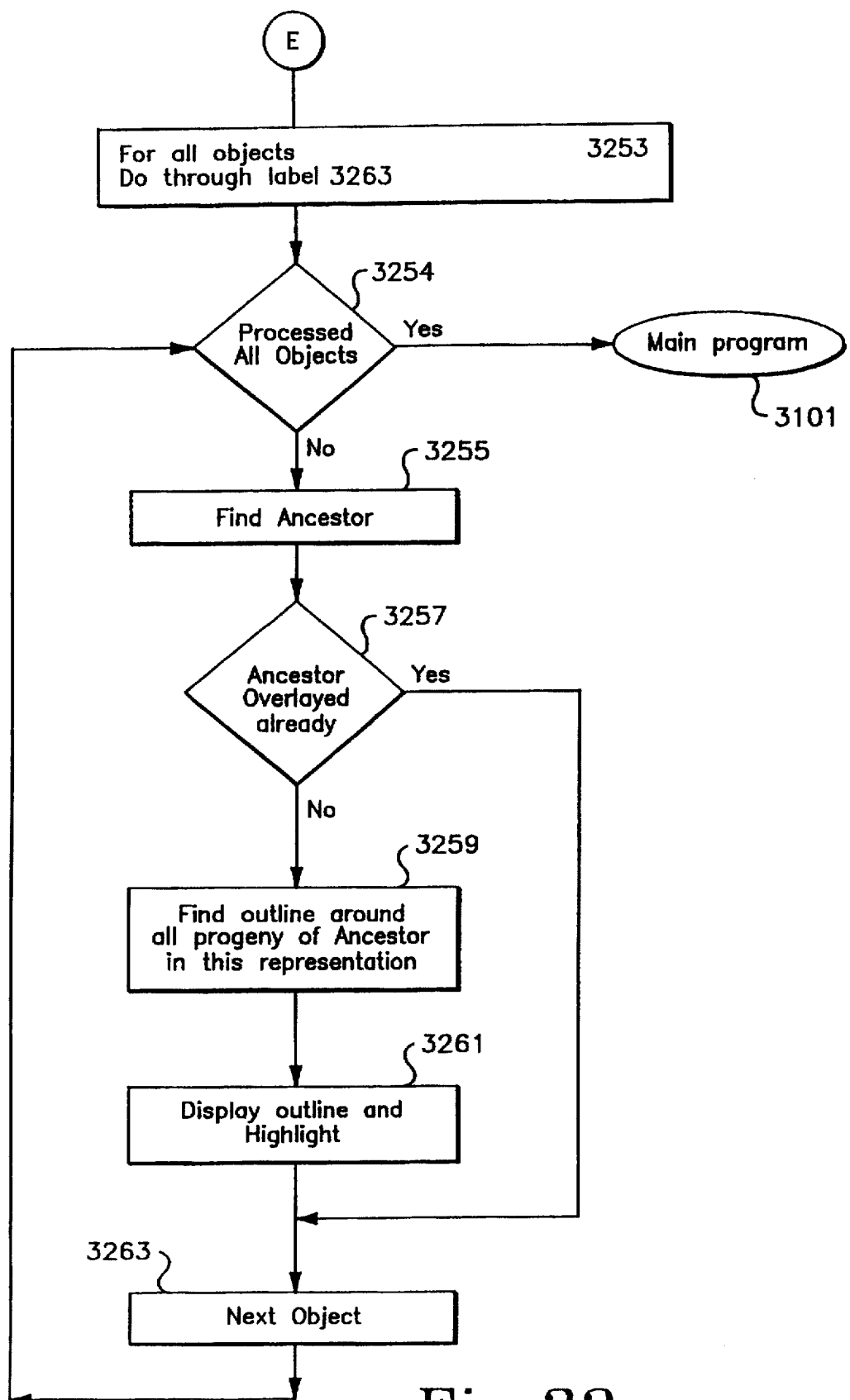

The procedure of FIG. 32e is executed by the main program 2900 shown in FIG. 29. The main program 2900 calls upon module 2902 to execute the step 3261.

The above-described preferred embodiment of the invention provides a system for interactive design and simulation of an electronic circuit (or device, or system), which allows the user to design the circuit using graphical entry of information and/or design changes, and to view full or partial simulation and design results simultaneously on a single display (e.g., 1606).

Top-Down Design Methodology

In general, the system design of a chip (or other complex electronic system) requires that a number of milestones be completed during the design process. Some of these milestones are:

a) Architectural definition and design completion
b) Behavior definition and design completion
c) Functional definition and design completion
d) Logic definition and design completion
e) Timing definition and design completion
f) Physical definition and design completion (area, topology, floorplanning routing)
g) Power definition and design completion
h) Test definition and design completion
i) Package definition and design completion Many of the tasks involved in meeting these milestones are inter-dependent. To accomplish them it is necessary to iterate among them. Trade-offs among the various definitions need to be done against some of the design goals and design constraints.

It is an object of the present invention to provide a technique for top-down design which achieves convergence of all the design tasks associated with meeting the above design milestones to meet design goals, constraints and specifications.

Current practice is to achieve the various design milestones a) through i) iteratively (i.e., by trial and error) with little or no direct information about the impact of the method used to achieve one milestone on the achievement of subsequent milestones. This "hit-or-miss" approach becomes extremely time consuming as system complexity increases.

According to the invention, a matrix of project milestones versus hierarchical level of design is created, thereby creating an array of hierarchically-related compound milestones. Completion criteria are defined for each entry in the matrix. Assuming that project-related milestones (project phases) progress from left-to-right across the matrix, and that the highest hierarchical levels are at the top of the matrix and progress downward, the inventive technique seeks to achieve the compound milestones in the matrix generally from top-left to bottom-right in a monotonic, unidirectional fashion using continuous refinement. Single level or multi-level estimators (predictors) are used to indicate the direction of progress.

In a preferred embodiment of the present invention, levels of top-down design abstraction are mapped to stages of design development as shown in FIG. 33a. The horizontal rows in matrix 3301 represent various stages of the design process, and the vertical columns represent levels of design abstraction. Each matrix element corresponds to a milestone which must be completed in the progression from the system-level conceptualization of a design to the culmination of the design process with the verification of the lowest level of design abstraction.

The matrix 3301 is a generalized milestone matrix. All design processes (levels) have the six design stages 3313, 3315, 3317, 3319, 3321, and 3323 in common. The manifestation of the stages varies from discipline to discipline, but the fundamentals of the stages are the same across all disciplines.

Similarly, the top-down design methodology is common to most (if not all) design disciplines and applicable to most (if not all) design projects. Top-down design is characterized by the division of the solution to a problem into increasingly detailed, but smaller and therefore more manageable, sub-solutions. In FIG. 33a, divisions are mapped onto abstraction levels 3305, 3306, 3309 and 3311. Because matrix 3301 is a generic matrix, no discipline-specific labels have been given to the columns. Each column represents a refinement over the column to its immediate left.

FIG. 33b shows a milestone matrix 3325 for an ASIC design system. Columns 3329, 3331 and 3333 all represent three different levels of system level abstraction. System level abstraction is the block diagram description of the system. Columns 3335 and 3337 represent different levels of behavior/architectural level abstraction. In the behavioral/ architectural level, some interconnections between blocks are defined and the blocks are given some functional definition. Columns 3339 and 3341 represent different lower-level Micro-architecture levels of abstraction. Micro-architecture refers to the RT level of abstraction. Column 3343 represents logic level abstraction. Logic level is typically the same as gate level.

Rows 3345 through 3355 represent the conceptual stage, the specification stage, the feasibility analysis stage, the design stage, the implementation stage, and the verification stage, respectively.

Each matrix element (matrix elements are referred to herein by an x,y coordinate composed of the reference numerals of their associated row and column in the matrix) represent a milestone which must be completed. The simultaneous satisfaction of the completion criteria for of all milestones in the matrix indicates the completion of the system design.

Associated with the milestones in the various matrix elements are transitions which cause the completion of adjacent milestones.

The transitions are enabled when the source milestone is completed.

For example, matrix element (3345, 3329) represents the System Block Diagram milestone. Upon completion of the milestone, the user interface (described below with respect to FIG. 38) indicates that the milestone has been completed by shading a representation of the matrix element associated with the milestone on an icon of the matrix.

Definitions for Milestone Matrix Example (ASIC Design)

FIG. 33b illustrates the milestone matrix in the context of an Integrated Circuit Design. The following section defines the various stages of design development and their corresponding milestones. Traversing from left to right in each row (each stage), a given matrix element (milestone) is always a refinement of the matrix element which is to the left of the given matrix element. For example, in the first row, the first element is the system block diagram, which is a very abstract description of the system in terms of blocks. The element to its right, the architectural and functional description milestone, represents a first-level refinement of the high-level system block diagram into a more detailed form. Traversing from top to bottom in a column, each successive milestone represents a further step towards project "completeness".

Project Stage Definitions:
Conceptual stage (3345):

At the completion of the conceptual stage a system block diagram has been defined. It has been given an initial partitioning with some definition as to the behavior of each block, both in terms of inputs and outputs and in terms of behavior code. Furthermore, the blocks and ports have been given names and some attributes and decisions have been made on what will be implemented in memory and what will be implemented as logic. Finally, the decision has been made as to which elements can be reused from prior designs and which should be developed from the ground up.

Specification stage (3347):

At the completion of the Specification stage, the blocks which make up the system have been identified and given functional specification. Furthermore, the system constraints as well as some of the logic that the developer should use to implement the system have been specified.

Feasibility stage (3349):

The Feasibility stage uses estimator tools to determine whether the concepts developed in the conceptual stage can be implemented using the specification which was defined in the specification stage. At the end of the feasibility stage, the design feasibility has been examined at all levels of design abstraction and certain optimizations and "what-if" analysis tradeoffs have been conducted. The result is a specification which has been deemed feasible. The advantage of employing a rigorous feasibility check at a high-level of abstraction at an early stage of design development is that it avoids pursuing designs that will never work.

Implementation stage (3353):

In this stage, the design is reduced to practice. At the completion of this stage, there is a (hopefully) working system. The following stage, verification, is a check to make sure that the matrix of milestone operated as designed. If the matrix of milestones can be operated with 100% confidence, the verification stage is not necessary. However, while that is a desirable goal, the requirement for having system that have been rigorously tested makes it equally desirable to execute the verification stage.

Verification stage (3355):

In the verification stage, all aspects of the working system are tested and verified. Upon completion of this stage, all project activities (excluding production) are complete.

Milestone Definitions:

NOTE: Milestones elements (ME's) are identified by their stage/level coordinates in FIG. 33b (e.g., ME(3347, 3339) is the Timing, Area and Power goals milestone).

ME(3345, 3329): System Diagram

In this milestone the developer creates an initial conceptual design of the system. It is a pictorial description of the system components in terms of blocks which have some function. In an example from computer systems, the system block diagram may contain a CPU, I/O units, a memory, memory controller, and a bus.

ME(3345, 3331): Architecture and Function

Function refers to that each block diagram is assigned a function and architecture means that the blocks are given some ports for communication with other blocks and with units external to the design.

ME(3345, 3333): Functional Partitioning and Chip Partitioning.

Create an initial partitioning of the system block diagrams. Using the design of a computer system as an example, the initial partitioning the system may be based upon a decision as to which blocks will be implemented in logic and which will be implemented as memory modules (e.g. ROM, EPROMS, FPGA). The system block diagram is refined into sub-component blocks. An example of chip partitioning could be a decision that certain of the blocks will be developed as ASICs (Application Specific Integrated Circuits) and standard modules will be used for certain other blocks.

ME(3345, 3335): Partition into logic and memory.

Further refinement of the block diagram. It is a partitioning into what is logic and what is memory.

ME(3345, 3337): Preliminary Functional System Vectors (Test Bench)

The relationship between inputs and outputs. This milestone is a functional definition of the system in terms of input and output, i.e., given a particular input the system should produce a corresponding output. An example is from MPEG (an industry standard for digital video compression and manipulation) wherein input definition would be a video image and the output another video image which would be the result of the manipulations done by the system.

ME(3345, 3339): Preliminary RTL Description:

In this milestone each block, either from the system block diagram, or from the further refinements from columns 3331 through 3337, is given a behavioral description in a behavioral description language (e.g. VHDL) defining the functional behavior of the block.

ME(3345, 3341): Entity/Port/Interface Definition:

Assignment of names to the blocks and ports. Furthermore, certain attributes are assigned to the ports. For example, a given port may be given the name "Port A" and the definition that it is a 16-bit integer port. In other words, the block diagram is given some properties.

ME(3345, 3343):Existing modules or designs:

For each block decisions are made on whether to import an existing design or whether to design it from scratch.

ME(3347, 3329): Block definition and Behavioral Description:

A more detailed description of the behavior of the blocks that were defined in milestone (3345, 3329). For example, if the developer is dealing with an MPEG system the block definition may be a few lines of MPEG code defining how pixels are to be manipulated by the blocks. However, this description does not achieve the detail on how to do that manipulation in terms of logic.

ME(3347, 3331): Block functional specification (behavioral):

A detailed specification of the system behavior in functional terms. This is the reference point to which the design must conform in terms of function.

ME(3347, 3333): System Timing goals, constraints.

In this milestone the developer definition of the system level goals for timing, circuit area and power consumption for the blocks defined in the block diagram. Furthermore, in this milestone boundary conditions are given for each block and interface signal.

ME(3347, 3335): System data and control flow specifications:

This milestone is a break down of data and control and control signals for all the blocks in the block diagram. It defines the flow of data and control signals between the various blocks.

ME(3347, 3337): Number of chips and packages, specification:

This milestone represents the specification of the number of chips used to implement each block. Furthermore, it is a definition of how many packages to be used and the specifications for those packages. An example would be: "chip number 3 includes blocks a, b, and c, and will have 64 pins and will fit into package X." This is a very important milestone in that from the definitions given herein it is possible to estimate the cost of the system.

ME(3347, 3339): Micro-architecture timing, area and power goals:

This milestone is a first specification of the system at the RT level. It is a specification of the goals for timing, area and power. However, being at the specification stage, it is not yet determined whether those goals are achievable (feasible).

ME(3347, 3341): Block RTL specification (simulation), timing v. area specifications:

The completion of this milestone represents that the RT level code has been completed, debugged and is stable. The code is verified as correct be RT level simulation. The timing and area specification for the various elements in the system design is also finalized in this milestone.

ME(3347, 3343): Logic Definition Cost Specification and Critical Path Specification:

One possible transition to this milestone from the block RTL specification milestone is through logic synthesis (however, in the context of this milestone matrix, synthesis is more appropriate at the implementation stage). In this milestone, the developer does a logic definition of the system and a cost specification. This milestone is achievable from the previously completed milestones, because the developer has a good idea about which gates will be used and where they will be used. The logic definition places the specification in context of defining some aspects of the logic which will be used to implement the specification.

ME(3349, 3329): Block definition and Behavioral Description: ASIC Partition

There are many different options for developing a given design. At the extremes of the spectrum of options are, for example, the system will be implemented entirely in ASICs and the system will only use standard products, respectively. The ASIC partitioning milestone defines which blocks will be developed as ASICs and which blocks will be standard products. This decision is important because the degree of integration has an impact on the cost of the final product.

ME(3349, 3331): Board and package size and speed estimation.

This milestone uses estimators to determine whether it is possible to achieve the specified board and package size and speed constraints. The estimators can also be used to determine what packages to be used, what speed to use and how much speed to trade-off for area.

ME(3349, 3333): "What-if"-analysis; system tradeoff analysis:

In the "what-if"-analysis milestone, the developer uses, for example, the architectural exploration tool to determine how various design decisions impact various properties of the system. For example, the introduction of redundant functional units may improve speed but increases both area and cost, while potentially decreasing reliability.

ME(3349, 3335): Board floor planning:

This milestone represents an estimation of the board area used by the design. The term "board" is used here in a broad sense and encompasses, for example, printed circuit boards, multi-chip modules (MCM) and ASICs. An MCM is a module in which ASICs are laid out on a common substrate. By placing the ASICs on a single substrate it is possible to reduce the output driving capacitances, because these were designed to drive at the board level. Thus, having the option of putting the ASICs on a common substrate provides the designer with an additional parameter which may be used in optimizing the design with the goal of satisfying some constraints.

ME(3349, 3337): ASIC cost, size, speed, power feasibility:

In this milestone the developer analyzes the feasibility of all of the ASICs in the system.

ME(3349, 3339): ASICs area, speed, power feasibility:

While the preceding milestone deals with the determination of whether the design on the whole is feasible given the specification of the various ASICs in the design, the present milestone is focused on the feasibility of individual ASICs. Furthermore, the developer uses exploration tools to do what-if-analysis on the design of each ASIC.

ME(3349, 3341): RTL Synthesis-Optimization (estimation only):

The what-if-analysis of the preceding milestones may reveal that there is some problem with the design, e.g., some constraints have not been satisfied. In the RTL Synthesis-Optimization milestone, the developer looks to the preliminary RTL description of the design to find ways to optimize the design so that the constraints will be met in the final design.

ME(3349, 3343): Logic/function/technology feasibility:

In the preceding milestones estimators are run at a high-level of design abstraction. These estimators have been some inaccuracies. For that reason, it is beneficial to estimate the same properties at lower levels of abstraction, where more parameters are defined, to verify the correctness of the results obtained at the higher levels, thereby obtaining a lower level verification of the feasibility of the specification.

ME(3351, 3329): Block definition and Behavior Description: ASIC(s) behavioral design:

The inputs to the Design stage are the block diagrams, the partitioning, the behavioral code, ASICs behavior have been completed and stabilized. These are used in the Design stage to arrive at a completed functional design, which in turn will be used for the global net list generation.

ME(3351, 3331): ASIC(s) RT level design completion:

This milestone represents the completion and stabilization of the RT level design of the ASIC(s).

ME(3351, 3333): System Function Design:

The system functional design milestone is very important in that it represents the conclusion of the functional design of the system. At the conclusion of this milestone all the pieces of the system have been given complete functional descriptions. This functional description can then be used to generate the global net list.

ME(3351, 3335): Global Net list generation:

This is a synthesis step from the functional description of the system. All the blocks for all the components are merged into one system and are interconnected. This is a key milestone in that having a global net list it is possible to simulate and emulate the system.

ME(3351, 3337): System-level emulation, simulation:

Having a completed global net list of the system it is possible to emulate and simulate the design. Emulation is crucial because it enables software developers to begin developing programs for the system before the system has actually been physically implemented. Furthermore, at this milestone it is possible to execute the "test bench" defined in milestone (3345, 3337). At this level additional test may be run. The emulation/simulation may be used for regression testing.

ME(3351, 3339): ASIC re-partitioning (timing):

This milestone represents the beginning of the designing for timing. The prior milestones are directed towards designing for functionality. However, a completed system design must also be designed with timing in mind. In the ASIC partitioning milestone, a partitioning for timing is conducted. The purpose of this repartitioning is to place blocks on the critical path close to each other or even inside the same partitions.

ME(3351, 3341): Critical Path analysis, constraints and design:

At this milestone the developer examines the design at the gate level to do critical path analysis. Further, in this milestone the developer checks how well the critical path satisfies the constraints. The developer may further redesign elements on the critical path to improve the performance of the system.

ME(3351, 3343): Chip Design (area/speed) & test design:

In this milestone, the developer begins designing for testability (design-for-test). Design-for-test signifies that logic is added to the design so that the finished product can be tested.

ME(3353, 3329): Behavioral technology binding:

This milestone represents the completion of binding the behavioral functional description into particular operators.

ME(3353, 3331): RTL technology binding:

At this milestone, specific control elements are assigned to the control logic in the RT level description of the system. Prior to this milestone a given multiplexer used to control the input to a register element may have been described as a 5-to-1 mux, a rather generic term. At this milestone the same 5-to-1 mux may be bound to be, for example, an MUX51H, a non-inverting 5-to-1 mux in the LCA100K/ LEA100K technologies, from the LSI Logic Corp.

ME(3353, 3333): Optimization

In this milestone, the developer does some fine-tuning of the design.

ME(3353, 3335): Synthesis and optimization.

In this milestone, optimization of the circuit is done through a synthesis. This synthesis is conducted without any redefinition of the functionality of the design, i.e., there is no change in the behavioral code or in the RT level code. At this stage and level, the gates are known and the critical path is known. So the synthesis process can be directed to attempt to rebind in such a way as to achieve a little bit better performance on the critical path. This optimization is a fine-tuning of the net list to achieve the goal.

ME(3353, 3337): Final schematics floorplan, placement and timing optimization:

The input to this milestone is the final schematic. Having this schematic enables the ECAD system to do a final floor planning if the system. Also optimization is achieved by placing elements close to each other.

ME(3353, 3339): Chip timing implementation:

The result from the previous milestone is a final chip timing implementation.

ME(3353, 3341): Critical path optimization and layout:

This milestone represents further critical path analysis and layout. At this stage the layout has been created. The critical can depend on wire delays in the layout. Therefore, in this milestone the developer used the layout to optimize the critical path. The completion of the optimization by layout results in the final chip layout.

ME(3353, 3343): Chip(s) layout test generation:

Having a finished chip layout (the sequence of the flip-flops, etc.) and the design for test from the design stage, it is now possible to do test generation, for example for scan testing.

ME(3355, 3329): Block definition and Behavioral Description:

Verification that the system functionality satisfies the goals specified in the specification.

ME(3355, 3331): System constraints:

Verification that the system constraints as defined in the specification are met by the final design.

ME(3355, 3333): System timing:

Verification that the timing goals are met and that timing convergence has been achieved.

ME(3355, 3335): Chip(s) function:

Verification that the functionality of individual ASIC chips meet the specifications and constraints set out in the specification.

ME(3355, 3337): Chip(s) timing constraints:

A verification that the timing constraints placed on the each chip in the design is met.

ME(3355, 3339): Critical Paths:

A final look at the critical paths to determine that there are no critical paths which fail to meet the timing constraints.

ME(3355, 3341): Chip level logic compared to layout polygons:

The final chip level logic is compared to the layout polygons to determine if the polygons correspond as expected to the chip level logic.

ME(3355, 3343): Test coverage:

For each block decisions are made on whether to import an existing or whether to design it from scratch.

The transitions between milestones only allow progression from top to bottom and from left to right. Thus, to work towards the completion of a milestone, the milestone above or to the left must already have been completed. This monotonic progression from the upper left matrix element to the lower right matrix element ensures an orderly progression in the design of the system. Furthermore, the matrix provides the developer with a visual road-map of the design process. Looking at the matrix, the developer can instantly determine which milestones have been completed, which remain and which milestones can be completed next.

Figure 38:
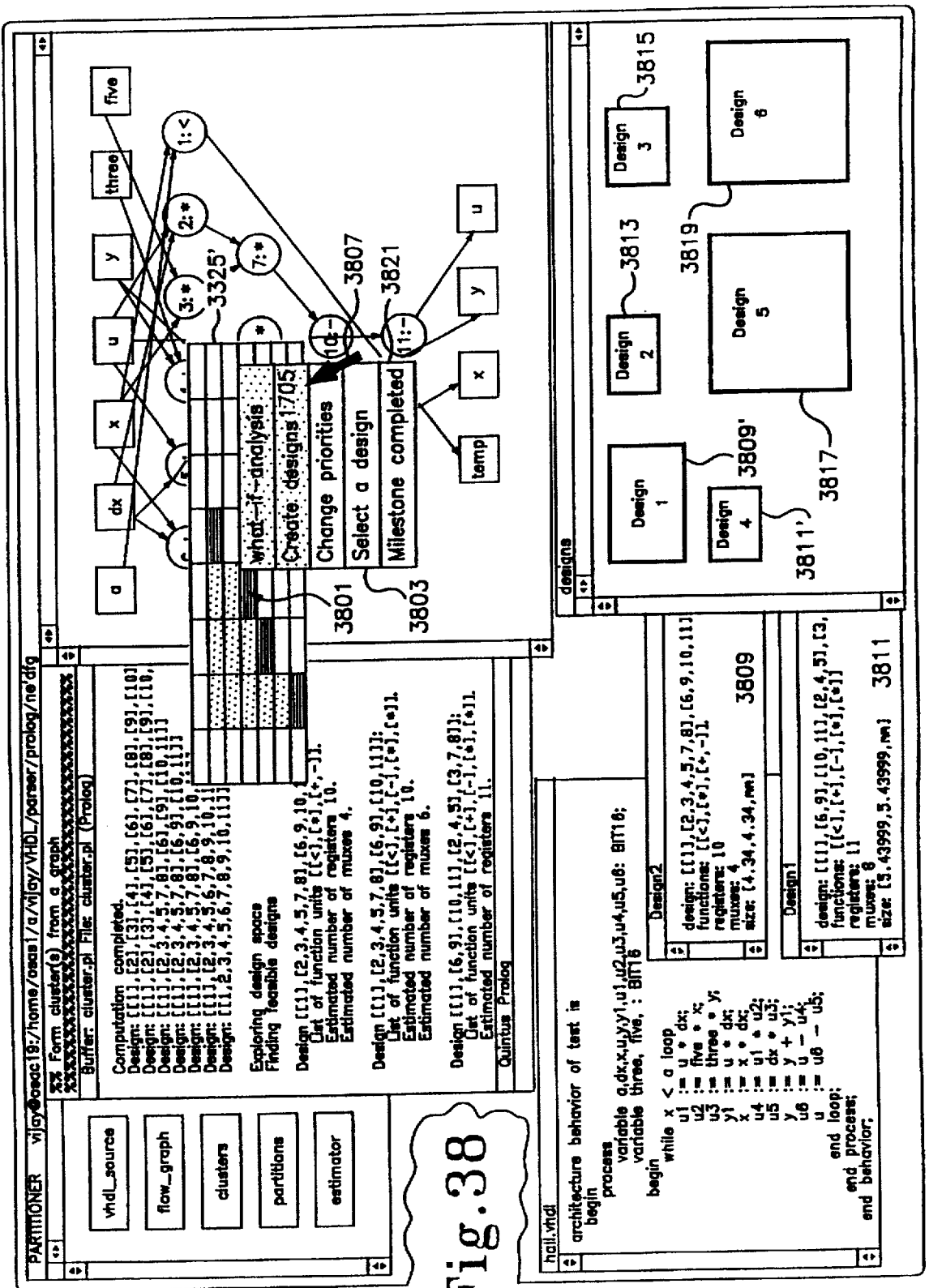
FIG. 38 is an exemplary screen view, according to the invention.

FIG. 38 is a view of an iconic representation 3325' of matrix 3325 displayed on an ECAD system's graphic display device at an instance in the design process (Matrix 3325' is a version of milestone 3325 at a given instance in the development cycle.) This instance in the design process corresponds to the screen illustrated in and discussed in conjunction with FIG. 13. Matrix elements (3345, 3329), (3345, 3331), (3345, 3333), (3347, 3329), (3347, 3331), (3347, 3333), (3349, 3329), (3349, 3331) are highlighted or shaded to indicate that their corresponding milestones have been completed. Matrix elements (3345, 3335), (3347, 3335), (3349, 3333), (3351, 3331), (3351, 3329) are differently highlighted or shaded to show that their corresponding milestones may be worked on next. The developer has selected to work on the milestone corresponding to matrix element (3349, 3333) (the reference numerals refer to FIG.

33b. Matrix element (3349, 3333) is labeled 3801 in FIG. 38: the "What-if-analysis; System tradeoff analysis" milestone.

In the example of FIG. 38, the user of the ECAD system has caused a pop-up menu 3803 associated with milestone 3801 (corresponding to ME(3349,3333), FIG. 33b) to appear on a display unit. The user has further selected one of the menu items in menu 3803, the "Create designs" item 3805, by placing cursor 3807 over that item. The create designs menu item 3805 causes the architectural explorer tool (3431, FIG. 34) to be executed. Thus, in the example of FIG. 38, the selection of menu item 3805 has caused the alternative designs shown in windows 3809 and 3811 to be created. Additionally, several designs not explicitly shown have been created. The designs shown in windows 3809 and 3811, as well as other designs, are shown as items 3809' and 3811' and 3813–3819 in window 3813. By examining the results from architectural explorer tool, the developer may make a trade-of analysis of various designs.

Once satisfied with the results from the what-if-analysis, the developer may indicate the completion of the milestone by selecting "Milestone completed" menu item 3821. For certain milestones the developer uses his/her engineering judgment rather than executing specific tools or programs. For those milestones the associated pop-up menu contains only the "Milestone completed" menu item.

It is possible to consider the matrix of milestones as a sort of state-transition graph. Each state in the graph is the milestones which have been completed. Thus in the example above, the state is the completion of matrix elements (3345, 3335), (3347, 3335), (3349, 3333), (3351, 3331), (3351, 3329). The initial state is that "no milestones have been completed". Each activity which completes a next milestone is a transition in the graph, i.e., causing a transition to a new current state. The transition available from the first state is "complete system block diagram": This state is shown below:

$S_o$ = elements completed: none
transitions available: "complete system block diagram"

The state represented by the example above is shown below:

$S_a$ = elements completed: (3345, 3335), (3347, 3335), (3349, 3333), (3351, 3331), (3351, 3329)
transitions available: "partition logic and memory", "system data and control flow specifications", "what if analysis", "ASIC(s) Behavioral Design", "ASIC(s) RTL Design"

If the developer selects the "what if analysis" action and completes that milestone, the current state becomes:

$S_b$ = elements completed: (3345, 3335), (3347, 3335), (3349, 3333), (3351, 3331), (3351, 3329), (3349, 3333)
transitions available: "partition logic and memory", "system data and control flow specifications", "ASIC(s) Behavioral Design", "ASIC(s)RTL Design"

The large number of possible states precludes discussion of each individually. Completion of certain milestones enables transitions independently of other milestones, whereas, certain other transitions require the completion of more than one milestone.

Thus, the transitions or actions available at any given point in the system design depends upon which milestones have been completed.

Figure 34:
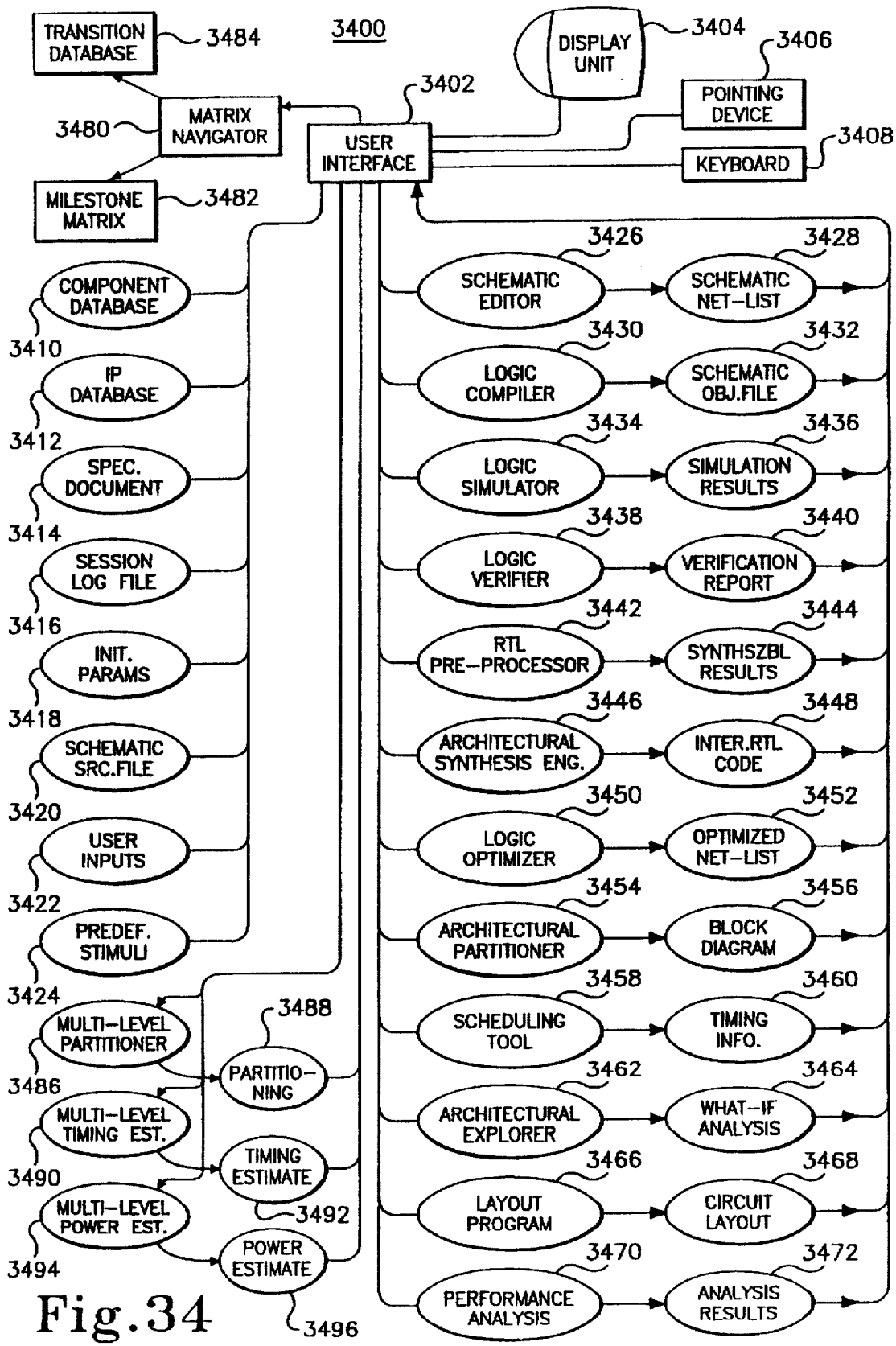
FIG. 34 is a block diagram of software modules (tools) operating in an ECAD system, according to the present invention.

FIG. 34 is a block diagram of an ECAD system 3400 according to the present invention. A user interface 3402 is connected to a display unit 3404, to a keyboard 3408, and to a pointing device 3410. User interface 3402 is further connected to a Milestone Matrix Navigator/Top-Down Enabler 3480. The Matrix Navigator 3480 is functionally connected to a milestone matrix 3482 (e.g., 3325 as shown and described with respect to FIG. 33b). The milestone matrix 3482 contains information about the various milestones in the particular design field. Milestone matrix 3482 also contains information about which milestones have been completed up to a particular point in time in the system development. The Milestone matrix 3480 can be implemented using one of many well-known types of data structures, e.g., as an array of records wherein each record has the fields: title, info, menu and completed_flag.

The Matrix Navigator 3480 is further connected to a transition database 3484 which contains information about the various actions which may be under taken depending on the various combinations of completed milestones. The transition database 3484 may be implemented in one of several methods. For example, in one embodiment, transition database 3484 is a list of transition rules including entries such as:

If matrix element a is completed and matrix element b is completed then enable transition x.

Alternatively, transition database 3484 can be keyed by the state of milestone matrix 3482 and stores the transitions available from the state. In another embodiment, in transition database 3484, only the currently available transitions are stored and this list is amended after the completion of each milestone to include or exclude any transitions available or not available due to the completion of the milestone.

The Matrix Navigator 3480 governs the progress through completion of the milestones of the Milestone Matrix 3482 according to the "rules" (state transition conditions) in the transition database 3484.

User interface 3402 is also connected to multi-level partitioner 3486. Multi-level partitioner 3486 enables a developer to partition a design based upon the information available at any given level. This is described in greater detail hereinbelow with respect to FIG. 35.

User interface 3402 is also connected to multi-level estimators 3490 and 3494. Multi-level timing estimator 3490 provides timing estimates 3492 using the parameters available at any given level of design abstraction. Similarly, multi-level power estimator 3494 provides a developer with an estimate 3496 of power dissipation of a design using the information available at any given level of design abstraction. It will appreciated by one of ordinary skill in the art, especially in light of the discussions hereinbelow, that other types of multi-level estimation capability, (e.g., area estimation) may also be similarly provided.

Resident within the ECAD system 3400 is a software system comprising a number of data structures and programs. Upon initial start-up, a schematic editor 3428 reads in a series of initialization parameters 3412 which set default mode selections and various configuration parameters. Said schematic editor may be the LSED editor by LSI Logic Corp. The schematic editor 3428 accepts input from a schematic source file 3420, displays its graphical representation on the ECAD system's graphical display unit 3404, and produces a schematic net-list 3428. If there is no existing schematic source file, it is assumed that a new schematic is being entered, and a blank entry sheet is presented on the display screen and a new, blank schematic source file 3420 and net-list 3428 are created. The schematic editor operates according to commands coming from user inputs 3422. Every command entered is recorded in a session log file 3416 such that the editor may undo any number of commands entered by the user. Some commands from the user inputs 3422 will be requested to place and interconnect schematic symbols on the display screen. To accomplish this, the schematic editor looks up the requested component(s) in a component database 3410 and retrieves graphical symbol representations of the requested component(s) contained therein. As the user enters the schematic diagram on the screen, the schematic editor creates a net list and invokes the function of a logic compiler 3430 to produce a schematic object file 3432.

A logic simulator 3434 operates on the schematic object file 3432 and component simulation parameters contained in the component database 3410 according to a set of initial conditions and/or signal conditions specified as pre-defined stimuli 3424.

For standalone operations, simulator 3434 may also operate off of user inputs 3422. The logic simulator may be the LSIM logic simulator produced by LSI Logic Corp.

A logic verifier 3438, performs design-rule checking of the schematic diagram captured by schematic editor 3426 by checking the components and their interconnections contained in the schematic object file 3432 against component interconnection and loading rules stored in the component database 3410, and produced a verification report 3440.

A layout program 3466 produces a layout 3468 by placing components and routing their interconnections on a semiconductor chip. After completion of the layout, the schematic source file(s) 3420, schematic net-list 3428, and schematic object file(s) 3432 are updated with information about placement location, placement orientation, and placement induced electrical characteristics.

Other tools and data structures (described in greater detail elsewhere herein) in an ECAD system according to the present invention include (but are not limited to):

- an architectural synthesis engine 3446 producing intermediate RTL code 3448;
- a logic optimizer 3450 producing an optimized net-list 3452;
- an architectural partitioner 3454 producing (a data representation of) an architectural block diagram 3456;
- a scheduling tool (scheduler) 3458 for assigning functions to particular clock cycle time slots, and producing timing information 3460 for subsequent binding;
- an architectural explorer 3462 for iteratively generating trial architectural designs, and yielding a "what-if" analysis 3464 to permit a user to select from a number of trial architectures; and
- performance analysis tools 3470 for simulating and estimating the performance of various aspects of the design (e.g., power consumption, speed, size, timing, etc.), and producing performance analysis results 3472.

Many of the tools and output files listed above are described in greater detail in patent application, Ser. No. 07/507,201 filed Apr. 6, 1990, (now U.S. Pat. No. 5,222,030; issued Jun. 22, 1993), incorporated by reference herein.

CONSTRAINT DRIVEN PARTITIONING OF BEHAVIORAL DESCRIPTIONS

A significant part of the design of an electronic system is the partitioning of the system into two or more sub-functions which are then each considered separately. The motivation for design partitioning is similar from the point of view of both the human system designer and the computer aided design (design synthesis) system. From the human system designer's point of view, it is convenient to break up a system into smaller, more tractable pieces so that it is not necessary to consider the overwhelming set of design choices to be made for the entire system design all at once. Similarly, for computer-based design synthesis systems, the optimization (or even completion) of the computational tasks associated with synthesis of a large design can rapidly become an unwieldy proposition. The computational complexity is dramatically reduced by partitioning the system design into a number of smaller design blocks associated with correspondingly smaller, isolated, computational problems.

At early design stages (e.g., at the system, behavioral, or algorithmic level of design) design partitioning involves architectural choices. The results to be achieved by the system being designed are known, but architectural partitioning choices determine the method and structure by which the results will be achieved. These architectural choices can have a dramatic impact on circuit complexity, bus width, chip area, number of I/O pins required, power dissipation, package selection, system cost, system timing, technology selection, etc.. Often, there are design constraints associated with many of these areas. For example, in the design of a portable, battery-operated system, constraints on size, cost, and power consumption are of paramount concern. Since architectural choices (made in partitioning the design) can impact these areas, it is important to ensure that any architectural choices made do not violate the constraints of the design. Unfortunately, many design constraints (such as those mentioned above) are usually specified at a relatively low level (e.g., maximum power dissipation, size, target product cost, etc.) for which high-level architectural impact is difficult to determine without a great deal of insight into the rest of the (lower level) design process.

In many cases, the impact of architectural choices with respect to low-level design parameters (e.g., package type, cost, size, power, etc..) does not become evident until a considerable amount of effort has been expended in expanding (completing) the design according to the selected architecture. This results in a long iterative process whereby selection of an architectural partitioning scheme from one of several possible schemes is accomplished by "designing" the system according to each scheme separately, examining the results for compliance with design constraints, and selecting the architectural partitioning scheme which best meets the constraints. This iterative process, whether manual or automated, can be very time-consuming, as it involves a significant amount of "wasted" design effort on the architectural partitioning schemes which are not selected.

Clearly, a method of rapidly assessing or estimating the low-level impact of high-level architectural choices would have significant benefit in avoiding needless lengthy exploration of multiple architectural alternatives. Such a method would permit a system designer to make intelligent, informed high-level (architectural) design choices and to perform feasibility checks on various architectural partitioning schemes without going through time consuming (lower level) RTL synthesis and simulation.

In present systems, automated partitioning is provided primarily as an aid to floorplanning, layout, and signal routing, and operates at a net-list level, late in the design process. At this point in the design process, architectural choices and functional partitioning have long been completed and fixed, usually in a manual process by a system designer. If, for example, floorplanning and layout functions determine that too much chip area is required by the system design, the system designer's only choice is to return to the upper levels of design (e.g., behavioral or algorithmic), to make new architectural choices, and to try again.

So-called "graph" partitioning is a well-defined approach to automated floorplanning and layout, and a number of graph partitioning schemes have been applied to net-list partitioning. Other methods, such as module clustering and the Kernighan-Linn min-cut algorithm (and subsequent refinements thereof) are also very popular for use in placement and layout tools.

Most present partitioning techniques are directed to reducing the number of nets that cross from one partition to another, under some area constraints, thereby substantially isolating partitioned blocks from one another and simplifying the signal routing process.

These techniques, however, do not take into consideration other constraints such as timing, power, package cost, and testability. Moreover, partitioning at the early stages of design (e.g., system or behavioral) is usually accomplished manually by the system designer by defining the different architectural modules in the system. If the architectural choices are not well made, some modules may "grow" disproportionately during the ensuing design process (possibly due to poor distribution of function), some modules may turn out to be overly "connected" (possibly due to poor isolation of function) or it may turn out that the original partitioning fails to meet other design constraints such as chip area or power dissipation (possibly due to poor choice of method and structure).

Furthermore, as logic synthesis tools improve, they tend to use and store greater amounts of information about each synthesized architectural block, thereby decreasing the maximum complexity of the largest architectural blocks that they can handle. This means that what the designer views as a "module" can easily be too complex for a logic synthesis tool. In accommodating and (as described above) the process of further partitioning the design manually can be either highly time-consuming (if many alternatives are investigated) or far from optimal (if poor choices are made).

According to the invention, automated high-level partitioning is performed as an integral part of the top-down design process. As a part of this process, a high-level description is partitioned and synthesized to meet the low-level designer-imposed constraints such as area, timing, power, etc..

It is well understood by those of ordinary skill in the art that different constraints can be interdependent, and that meeting one constraint (e.g., chip area) may violate another (e.g., speed). For any given design description and set of constraints, then, it is highly likely that a good architectural partitioning scheme cannot be achieved in a single computation cycle (pass). According to the invention, specific priorities set during the design and behavioral synthesis phases guide the partitioning process.

As an example, consider a case where the primary constraints are that the design must fit in a single chip and specific timing requirements must be met. In this case, minimization of the number of interconnections between architectural blocks (e.g., min-cut) is not a primary goal. However, interconnection complexity cannot be completely ignored because of on-chip routing problems which will arise if interconnection complexity becomes too great. On the other hand, it the design is to be partitioned into several chips then limitations on I/O pin count can cause interconnection complexity between the chips to have a higher priority. A generic set of tools aids the designer in evaluating the impact of different architectural choices to arrive at a suitable architectural partitioning scheme.

Given a high-level description and a set of constraints, the inventive technique synthesizes the blocks that make up the design (from the high-level description) and organizes (or distributes them) into multiple partitions. According to the invention, this is accomplished via iterative refinement to arrive at a partitioning scheme that meets the constraints (assuming that they can be met).

In a general sense, the process makes a first attempt at partitioning based on certain intrinsic information contained in the high level description of the design. If insufficient information is available at the high level in the design hierarchy, the process looks at lower levels (blocks) in the design hierarchy to obtain further information, and recursively attempts to make a valid partitioning. This technique of making initial estimations at a high level, and recursively evaluating lower level information to validate the estimations, is applicable to partitioning (as described in this section of the discussion), estimating timing (discussed hereinbelow), as well as estimating power/area requirements (also discussed hereinbelow) and determining the number of pins required by the device(s).

Generally, partitioning involves the organization or distribution of various elements of a design into discrete groups or partitions. In the context of a system, this may involve allocation of certain functions to certain discrete integrated circuit devices (chips).

Figure 35:
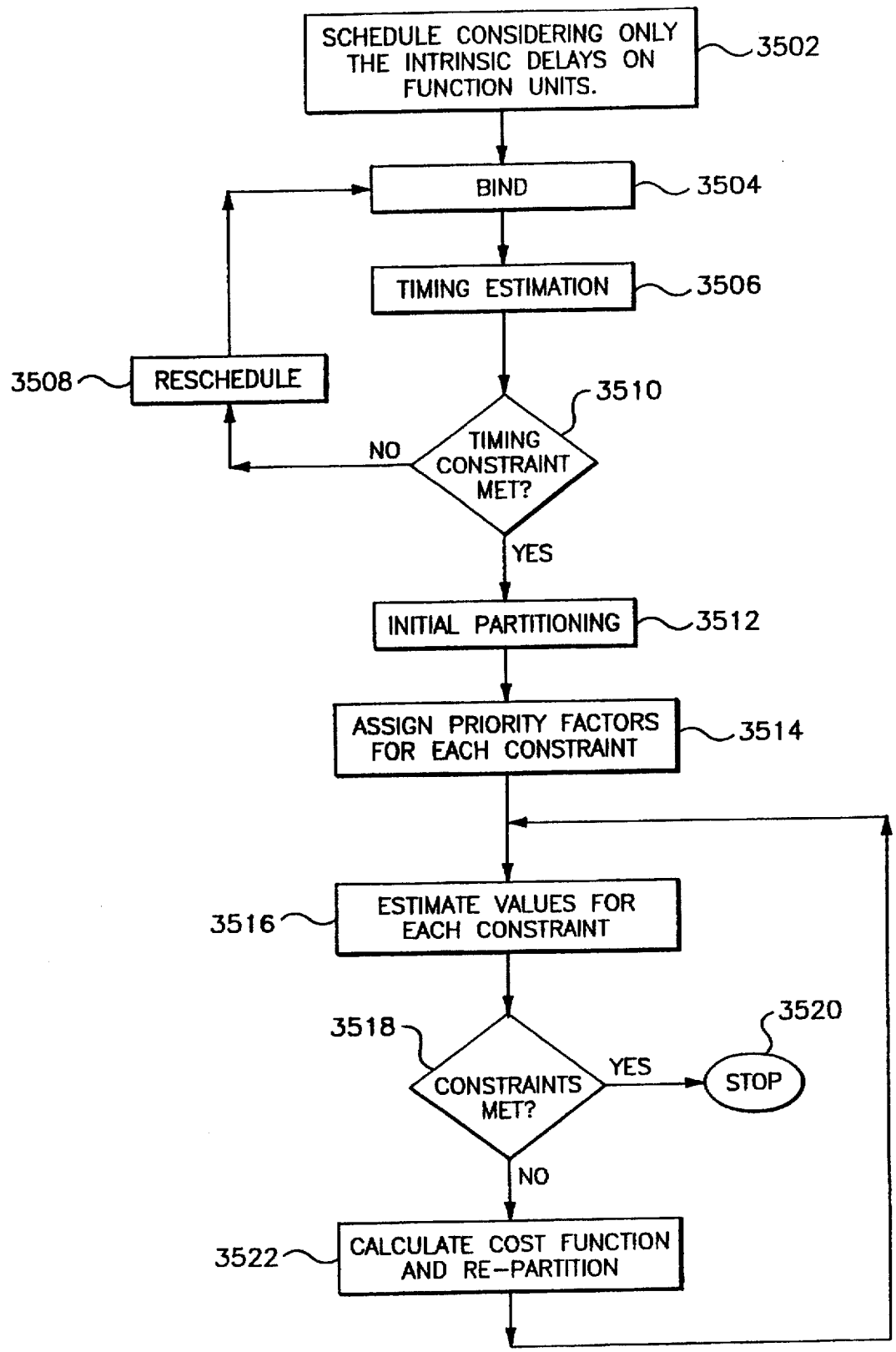
FIG. 35 is flowchart illustrating constraint-driven partitioning, according to the present invention.

FIG. 35 is a flow chart illustrating the data flow associated with a specific embodiment of the automated high-level partitioning technique of the present invention, in the context of a design of an integrated circuit chip. In this example, the inputs are constraints such as clock cycle, overall timing requirements for the design, maximum number of pins per chip, maximum bus width, maximum area for the chip, or any other constraint that the designer wishes to impose on the design. As a precursor to partitioning the design, the designer must prioritize the constraints. For example, the designer must decide whether timing considerations are more important than area limitations. The constraint priorities permit the partitioning technique to select between competing design strategies on the basis of relative importance of various aspects (relative to the constraints) of the outcome of those design strategies.

The first step 3502 in the partitioning process, initial scheduling, accounts only for any intrinsic delays on the (functional units) blocks in the design. These delays would be, for example, intrinsic to the parameters for the design specified in the high level (e.g., VHDL) description of the system, such as speed.

In a next step 3504, the design is "bound" by assigning registers and multiplexers to the various functional units of the design. At this point in the process, the design is flat (i.e., non-hierarchical).

As used herein, "scheduling" is the process of evaluating operations to be performed by the design and assigning them to specific clock cycle time slots. "Intrinsic delays" are delays associated with the functional units themselves and do not include the effects of signal path delays introduced by multiplexers and/or registers in routing signals to/from the functional units. Scheduling only deals with intrinsic delays of the functional units. "Binding" is the process of allocating and interconnecting (data structures corresponding to)

blocks (functional units) to hardware units (e.g., macros, cores, mega-functions, etc.).

In a next step 3506, the timing of the bound design is estimated. Timing estimation at a high level in the design process is discussed in greater detail hereinbelow.

It is then determined, in a step 3510, whether the design meets timing constraints imposed at the high (e.g., behavioral) level description of the design. If the timing constraints are not met ("NO"), the design is re-scheduled, in a step 3508, this time taking into account the delays imposed by the muxes and registers, and the re-scheduled design is re-bound in the step 3504.

When the timing constraints are met ("YES"), the process proceeds to a step 3512, wherein the scheduled and bound design is initially partitioned, by applying a suitable constraint-driven clustering algorithm to the design, or the like. These constraints such as area, number of pins, and the like, which are defined by the user, may include other more "visceral" constraints such as the designer's experience-based intuition regarding the placement and juxtaposition of various functional units.

Next, in a step 3514, the process assigns a priority factor for each constraint. In other words, a priority factor "a", "β", "γ", etc., is assigned by the designer to each constraint "a", "b", "c", etc., respectively. The ultimate partitioning of the design will take into account the weight of these priority factors wherein, for example, timing constraints may be given more weight than power dissipation. A typical cost function might have the form:

$$Cost = F(\alpha)*E(a) + F(\beta)*E(b) + \ldots + F(\gamma)*E(z)$$

where $E(x)$ is an estimate of the associated constraint value "x" (e.g., area, power, timing, etc.) and $F(p)$ is a function of a priority factor "p" (e.g., $F(p)=2p$; $F(p)=p^2$; $F(p)=ae^p$, etc.).

At this point, generally, the process iterates through checking whether the constraints are met, calculates a "cost function" based on the prioritization of the constraints, then seeks to minimize the cost function by moving functional units from one partition to another, or by adding redundant units to one or more partitions.

More specifically, by way of example, in a first step 3516, the process estimates values for each constraint. For example, for a power constraint, the techniques described hereinabove for estimating power are applied. Likewise, for a timing constraint, the techniques described hereinbelow for estimating timing are applied. It should, however, be understood that the partitioning technique of the present invention is applicable to any constraint deemed important by the designer.

Next, in a step 3518, it is determined whether all of the constraints have been satisfied ("YES"), based on their estimated values. If they have been satisfied, the process terminates (3520), having produced a valid partitioning of the design.

If, on the other hand, the constraints have not been met ("NO"), it is necessary in a next step 3522 to calculate the value of a cost function for the partitioning, and subsequently repartition the design so as to minimize the cost function.

In the description above, the iterative partitioning is accomplished along with and in cooperation with the scheduling and binding process, effectively at the Feasibility stage of design. The advantage of partitioning at this time is that the system can perform trade-offs between more optimal scheduling and binding and the partitioning. This cannot be done later in the design process because the binding will already have been fixed, and the ability to re-allocate/re-schedule and share resources will have been lost. For example, consider the case where timing is the most important constraint. In this case the system can investigate the advantage in adding redundant function units in order to reduce critical path lengths as long as the area constraints are still met. This cannot be done once the binding is fixed (the design is in the form of a net-list). Certain points related to this process of iterative partitioning to arrive at an optimal (or near optimal) partitioning of the electronic design (described with respect to the flow chart of FIG. 35) are summarized below.

Initially, a schedule is found considering only the intrinsic delays on the function units. After the binding stage, a high level timing estimator can determine if the synthesized design meets the user timing constraint. If the timing constraint is not met, the process is iterated this time with the additional information of the delays on the muxes and registers until a schedule and binding is found that meets the timing constraint.

The user prioritizes the constraints (for example, defining timing compliance as being more important than chip area). Estimates of the transmission delay between the partitions (i.e. inter- or intra-chip delays) are made. (These delays can be automatically estimated based upon a set of rules or statistics).

Assuming, for example, that timing is the highest priority constraint, the system considers the critical paths in the design. Note that these paths are not all the regular paths in the corresponding net-list since some paths do not correspond to the execution of the synthesized description. For each path the 'slack' is recorded and those paths for which the 'slack' is less than the inter-partition delay are marked as critical. A (configurable) percentage of all paths (sorted by the 'slack') is also marked and weights are assigned to each path according to 'criticality'.

At this point, the design description is partitioned based upon the weights on the paths (or the nets in the paths). Once an initial partition exists, an iterative refinement procedure optimizes the partitioning by repeated scheduling, binding, movement of units between partitions, and adjusting the parallelism of the design.

When an area constraint is at the highest priority, the initial clustering and partitioning assign more weight to preserving minimal numbers of functional units, while seeking to meet other constraints such as pin and timing.

In all iterations, the partitioning scheme provides partial binding information. This information is used at each stage to evaluate the new timing (and/or area and/or power, and/or pincount, etc.) against other previous partitioning/scheduling/binding attempts, and to reschedule the design.

Once a partition that satisfies all the constraints is found, the partitioning information is appended to the system database and is used by RTL code generator to produce the corresponding code. If no such partition is found, a partition that meets most of the constraints according to the priority levels is chosen. The information can be used at subsequent design stages (or levels) for further processing (e.g., the generation of RTL code or generation of a net-list).

Power Estimation

The problem of power minimization in integrated circuits (ICs) is becoming very important due to an increasing demand for portable computing and telecommunication devices, and a rapid increase in the number of functions that can be accommodated on a single chip.

Power dissipation of an integrated circuit (IC), such as an application specific IC (ASIC) is an important design consideration, especially when implementing circuits in complementary-metal-oxide-semiconductor (CMOS) technology. In CMOS technology there are two components that contribute to power dissipation—namely:

1. Static (non-switching) dissipation—due to leakage current (static or DC current draw of "idle" gates or transistors).
2. Dynamic (switching) dissipation—due to:
   a. switching transient current
   b. charging and discharging of load capacitance In most CMOS ASICs the contribution due to static dissipation is small compared to dynamic dissipation. For example, the typical static power dissipation due to leakage for a CMOS inverter operating at 5 volts is between 1–2 nano-watts. Static dissipation for other logic families can be considerable. This is most notably true of bipolar logic families such as ECL (Emitter-Coupled Logic) and TTL (Transistor-Transistor Logic), and non-complementary MOS logic families (e.g., NMOS, HMOS).

For a given circuit design, the static power dissipation $P_s$ of a circuit is given by the equation:

$$P_s = \sum_1^n I_l \times V_{dd} \quad (EQ\ 1)$$

where $I_l$ is the leakage current (static current draw) of a representative logic device (gate), $V_{dd}$ is the supply voltage and n is the number of logic devices (gates) in the circuit. In general, static dissipation can be determined for any logic family (technology). If static dissipation varies significantly from one device type to another within a logic family, or if different types of logic having different static dissipation characteristics are combined within a single circuit, then static dissipation totals can be computed separately for each of the device types and summed together to arrive at an overall static dissipation total for the circuit.

The dynamic power dissipation $P_{dG}$ for a CMOS logic gate is given by the equation:

$$P_{dG} = \frac{1}{2} \times C_L \times V_{dd}^2 \times \frac{N_t}{T} \quad (EQ\ 2)$$

where $C_L$ is the output load capacitance on the gate, $V_{dd}$ is the supply voltage, T is the clock cycle and $N_t$ is the number of switching transitions per clock cycle. This is based on the well known principle that the bulk of CMOS operating current derives from charging and discharging of parasitic capacitances during logic level transitions. These parasitic capacitances are due primarily to input capacitances of subsequent logic gates and to parasitic wiring capacitances within the circuit (e.g., on a semiconductor die).

Thus, for a gate switching at the frequency f, we get the familiar equation:

$$P_{dG} = C_L \times V_{dd}^2 \times f \quad (EQ\ 3)$$

The total dynamic power dissipation $P_d$ of a CMOS circuit is given by the equation:

$$P_d = \frac{V_{dd}^2}{2T} \times \sum_1^n C_{Li} \times N_{ti} \quad (EQ\ 4)$$

where $C_{Li}$ is the load capacitance on the $i^{th}$ gate, $N_{ti}$ is the number of transitions of the $i^{th}$ gate per clock cycle, and n is the number of gates in the circuit. Equations 3 and 4 above are specific to CMOS devices, but are representative of the more general process whereby total dynamic power dissipation for a logic circuit can be calculated by summing the dynamic power dissipation contributions of each of the logic devices in the circuit. This more general process is applicable to any logic family or technology.

The total power dissipated by a circuit is the sum of the two components, static dissipation $P_s$ and dynamic dissipation $P_d$, as follows:

$$P_{total} = P_s + P_d \quad (EQ\ 5)$$

Simulation-based techniques for power estimation typically require input stimulus patterns (vectors) for the circuit, and a circuit simulator capable of identifying which devices are or and/or switching as a function of time. Calculation of maximum and average power dissipation is done using equations 1–4 above by substituting best and worst-case device parameters, and by applying representative average-case and worst-case input stimuli to the circuit via the circuit simulator. Circuit simulators such as SPICE are used to calculate the power dissipation of a circuit accurately for a given set of input stimuli. Since SPICE operates at the transistor level and uses iterative techniques to converge to a solution, simulation run times for SPICE simulations can be very long, potentially unacceptably long even for circuits of modest size.

Other simulation-based power estimation techniques use a switch or gate level simulator. LPOW is an example of a tool available from LSI Logic, Inc. which uses a gate level simulator to estimate power dissipation. The main limitation of these methods, again, is the need for a complete design (circuit or net-list) and complete simulation test pattern for at least all the typical cases expected to cause maximum (and representative average) power dissipation.

More recently, techniques are surfacing and being investigated which combine simulation and probability theory. These techniques reduce the problem of estimating average power in combinational circuits to one of computing signal probabilities of a multilevel circuit derived from the original circuit by a process of symbolic simulation. These techniques significantly reduce the burden of power estimation by effectively eliminating the need for complete sets of simulation stimuli (vectors), but still require a complete net-list for the circuit.

Most present power estimation tools operate at the net-list and/or layout level (i.e., late in the design process). However, such levels of design detail are generally not available to the designer early in the design process. For example, in the techniques described hereinabove with respect to FIGS. 1–15, the design is initially described at very high, behavioral levels.

Factors which the designer needs to take into account for accommodating and minimizing power consumption include junction temperature, packaging, cooling and circuit architecture. Making these changes after a design is complete is very expensive, time consuming and, at times, impossible.

It is therefore an object of the invention to provide a technique for estimating power consumption at an early stage in the design process, for example at a stage in the design process when a detailed global net-list and/or a layout for the circuit being designed is not available (e.g., does not yet exist).

It is a further object of the invention to provide a technique for estimating power dissipation in CMOS circuits which may be employed by the designer during different stages of the design process ranging from the system level to the net-list and layout levels.

According to the invention, a technique is provided to predict power dissipation as the design progresses through various stages from system level specifications, through behavior and RT level specifications and finally to the net-list and layout levels. This method for power estimation can be used in conjunction with estimators for other parameters in the design such as area and timing in high-level and RT-level synthesis systems for optimizing power consumption while considering other related constraints including system size, speed, IOs etc.

The techniques of the present invention enable the designer to consider, compute and accommodate various parameters, helping him to make intelligent, informed design decisions. Some of these parameters are:

- junction temperature for the die, which affects circuit propagation delays and performance
- packaging for the die, which will affect and/or accommodate heat dissipation
- cooling measures, such as heat sinking, which may be considered when designing the board
- circuit architecture, which may be changed to reduce power consumption As noted hereinabove, with respect to FIGS. 1-15, a design typically goes through successive stages of refinement, starting from system level specification, behavior description, RTL description, through net-list and layout descriptions. At each stage, estimates for a number of important design parameters such as size, timing, and power are highly desirable.

The techniques of the present invention enable the designer to estimate power dissipation for an electronic design at the early stages of the design process, for example at the system level and at the behavior level.

Power Estimation at the System Level

At the system level, only a high level, semantic description of the circuit (system) is available. The average power consumption is estimated using statistical models that take into account critical parameters. These parameters are either explicitly available or deduced from the system specifications. The following are exemplary of these parameters:

1. Number of gates, $N_g$
2. Number of I/O pins, $N_p$
3. Output Capacitance, $C_o$
4. Frequency of operation for the circuit/system, $f_s$
5. Interconnection pitch $P_w$
6. Interconnection Layers $N_w$
7. Utilization efficiency of interconnections, $E_w$
8. Average interconnection length, $l_{av}$
9. Average fanout of gates $F_w$
10. Total Chip Capacitance $C_c$
11. Average power consumption per gate in the given technology, $P_{dG}$ Power estimation at the system level does not require that all the parameters (1–11) listed above be supplied. Some of these parameters can themselves be estimated from other parameters provided by the designer. For example the average interconnection length $l_{av}$ can be estimated using the number of logic gates on the chip and Rent's rule as shown below (equations 6–8):

$$\bar{R} = \frac{2}{9} \times \left( 7 \cdot \frac{n_g^{p-0.5} - 1}{4^{p-0.5} - 1} - \frac{1 - N_g^{p-1.5}}{1 - 4^{p-1.5}} \right) \frac{1 - 4^{p-1}}{1 - N_g^{p-1}} \quad \text{(EQ 6)}$$

$$d_g = \frac{f_g \bar{R} p_w}{e_w n_w} \quad \text{(EQ 7)}$$

$$l_{av} = \bar{R} d_g \quad \text{(EQ 8)}$$

Based on the logic gate pitch R and other technology parameters listed above, the total chip capacitance $C_c$ can be estimated. The total (dynamic) power consumption for the system can then be estimated using the equation:

$$P_t = \frac{1}{2} f_s f_d C_c V_{dd}^2 \quad \text{(EQ 9)}$$

Using a combination of statistical techniques and analytical equations, representative ones of which are shown above, a good estimate for power can be derived at the system level. Since the total operating power $P_t$ for CMOS circuits is dominated by the dynamic power dissipation $P_d$, the static power $P_s$ need not be further considered. For logic families (technologies) which do exhibit significant contributions of static dissipation $P_s$ to total power dissipation $P_t$, the static dissipation factor is included in the total power dissipation (see equation 5 above). The accuracy of the power dissipation estimate depends significantly on the amount of information available from the system specification. Such preliminary power dissipation predictions can be used in making high level design decisions relating to system performance. At this early stage in the design process, it is not the absolute numerical value of the power dissipation estimate, but the qualitative nature of the estimate that allows the designer to make intelligent design decisions. Hence, accuracy may, at times, be sacrificed for computational speed and simplicity.

Power Estimation at the Algorithmic (Functional), Behavioral and Register Transfer Levels After a first level of design whereby the system-level description of the electronic design (circuit or system) is expanded, more information is available (e.g., a behavioral description and first-level design choices) as compared to what was available at the system level of specification. (Alternatively, the electronic design may be initially specified at a lower-than-system level, e.g., behavioral or functional level). However, the system level power estimation techniques described hereinabove are applicable at lower (hierarchical) design levels, as well. Even so, the next-level (e.g., behavioral or RT) methods described hereinbelow make better use of the additional design information available at this next stage of the design process.

The method makes use of a behavioral or architectural synthesis system, such as that described hereinabove with respect to FIGS. 1–15. A description of the system or circuit at the behavioral level, (e.g., in a hardware description language (HDL) such as VHDL) is used as a starting point. In addition to this description, other system parameters (e.g., $N_g$, $N_p$, $C_o$, etc., listed above) are either obtained from the designer or have been determined or estimated in the first level (system level) of design.

The power estimation process proceeds as follows:

1. The design description (e.g., VHDL description) is analyzed to extract the control and data flow (thereby separating computational and data routing elements from control elements such as state machines which govern the sequence of computation and data routing).

A CDFG, or Control and Data-Flow graph (more accurately, a linked data representation of control and data flow within the design which can be graphically displayed or printed as a CDFG) is derived from this analysis.

2. Several trial "designs" are created by constructing one or more register transfer level designs, using architectural synthesis (e.g., as described hereinabove) and a library of available arithmetic, control, logic, interconnect and storage modules in the given technology. These trial "designs" exhibit different chip area and speed characteristics which are used in a trade-off analysis to determine the most appropriate design choices given known design constraints.

3. "Internal" power consumption (excluding I/O pin drivers) is estimated for each of the trial "designs" by summing contributing factors. Power data (parameter-dependent and/or absolute) related to dissipation by "core" cells, arithmetic modules (e.g., adders, subtracters, multipliers), interconnect elements (e.g. muxes), and storage elements (e.g. Flop flops, RAMs, ROMs) is determined from data stored in the library along with the RT descriptions of these circuit elements. Total power dissipation for the library modules (circuit elements) is computed taking into account operating frequency, fan-outs and output loads. Additional relevant information, such as the number of gates, number of pins and size for each element is either read in or is estimated. A fast floorplan (rough-cut) is constructed to compute the average interconnect length from which the average interconnect capacitance is estimated. The control logic size and associated power dissipation is estimated from the number of states in the design (either explicitly stated in or derived from the design description) and the complexity of boolean equations activating elements of the data path in the circuit. All contributing power dissipation factors are summed to obtain the total power dissipation inside the circuit.

4. The power dissipation due to output drivers (I/O pin drivers) is added to the internal power dissipation value computed in step 3 above to get the total power dissipation.

Automatically repeating the above procedure and tabulating the results across several different trial "designs" provides upper and lower bounds on power dissipation related to the various trial "design" choices.

This method for power estimation can be used in a high level synthesis system (such as that described hereinabove with respect to FIG. 1–15) for optimizing power consumption while performing other high level tasks such as partitioning, behavior preserving, arithmetic transformations, and synthesis tasks such as scheduling, module selection and binding (each described in greater detail elsewhere herein).

Power Estimation Summary

In summary, the present invention provides a methodology for estimating power at the high levels of the design process viz. the system, algorithmic, and behavior levels. The motivation stems from the fact that system designers need an estimate up front even before starting an actual ASIC design to make high level decisions on performance, selection of die size, technology, and package, and to determine any appropriate cooling requirements while designing the system. The disclosed methodology uses a statistical-analytical method for power estimation at the system level and a combination of these and architectural synthesis techniques for estimating power at the algorithmic (functional) and behavioral levels.

High Level Area Estimation

As indicated above, in the discussion of FIGS. 1–15, in the process of designing digital circuits or systems, the artifact (e.g., circuit, system, or the like) being designed goes through a series of steps starting from the idea or conceptual level, all the way down to the layout or mask level. The design typically goes through successive stages of refinement, starting from system level specification, behavioral description, RTL description, through net-list and layout descriptions. At each stage in the design process, the circuit specification is refined and constrained to lie in a portion of the design space with respect to relevant parameters, a few of which are area, speed, power and cost. Often, design decisions impact one or more of these parameters, and the designer relies on "guess-timates" to make the proper choices among various alternatives. The discussion hereinbelow is directed particularly to aiding the designer in making qualitative and quantitative decisions relating to area.

It is an object to provide a multi-level area prediction (estimation) method for use at different stages of the design process, primarily targeted at early stages (higher levels) of the design process, namely at the system, algorithmic (functional), behavioral and RT levels.

According to the invention, methods are provided for computing area estimates at the system, behavioral and register-transfer levels. Area estimation at the system level, and at the behavioral, algorithmic and register transfer levels are treated separately hereinbelow. The methods use a combination of statistical, analytical and heuristic methods for area estimation at the system level, and use a combination of these methods and architectural synthesis techniques for estimating power at the algorithmic, behavioral and register transfer levels. The area estimation methods disclosed herein allow the designer to make high level decisions on total cost, selection of dies and packages, and other requirements, if any, while designing the board for a system. The disclosed methods for area estimation can be used in the high level or RT level synthesis system (see, e.g., the discussion hereinabove with respect to FIGS. 1–15) itself for optimizing total block or chip size, while performing high level tasks such as partitioning, behavior preserving arithmetic transformations and synthesis tasks such as scheduling, module selection and binding and technology mapping.

Area Estimation at the System Level

In many ways, area estimation is similar to power estimation, and relies on many of the same parameters. As stated hereinabove with respect to power estimation, only a high level description of the circuit or system is available at the system level of design. The total size (area) is estimated using statistical and analytical models that take into account certain critical parameters. The following are representative of these parameters.

1. Number of gates $N_g$
2. Number of I/O pins, $N_p$
3. Interconnection pitch, $P_w$
4. Number of interconnection layers, $N_w$
5. Utilization efficiency, $\epsilon_w$ 6. Average interconnection length, $l_{av}$
7. Average fanout of gates, $F_w$
8. Number and size of memory elements (RAMs, ROMs, register files)
9. Number and size of buses As with power estimation, it is not necessary that all of the parameters be supplied by the designer; some of these parameters can be estimated from parameters either provided by the designer, inferred from other parameters, or derived from the specification (See, for example, the estimation of $l_{av}$ described hereinabove with respect to equations 6–8).

Again, for example, based on the logic gate pitch R and other technology parameters listed above, the logic area $A_c$ can be estimated by the following heuristic relation:

$$A_c = \sqrt{N_g}\, d_g \quad \text{(EQ 10)}$$

Given the number of I/O pins and technology used for the design, the area required for I/O buffers is added to this model. If the system specification contains greater detail, such as the number of major blocks, the numbers of gates and pins per block, and the type of block (e.g., random logic, data path memory, etc.), appropriate size estimates targeted specifically to those types of blocks will be used instead of equation 10 to obtain the total logic area.

Routing area is a function of such design parameters as average fan-out, pins per net (signal), and average interconnection length, as well as target technology parameters such as interconnection pitch, number of interconnection layers, and utilization efficiency of interconnections. Using these parameters, the area required for routing of signal interconnections can be estimated and added to the logic area to obtain the total chip area.

As with power estimation, a combination of statistical techniques and analytical equations are used to derive an estimate for chip (or board) area at the system level. The accuracy depends on the amount of information available from the specification and the accuracy of the statistical/analytical models. Such preliminary area prediction can be used for making high level design decisions relating to system cost. Again, as with power estimation, the qualitative nature of the results are as important as or more important than the absolute numerical values in enabling the designer to make intelligent design decisions. Therefore, as with power estimation, it is possible to sacrifice accuracy in favor of computational speed or simplicity.

Area Estimation at the Behavior, Algorithmic, and RT Levels

Again, area estimation at the behavioral, algorithmic (functional), or RT level is very similar to power estimation at the same level. More information is available than is available at the system level of design. As with power estimation, system level techniques for area estimation are applicable here as well. As before, however, methods which make use of the additional design information available at this level are favored over the more approximate system-level techniques.

The method uses techniques similar to those found in behavioral or architectural synthesis systems. A description of the system or circuit (design description) at the behavioral level, described using a hardware description language (such as VHDL) is used as a starting point. In addition to this description, other system parameters (such as those listed hereinabove with respect to system-level area estimation) are obtained from the designer. The estimation process proceeds as follows:

1. The description is analyzed to extract the control and data flow from the design description. A CDFG "graph" of operations and values (more accurately, a linked data representation of the control and data flow in the design) is constructed from this analysis.

2. Using an architecture synthesis system (such as that described hereinabove with respect to FIGS. 1–15) and a library of available arithmetic, logic, interconnect and storage modules in the given technology, a number of trial RT-level "designs" are created.

3. Area is estimated for each of these trial "designs" by determining the number and type of modules (e.g., adders, subtracters, multipliers), interconnect elements (e.g., MUXes), and storage elements (e.g., Flip-flops, RAMs, ROMs) used. Information (either parameterized or absolute) related to the number of gates, number of pins, size and aspect ratio is stored in the library along with the description of each RT element. A rough floorplan is created for each trial "design" to determine the logic area required for the data path and control logic. The control logic size is estimated from the number of states in the system and the complexity of Boolean equation activating elements of the data path in the circuit. The routing area is estimated using parameters such as number of buses in the design, number of pins on the modules that need to be connected, the connectivity amongst modules, average interconnection length for the design, and a statistical measure of routing for the target technology. The logic and routing area are added up to obtain the total area of the circuit.

4. The area required for I/O pin buffers is added to the logic and routing areas computed in step 3 to get the total area required for each trial "design".

Automatically repeating the above procedure across several different trial "designs" provides upper and lower bounds on area for the behavioral, algorithmic (functional) or RTL design description.

This method for area estimation can be used in a high level synthesis system (such as that described hereinabove with respect to FIG. 1–15) for optimizing total block, board or chip size while performing other high level tasks such as partitioning, behavior preserving, arithmetic transformations, and synthesis tasks such as scheduling, module selection and binding (each described in greater detail elsewhere herein).

Estimating Design Performance

Among the more critical determinations to be made in designing a digital electronic system is whether or not the timing of the system, as designed, will meet the design constraints. In order to accomplish this, it is necessary to obtain dependable information about the timing performance of the system being designed. The earlier in the design process that valid, reliable estimates of timing performance can be obtained, the earlier problems can be spotted and avoided. (It is well understood by those of ordinary skill in the art that early validation of design choices avoids a great deal of wasted effort.)

According to the invention, reasonable estimates of pin-to-pin timing and maximum operating frequency (minimum clock cycle time) can be derived from a behavioral description of an electronic system or from a block diagram description of the flow of the data in an electronic system.

A design of a digital electronic system, at any level, can be characterized using a block diagram. The block diagram can include function blocks representing components and the connections between them. Other blocks might represent the control elements governing the operation and flow of data in the electronic system. At the board or system level, the block diagram can include function blocks representing interconnected chips and electronic components. At the chip level the function blocks might represent cores, megacells, functional units (e.g., those assigned during "scheduling"), interconnect, and control logic. At the lowest levels of design hierarchy, the block diagram is representative of the net-list that connects the lowest level elements (components) of the electronic system design.

Finding the timing characteristics of a digital electronic system design, especially at the system or chip levels, is an important step in the design process. Current design tools only provide functional simulation (i.e., simulating logical function, but providing no useful detailed timing-related information) at higher levels of design abstraction, and the timing of the design is only found/verified at lower levels (e.g., RT level or logic level). Given a behavioral description or a block diagram that contains a description of the flow of data and control for an electronic system, and timing models for low-level design elements, we can estimate the timing at the higher level.

According to the invention, the description of the electronic system is converted to a CDFG (Control and Data Flow Graph) representation. Every component/block is represented by a node in the graph. Arcs (lines) between the nodes represent connections between the components/blocks (nodes in the graph). Each arc is annotated with the delay associated with the transfer of data between the components/blocks along the connection path associated with the arc. (If two nodes of the graph represent two physically different chips, then the "arc" delay can much more significant than delays along connections between blocks on the same chip.) These delays can be assigned or estimated based on the expected size of the design or on information extracted from a preliminary floorplan. Additional delays are added to arcs if data flow along the arc is dependent upon control logic timing.

(Note that since the inventive technique is directed to automated design tools, the terms "CDFG" and "graph" are intended to be representative of data structures on a computer system suitable for representing the "CDFG" or "graph", rather than literal references to a pictorial representation. For example, a "node" of a CDFG refers to a data item which identifies a component or block and can be used to refer to a timing model thereof. "Arcs" between nodes refer to data items which identify specific connections between nodes and which have one or more delay values associated with them. "Annotating" an arc with a delay value refers to storing a delay value in the data item for the arc.)

Each of the components/blocks that makes up the design has a timing model associated with it. Any data path (between an input pin and an output pin) through a component/block (i.e., a logic element represented by a node on the graph) can be characterized as having a "sequential", a "setup" component and an "output delay" component. The sequential component is the number of clock cycles required for a data change at the input (pin) of a data path to be reflected at the output (pin) of a data path. The setup component is the minimum amount of time before an active clock transition (i.e., a clock edge) that the data at the input (pin) must be stable in order to ensure proper recognition of the data by the sequential circuitry. The output delay component is the maximum delay time after the after the active clock transition before the data at the output (pin) of the data path changes. A minimum clock cycle time for the component/block represents the maximum operating clock frequency at which the component/block will function properly, and is stored within the timing model for the component/block. Sequential, input setup and output delay timing information is stored for each of the data paths (input-pin to output-pin) through the component/block in the timing model for the component/block. This timing information can be stored in a matrix form. If timing information for a component/block does not exist the method described hereinbelow can be used to derive it and propagate it up to the higher level.

The nodes in the graph are then ordered according to the precedence relationship (in terms of data propagation sequence) described by the arcs and the data path timing information. This represents a high-level scheduling of the components/blocks in time. It is initially assumed that the maximum operating frequency (minimum clock cycle time) for the electronic system (represented by the graph) is the lowest maximum frequency (longest minimum clock cycle time) specified for any of the components/blocks.

Assuming no back edges in the graph, the pin-to-pin cycle count can be derived directly from the ordered graph. To derive the actual minimum clock cycle for the design, it is necessary to trace all of the data paths in the design and to ensure that no delay along a arc between sequential components exceeds that value (i.e., for an arc between an output pin of a sequential element and an input pin of a sequential element, the sum of output delay on the output pin, path delay along the arc, and input setup time for the input pin cannot exceed the minimum clock cycle time). This however, cannot be derived from the graph alone. The reason is that some paths in the design are not relevant to the functionality of the design. The behavioral or functional specification needs to be considered along with the graph. When the design description and the delays are both taken into consideration, a data path based static timing analysis produces a reasonable estimate of system timing performance.

The following is a detailed example of a method of deriving a synthesized RTL description from a behavioral code such that it obeys timing constraints. The method estimates the timing of a synthesized design and uses the estimate to re-synthesize until a design meeting the timing constraints is produced.

A high-level synthesis system (such as that described hereinabove with respect to FIGS. 1–15) performs scheduling and binding of a behavioral description in separate steps. In a scheduling step, function units are assigned to clock cycle time slots where only the intrinsic delay on the function units is taken into consideration. The operators that represent the behavioral description are not bound to actual functional units until the binding step. In the binding step, mutually exclusive operations can be assigned to the same functional unit (sharing). The binding algorithm seeks to minimize the number of different signals (or variables) that are input to the same functional unit, thereby saving on multiplexing costs (delay and area). However, most designs multiplexing the inputs to at least some of the functional units. The associated additional delay can result in an unacceptably long delay time along a scheduled register-to-register path (i.e., between sequential elements).

According to the invention, high level timing estimates are used to determine minimal clock cycle time that will make the design function properly.

(Note that in the following discussion, the term "graph" is intended to refer to data representations of elements in the graph, rather than, literally, a pictorial representation.)

A graph is constructed from the Control and Data Flow Graph (CDFG) representation that is built by the High Level Synthesis (HLS) compiler in the following way:

1. For each operator in the CDFG create a node in the graph. Annotate each node with the intrinsic delay of the (register) unit to which it is bound.

2. Add arcs between nodes (i.e., between source and destination operators) that correspond to chained operations (i.e., corresponding to data flow through the electronic system). On each arc assign a weight corresponding to the delay on the input multiplexer (if any) to the functional unit to which the destination operator is bound.

3. Add zero weighted arcs between nodes that correspond to operators that conditionally depend on each other (i.e., readwrite, write-read, and write-write combinations).

4. Create two dummy nodes named "source" and "destination", and assign zero weights to both, referred to hereinafter as the source node and the destination node, respectively.

5. Each data arc that crosses a clock cycle line (in the CDFG) represents a store operation in the design. For each such arc, do the following:

5a. Create a node in the graph. Connect that node to the source of the arc. Annotate this node with the delay associated with the corresponding register. Attribute the arc with the delay of the multiplexer (if any) at the input to that register.

5b. Direct the output of this node to the destination node. Assign a zero weight to that arc.

5c. Direct a zero weight arc from the source node to the destination node of the original arc in the CDFG.

6. For each arc that flows from a port or a constant in the CDFG, connect a zero-weight arc from the source node to the arc's destination.

7. For each conditional operator: if the condition for its execution is computed in the same clock cycle then add an arc between the condition evaluation and the operator node in the graph, otherwise add an arc from the source node to the corresponding node. Define a global variable "cu" that stores the maximal delay through the control unit. Assign a reference to this variable as the weight on the arcs just created between the condition evaluation and associated conditional operators.

8. For each operator input that is multiplexed, add a similar arc (from the condition evaluation or source controlling the multiplexer). Assign an arc weight (delay) equal to the sum of cu delay and the multiplexer delay.

9. Determine the minimum clock cycle for the system according to the following algorithm:

Each node has an array Paths such that Paths[i] (the i$^{th}$ entry in the array) is the maximum accumulated delays along a path from this node to the destination node that spans i clock cycles. Initially Path[i]=−∞. The maximum "i" value for each node is recorded.

For each node from source to destination:

---

If not visited
    For each output arc:
        Let Child be the destination of the arc
        Find Longest Delay Path from Child to the destination node
        for each valid i
            let j be the path length in clock cycles for that path including This Node
        Paths[i] for this node = maximum of:
            Paths[i] for Child + Arc Weight + Weight for This Node.
        or
        Paths[j] for This Node.;
        Max for This Node = maximum of {Paths[i]/i}

---

As will be appreciated by one of ordinary skill in the art, the algorithm represents a path search from the source node to the destination node looking for delays which limit the operating frequency (clock cycle time) of the electronic system. Upon completion of the search, the maximum delay encountered defines the minimum clock cycle time.

In general, the process of synthesizing timing-correct designs can be summarized as follows:

1. Synthesize a behavioral description (e.g., using one or more of the techniques described hereinabove with respect to FIGS. 1–15)

2. Derive a timing estimate on the control unit part of the synthesized design ("cu" above).

3. Add the timing overhead to the functional units intrinsic delays and re-synthesize as necessary until timing constraints are met.

or

Derive a second synthesized design such that the requested timing is bracketed between the timing of the two designs and use binary search techniques to synthesize an optimal design.

As a result of this process a synthesized design is produced which stands a better chance of meeting the user-supplied timing constraints. The time required to verify timing constraint compliance at this early design stage (e.g., behavioral level) is significantly less then the time which would be required to iterate through several RTL and logic synthesis because of late-detected timing problems.

It will be evident to one of ordinary skill in the art that the techniques described hereinabove can be used to great advantage in providing significant automation of the process of designing electronic systems, including board level systems, custom integrated circuits, ASICs, PLD's, sequential controllers, etc.. In particular, the techniques described hereinabove with respect to FIGS. 33a, 33b, and 38 are well suited to automated management and control of design activities large electronic design projects, providing an orderly, directed sequencing of those design activities, and ensuring that no steps are skipped or overlooked.

The techniques described with respect to FIG. 35 are well suited to automated optimization of large (or small) electronic design choices. These techniques permit iterative partitioning of an electronic design at any design stage, particularly at early stages of design (e.g., at the Feasibility stage) where it is possible to make trade-offs between major architectural approaches and partitioning choices without undue lost effort. These techniques rely on repeated estimation of various performance parameters (e.g., power dissipation, chip area, timing compliance, number of pins, size of package, etc.) and analyzing them according to user specified priorities against specified limits to select design choices (e.g., architecture, partitioning, parallelism, technology etc.) which yield an implementation which meets all design goals in as near optimal a fashion as possible. Specific techniques described herein provide methods of estimating power dissipation, area utilization, and timing compliance at any level of design abstraction.

It will be readily appreciated by one of ordinary skill in the art that application of these inventive techniques will produce more reliable, fully-tested, specification compliant electronic circuits and systems, without fewer errors and iterations than might otherwise be possible.

The discussion hereinabove with respect to FIGS. 16–32e centered mainly around displaying simulation results or design-related data on an ECAD display screen adjacent to a corresponding hierarchically displayed design object (e.g., a schematic object, a "cell" in a milestone matrix, etc.). The simulation results or design-related data can be displayed for any design object regardless of the level of hierarchical view. It will be readily appreciated by one of ordinary skill in the art that similar techniques can be applied to provide for hierarchical display and annotation of control and dataflow graphs (CDFG's).

It is therefore an object of the present invention to provide a technique for hierarchical display of control and dataflow graphs which permits selective viewing of control and dataflow according to a user-specified level of design hierarchy.

It is a further object of the invention to provide a technique for hierarchical display of CDFG's which provides for annotation of CDFG objects with simulation-related or design-related information.

It is a further object of the invention to provide a technique for hierarchical display of CDFG's which provides for expanding one or more selected CDFG objects to display the selected objects at a lower hierarchical level (greater level of detail) than other nonselected CDFG objects.

It is a further object of the invention to provide a technique for hierarchical display of CDFG's which permits viewing of a CDFG for an isolated portion of a design.

Hierarchical representation has to do with the amount of information that is shown on the display. Existing schemes to display CDFG's display all the information at once. One of ordinary skill in the art will immediately recognize that a control and dataflow graph, or CDFG, is simply a graphical representation of design modules and the signal (data and control) exchanges between them. One of ordinary skill in the art will further recognize that the data items necessary to form a CDFG for an electronic design are a natural by-product of the design synthesis techniques described hereinabove.

Figures 36A, 36B:
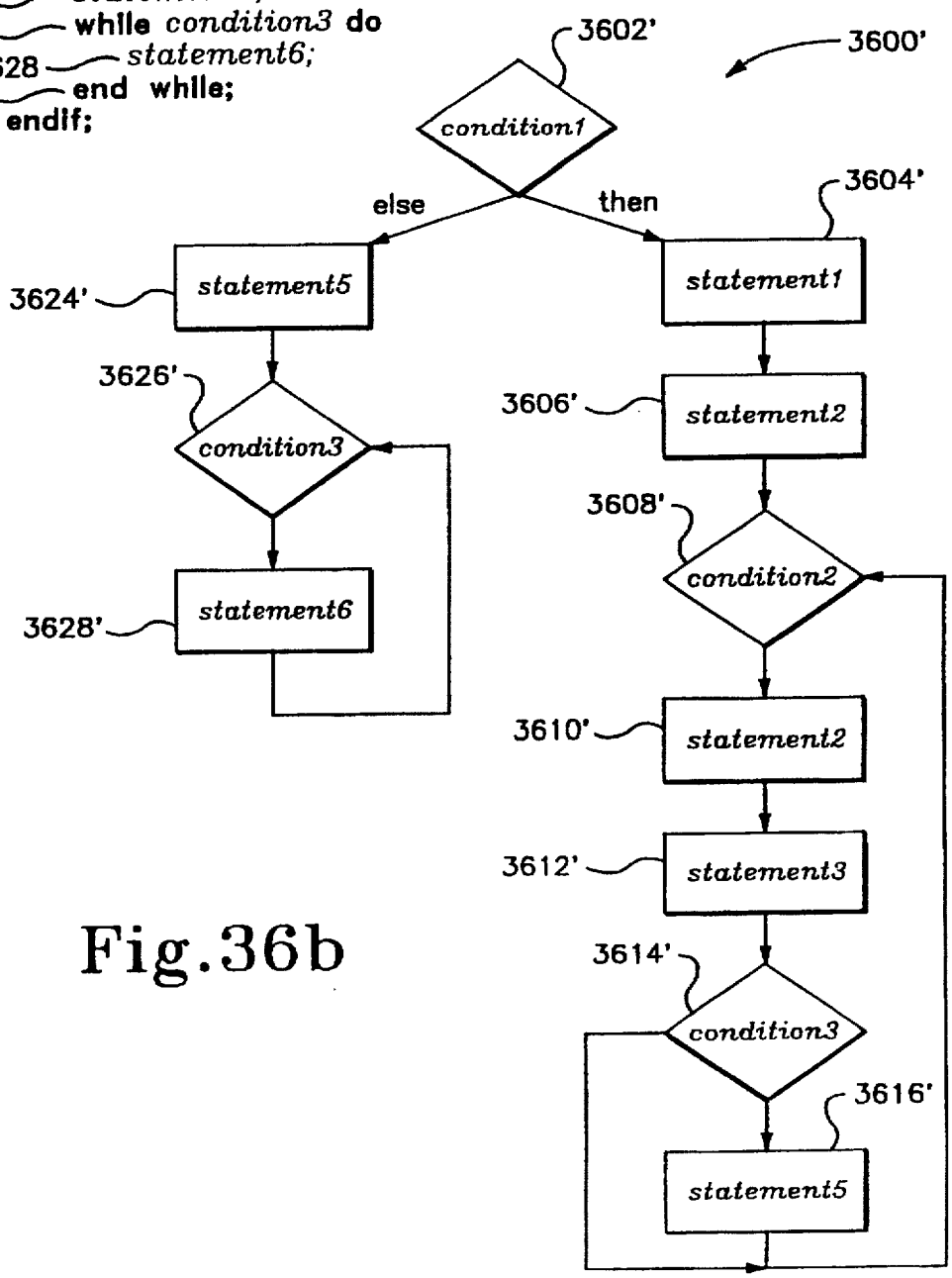

According to the invention, an electronic design is provided on an ECAD system and processed (e.g., synthesized) as described hereinabove, resulting in data items suitable for representation of the electronic design in a dataflow graph. For example, assuming that the electronic design is described in a high-level behavioral language (e.g., HDL), FIG. 36a is representative of an HDL design description 3600 for a simple design. In a first HDL statement at a text line 3602, the design description 3600 calls for a conditional operation based upon the state of a condition value "condition1". The conditional operation specifies a "then" clause to take effect in the event that "condition1" is asserted or "true", and an "else" clause to take effect in the event that "condition1" is unasserted or "false". The "then" clause ends at an "else" statement at a text line 3622. All HDL statements between the text line 3602 and the text line 3622 are part of the "then" clause. The "else" clause begins after the text line 3622 and ends with an "endif" statement at a text line 3632. All statements between these two text lines (3622 and 3632) are part of the "else" clause. The "then" clause includes HDL statements at text lines 3604, 3606, 3608, 3610, 3612, 3614, 3616, 3618, and 3620. The "end" clause includes HDL statements at text lines 3624, 3626, 3628, and 3630. (One of ordinary skill in the art will immediately recognize that HDL statements do not necessarily occupy exactly one text line each, and that the HDL description 3600 is merely exemplary of a more general class of HDL descriptions. One skilled in the art will also appreciate that the designations "condition'x'" and "statement'x'" in FIG. 36a refer to any valid HDL condition and statement, respectively. The specific statements, conditions, and language are not important for the purposes of the example, since FIG. 33a, et seq., are intended only to illustrate the relationships between language constructs, hierarchical levels and CDFG representations thereof.) The "if" statement which begins at the text line 3602 may be considered to be a top-level "module" of the design. Within the "if" statement are two second-level modules, specifically the "then" clause and the "else" clause. Such clauses, which can include a plurality of statements which are treated as a group by another statement (in this case, the "if" statement) are commonly referred to by software practitioners as "compound statements".

The "then" clause begins with two HDL statements: "statements" at line 3604 and "statement2" at line 3606. These two statements are followed by a "while" statement beginning at line 3608 which tests a condition value "condition2". Statements between the "while" at line 3610 and the "end while" at line 3620 take effect whenever "conditions" is asserted or "true". Further, since the "while" clause between lines 3610 and 3620 is part of the "then" clause between lines 3602 and 3622, the "while" clause can only be in effect if "condition1" is asserted or "true". The "while" clause beginning at line 3608 comprises a compound statement which includes two HDL statements "statement2" and "statements" at lines 3610 and 3612, respectively, and an "if" conditional statement beginning at line 3614 and ending at an "endif" at line 3618. The compound statement within the "while" clause at line 3608 can be considered as a third-level "module" of the design.

It should be noted that the two statements at lines 3606 and 3610 are identical ("statement2"). This means that the two statements perform exactly the same function, but under different conditions (by virtue of where they occur in the description. Depending upon how the design is expanded (synthesized) it is possible that the function of these two statements will be performed in the same hardware (i.e., the logic which performs these functions may be shareable for the purposes of the design as described by these two statements). It is also possible, depending upon other design constraints, that duplicate (or functionally equivalent, but separate) hardware constructs will be generated to perform the function of these two statements. One of ordinary skill in the art will appreciate, based upon the discussion hereinabove with respect to design synthesis, that this allocation of function ("mapping" of function) is determined at lower (than HDL) levels of description of the design.

The "if" conditional statement has a "then" clause consisting of a single HDL statement "statements" at line 3616. The "then" clause can be considered as a fourth-level module of the design, which is in this case, a bottom-level module of the HDL description 3600. Synthesis of a hardware design from this design description will, in all probability, further develop the fourth-level module into a set of still lower-level constructs at lower design levels (e.g., RTL, logic-level, switch-level, transistor-level, etc.).

The "else" clause (lines 3624–3630) of the top-level "if" statement (beginning at line 3602) includes an HDL statement "statements" and a "while" statement beginning at line 3626 and ending at line 3630. The "while" clause of this "while" statement consists of a single HDL statement "statements" at line 3626, which can be considered as a third-level "module" of the design 3600, which is also a bottom-level module of the HDL design description.

FIG. 36b is a CDFG 3600' for the HDL design description of FIG. 36a. Each statement of the HDL design description 3600 is represented by a block in the CDFG 3600'. The top-level "if" statement at line 3602 is represented by a conditional block 3602' which directs control in one of two directions ("then" or "else", as indicated on the arrows emanating from the block 3602'). The statements at lines 3604, 3606, 3608, 3610, 3612, 3614, 3616, 3624, 3626, and 3628 correspond to blocks 3604', 3606', 3608', 3610', 3612', 3614', 3616', 3624', 3626', and 3628', respectively. (Note that the "endif", "else", and "end while" statements at lines 3618, 3620, 3622, 3630, and 3632 have no corresponding block in the CDFG. This is because these statements act only as text delimiters for their corresponding "if" and "while" statements, and do not perform any specific function in the design.)

Control flow is indicated in the CDFG by arrows between the blocks. In this example, the CDFG bears great resemblance to a software flowchart. This is primarily because of the structure of the HDL example given (3600, FIG. 36a), which is somewhat "procedural" in nature. This is also due, in part, to the fact the statement "placeholders" (e.g., "statememt'x'") are used rather than actual statements. Presumably, the statements and conditions in a "real-world" HDL description refer to specific data items and specific operations to be performed thereupon. Accordingly, in a "real-world" design for which actual statements and data variables are provided, other arrows would indicate the flow of data within and through the CDFG. However, for the purposes of the instant example (the design description 3600, FIG. 36a, and hierarchical CDFG representations thereof) the details of data flow are unimportant. One of ordinary skill in the art will immediately understand how data flow is represented in a CDFG.

One skilled in the art will appreciate that HDL descriptions often involve hundreds or thousands of HDL statements. Clearly, a detailed CDFG for a HDL description of this type would rapidly become unwieldy and unmanageable. In order to reduce the amount of detail displayed in a CDFG, the present invention provides for displaying the CDFG only down to a specified hierarchical level. FIGS. 36c–h illustrate this.

Figures 36C, 36D:
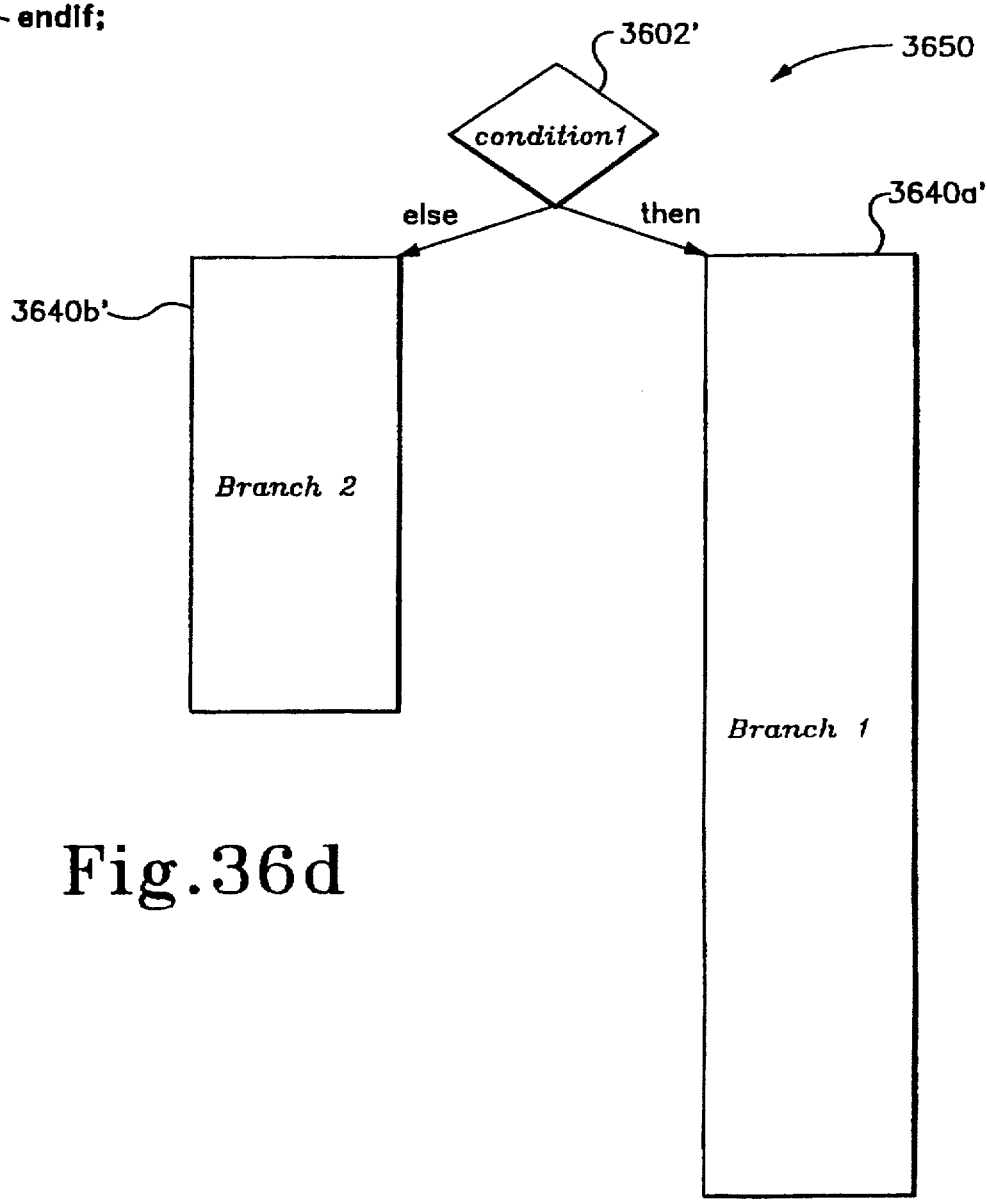
FIG. 36c is a representation, similar to FIG. 36a, with implied modules and levels of the design indicated.
FIG. 36d is a control and data flow graph representing the top level of the design description of FIG. 36c (or 36a), according to the invention.

FIG. 36c is identical to FIG. 36a, except that dashed-line boxes have been drawn around groups of statements to indicate implied "modules" and levels of the design. Statements within an outermost box represent a second-level of the design, etc.. As described above with respect to FIG. 36a, statements within the "then" and "else" clauses of the top-level "if" statement can be considered to be second-level modules of the design. A first dashed box 3640a in FIG. 36c encloses the compound statement (lines 3604–3620) of the "then" clause, and a second dashed box 3640b encloses the compound statement (lines 3624–3630) of the "else" clause. At the next lower level, a dashed box 3642a encloses the "while" statement (lines 3608–3620) in the "then" clause, and another dashed box 3642b encloses the "while" statement (lines 3626–3630) in the "else" clause. A next lower level is illustrated by the nested "if" statement (lines 3614–3618), which is enclosed by a dashed box 3644. Each dashed box (3640a–b, 3642a–b, and 3644) represents a "module" at some hierarchal level. The outermost boxes are at the highest hierarchical level. Conversely, the innermost boxes are at the lowest hierarchical level.

FIG. 36d is a CDFG 3650 representing only the top level of hierarchy of the HDL design description 3600. As in FIG. 36b, the top-level "if" statement (starting at line 3602) is represented by a block 3602'. In this case, however, the statements in the "then" and "else" clauses of the "if" statement (represented by dashed boxes 3640a and 3640b, respectively, in FIG. 36c) are each shown as single blocks 3640a' ("Branch 1") and 3640b' ("Branch 2"), respectively. In this way, detail from lower levels of design hierarchy is eliminated from the CDFG, presenting a simpler graphical representation.

It should be noted that in FIG. 36d, the block 3640a' representing the "then" clause is considerably longer then the block 3640b' representing the "else" clause. One skilled in the art will readily appreciate that variations in the appearance of blocks in a CDFG can be used to indicate information about whatever is represented by the block. If, for example, data derived from design synthesis reveals that the hardware represented by the statements in the "then" clause requires twice as much circuit area as the hardware represented by the statements in the "else" clause, the block (3640a') corresponding to the "then" clause can be displayed twice as tall in the CDFG as the block (3640b') corresponding to the "else" clause.

A number of different attributes of blocks and flow lines (for data or for control) can be used to convey information about the objects, control signals or data signals represented by them. Among these attributes are interior color, text color, boundary color, line thickness, line style, block shape, block size, etc.. Any visual attribute of a displayed CDFG object can be used to convey some information about the design object it represents. For example, following the example shown in FIG. 36d, the length of a CDFG block (e.g., 3640a', 3640b') can be used to represent relative values of: circuit area required by the block, number of logic gates represented by the block, propagation delay through the block, number of HDL statements represented by the block, amount of power dissipated by hardware represented by the block, interconnection density within the block, etc.. By comparing the relative size of a pair of CDFG objects whose size indicates a value can provide an ECAD user with a quick visual indication of those values. As discussed hereinabove with respect to iterative approaches to synthesis, different lower-level design choices and different architectural partitioning can result in different characteristics of the same design. By comparing relative block sizes over a number of different "trial" designs, a user can draw quick conclusions about the relative effectiveness of different design choices. Using the sizes of CDFG blocks represent circuit area can be particularly useful in resolving layout-related design choices. Representing propagation delay with CDFG block size can be helpful in resolving design choices which affect circuit performance and/or timing.

Color can be used effectively to indicate parameters of a design. For example, if power dissipated in the. hardware represented by a CDFG block is mapped to color, then a bright red could be used to indicate high power dissipation, black could be used to represent a "cold" state (no power dissipation) and shades of color in-between could be used to indicate intermediate values.

Similar annotation of flow lines (the arrow-head lines in the CDFG) can be used to indication information about the signals passed along the flow line. For example, data flow lines could have one color and control flow lines could have another color. Dynamic data can be displayed in this manner, as well. In much the same fashion as dynamic representations of simulated signal values are shown on schematic diagrams adjacent to "wires", dynamic information from simulations can be used to annotate CDFG's. At the lowest levels of design hierarchy, where a control or data flow line might indicate a single signal value, then the simulated signal value corresponding to a flow line or data item can be placed on the CDFG adjacent the flow line or data item. For a logic signal, color, line thickness or other visual attribute can be used to indicate logic state. Alternatively, a dynamic visual indication (color, line thickness, etc.) can be used to indicate activation of a function or transfer of data along a flow line. In the case of flow-lines, a "theater marquee" effect or "chasing" effect can be used to indicate flow of data/control or change of state along a flow line.

By way of contrast, FIG. 36e shows a top-level CDFG 3650' similar to that of FIG. 36d but without "size-annotation" of the blocks. In this CDFG 3650', the differently-sized blocks 3640a' and 3640b' (representing the "then" and "else" clauses, respectively, of the top level "if" statement in the HDL description 3600) are replaced with corresponding identically-sized blocks 3640a" and 3640b". A user of the inventive technique can move between "annotated" and "un-annotated" views of the CDFG simply by specifying whether or not such annotation is to be applied to the CDFG. Further, the user can select specific blocks to be annotated, such that only some of the blocks in the CDFG are annotated with a visual attribute according to some parameter of the design. One of ordinary skill in the art will immediately recognize that such selection can be made, e.g., by pointing at a block with a pointing device (e.g., mouse) and clicking on a mouse button when the desired block is indicated by the pointer, or by other suitable selection means.

As described hereinabove, any of a number of visual attributes of displayed objects (e.g., color, line thickness, line style, text attributes, etc.) can be used to convey information about ("annotate") the displayed objects in a CDFG. It should be clearly understood that the size-annotation example given above with respect to FIGS. 36d–e is merely exemplary of these annotation techniques and is not intended to be restrictive. It is within the spirit and scope of the inventive technique that any of these annotation techniques (i.e., modification of visual attributes of displayed objects) be used alone or in combination to convey information about one or more parameters of the design as it applies to the "annotated" object. For example, block size could be used to indicate area and block color could be simultaneously used to indicate power dissipation. It is intended that any combination of visual indications be used to annotate a CDFG object to conveyed any sort of design-related information about the CDFG object.

FIG. 36f is a CDFG 3660a which shows a one-level expansion of the CDFG block (3640a', FIG. 36d or 3640a", FIG. 36e) associated with the "then" clause of the top-level "if" statement. The block is expanded in isolation of the remainder of the HDL description, representing only those statements within the "then" clause, and presenting them at one hierarchical level lower than that shown for the CDFG block 3640a' in FIG. 36d. CDFG 3660a represents the "then" clause block with a block 3604' (corresponding to the HDL statement at line 3604), a block 3606' (corresponding to the HDL statement at line 3606), and a block 3642a', representing the "while" loop enclosed by dashed box 3642a in FIG. 32c. Such a CDFG can be requested by a user by indicating (e.g., with a pointing device) a block to be expanded (in this case, block 3640a', FIG. 36a) and further indicating that only the expanded block should be displayed.

FIG. 36g is a CDFG 3660b which shows a one-level expansion of the CDFG block (3640b', FIG. 36d or 3640b", FIG. 36e) associated with the "else" clause of the top-level "if" statement. As in the CDFG of FIG. 36f, the block is expanded in isolation of the remainder of the HDL description, representing only those statements within the "else" clause, and presenting them at one hierarchical level lower than that shown for the CDFG block 3640b' in FIG. 36d. CDFG 3660b represents the "else" clause block with a block 3624' (corresponding to the HDL statement at line 3624), and a block 3642b', representing the "while" loop enclosed by dashed box 3642b in FIG. 32c. As with the CDFG of FIG. 36f, this CDFG can be requested by a user by indicating (e.g., with a pointing device) the block to be expanded (in this case, block 3640b', FIG. 36a) and further indicating that only the expanded block should be displayed.

It should be noted that in FIGS. 36f and 36g, the CDFG blocks (3642a' and 3642b') representing the "while" loops are size-annotated according to the relative complexity of the underlying HDL statements.

Figure 36H:
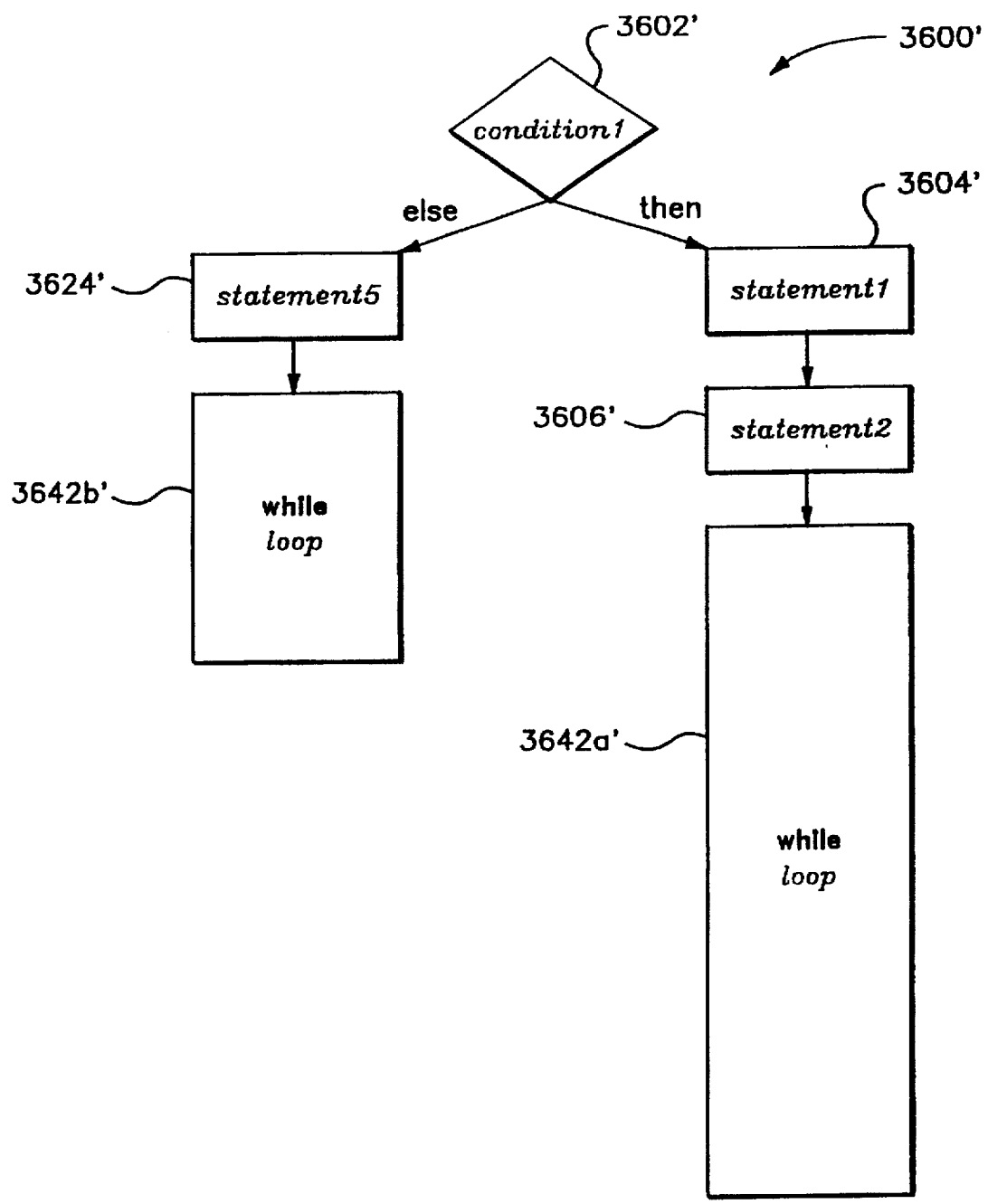
FIG. 36h is a CDFG illustrating expansion of a CDFG block, in-place, according to the invention.

FIGS. 36f and 36g show isolated expansions (to a lower hierarchical level) of CDFG blocks. However, it is possible, especially where block size is related to design complexity, to expand a CDFG block "in place". This is illustrated in FIG. 36h, where a CDFG 3600' shows the result of displaying the CDFG 3600 (FIG. 36d) with the "then" and "else" clause blocks (3640a' and 3640b', respectively) expanded "in-place" (i.e., in their original position in the CDFG). In this case "then" and "else" clause block expansions identical to those shown in FIGS. 36f and 36g replace the "then" and "else" clause blocks 3640a' and 3640b', respectively of FIG. 36d, and are shown in their proper relationship to the "if" clause block 3602'.

It should be noted that if the size-annotation scheme is rigorously followed, then there should always be space in the displayed CDFG to expand any block, since blocks representing greater underlying complexity will always be larger than blocks representing lesser underlying complexity. This can be used to great advantage to simplify the process (especially with respect to allocation of CDFG space) of displaying mixed-level CDFG's (i.e., CDFG's for which not all modules are expanded to the same hierarchical level).

The user can choose to view the CDFG hierarchically or in a flat representation. If hierarchical display is chosen, then preferably the user would get the highest level of abstraction (top level) first. This could even occur at the system level, where each CDFG block represents a piece of the design. The user could then choose a displayed CDFG block and view attributes for the block, such as area, time, power, and reference to the original code. In a manner similar to that described for displaying dynamic data alongside schematic elements, this capability can be provided by opening a window adjacent to the selected CDFG block and displaying the desired information in the window. The desired information can be any piece of design information relevant to the selected block (e.g., the HDL code lines represented by the selected block). The user can choose to "dive into" one of the blocks to view the next lower level inside a block, or to expand one level "in place". Further, the user can specify that all displayed blocks be expanded in-place to the next lower hierarchical level, or that the entire CDFG be represented down to a specific hierarchical level. When "in place" expansion is performed, all the visual block attributes are adjusted to reflect the correct relationship with other displayed CDFG objects. The user can also "climb" back in the hierarchy by specifying that at least a portion of the CDFG be represented at a higher hierarchical level.

Figure 37A:
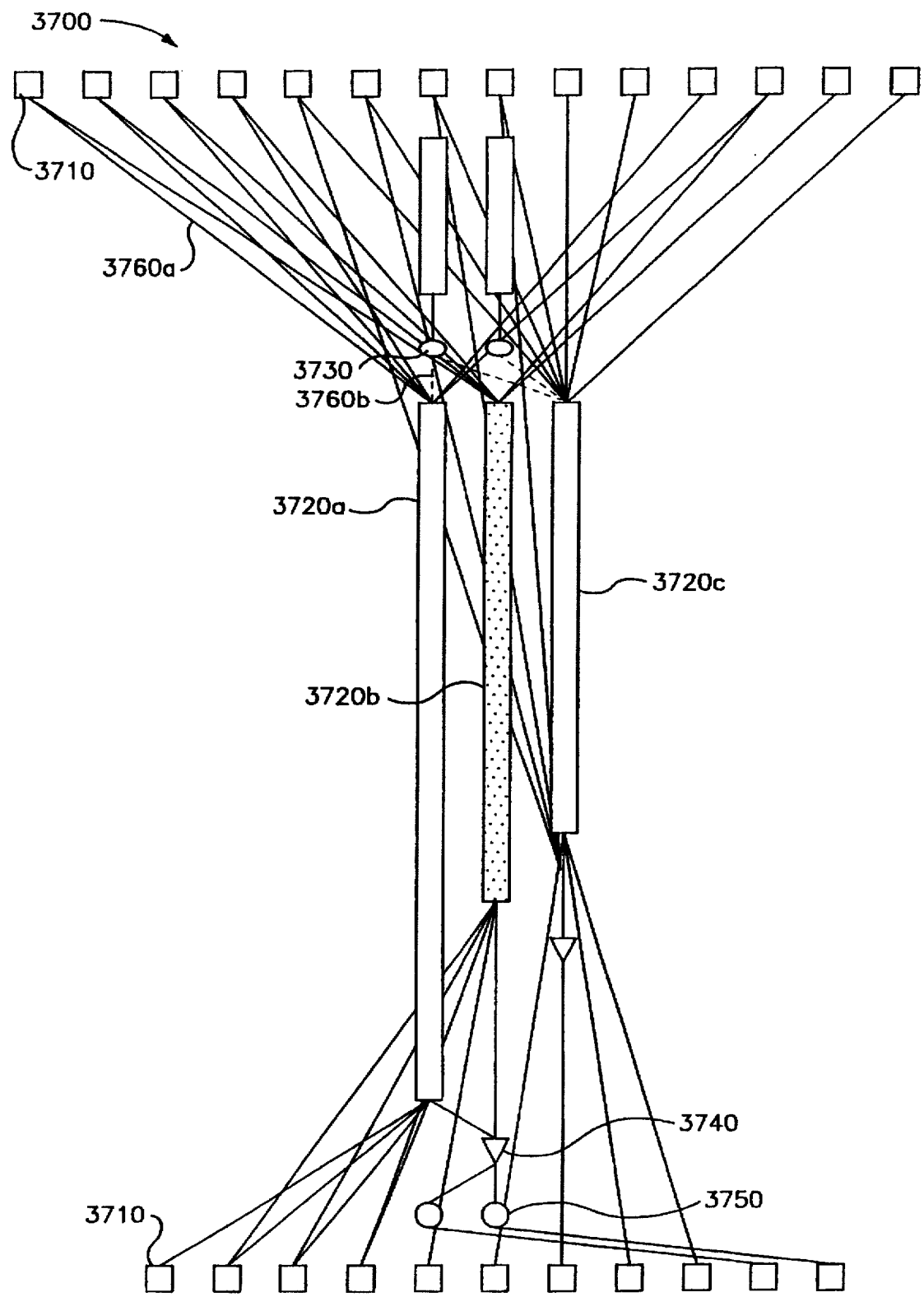
FIGS. 37a–c are alternate forms of CDFGs, for an electronic design, according to the invention.
Figure 37B:
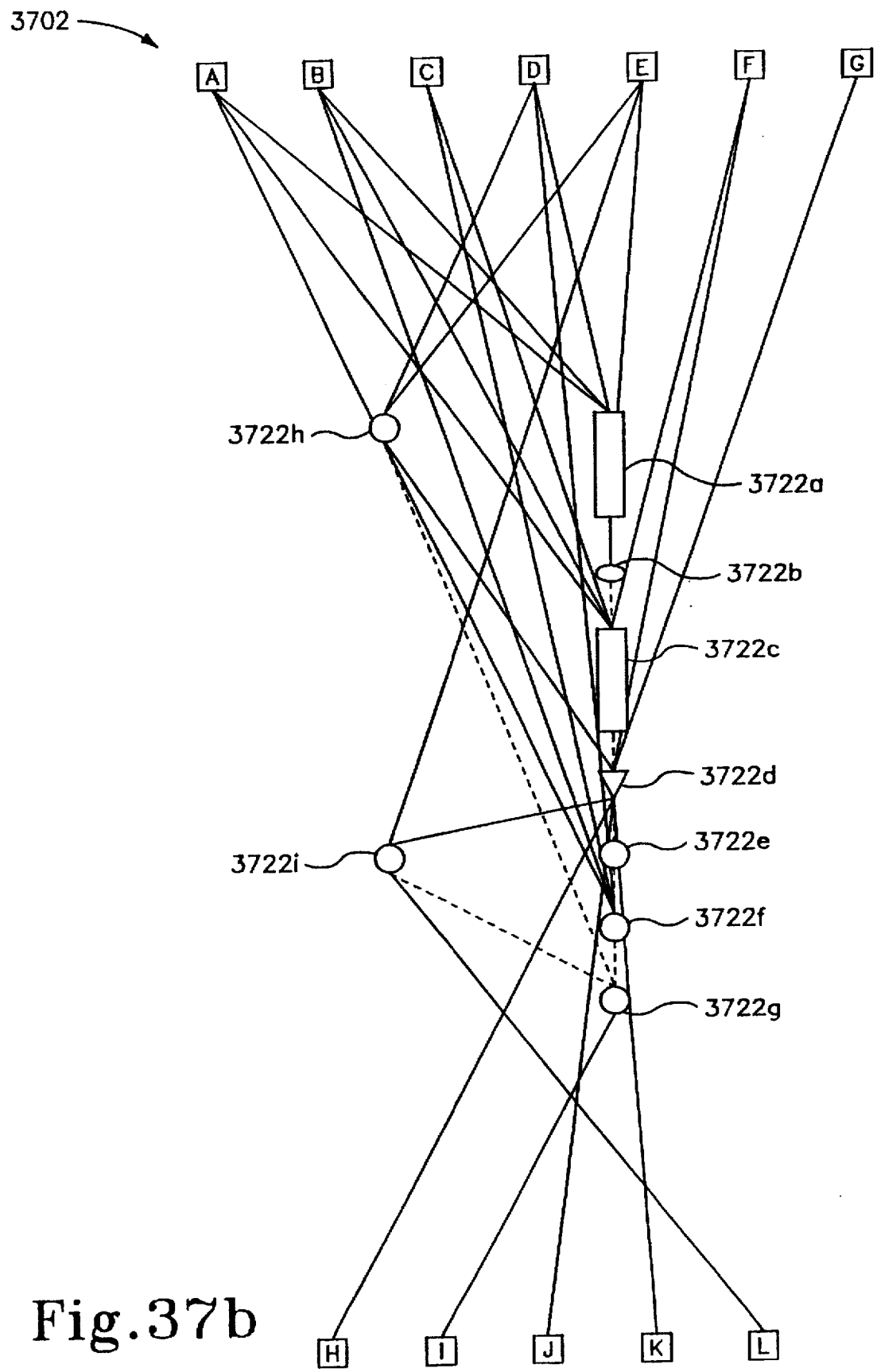
Figure 37C:
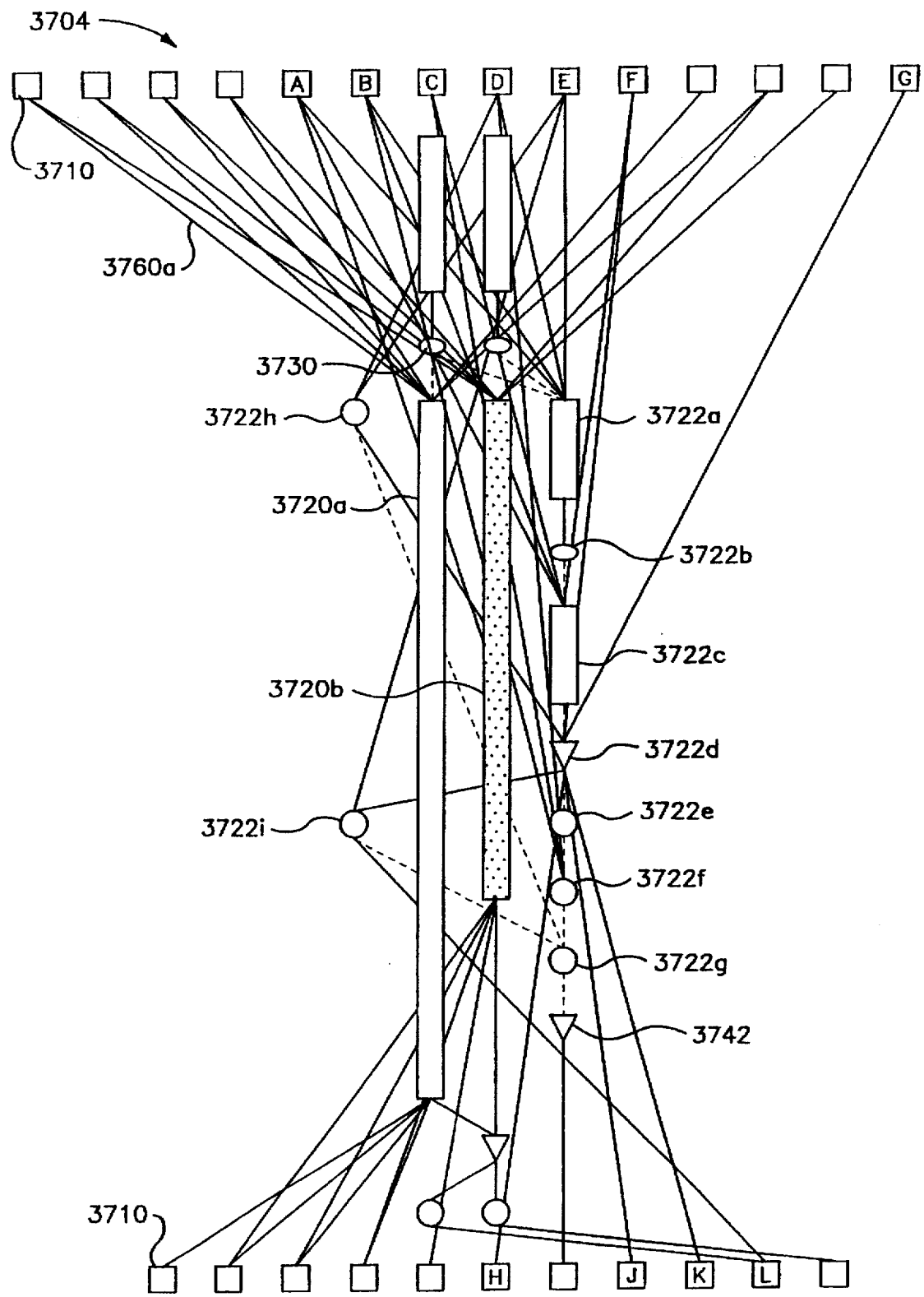

FIGS. 37a–c apply the techniques described hereinabove with respect to FIGS. 36a–h to a more generalized type of CDFG. FIG. 37a is a top-level CDFG representation 3700 of an arbitrary electronic design. Squares 3710 represent "terminals" (e.g., I/O points) of the CDFG. Circles (e.g., 3750), triangles (e.g. 3740) and ovals (e.g., 3730) represent different types of lower-level design objects (e.g., combinational logic blocks, selectors, multiplexers, registers, flip-flops, etc.). Rectangular CDFG objects (e.g., 3720a, 3720b, 3720c) represent CDFG objects which can be expanded to lower hierarchical levels, and which are size-annotated to indicate their relative underlying complexity. One of the rectangular CDFG blocks (3720b) is shaded in the Figure to indicate a color annotation of some sort, such as those described hereinabove in the discussion with respect to FIGS. 36a–h. Lines 3630a and 3630b interconnect the various CDFG objects and indicate the path of control and/or data flow through the CDFG. It should be noted that different line styles are used for lines 3760a (solid line) and 3760b (dashed line). This type of annotation could also be conveyed with different colors or different line thicknesses.

FIG. 37b is a CDFG representation 3702 of an expansion of one of the rightmost long rectangular block (3720c) of FIG. 37a. The "terminals" of the CDFG 3702 are labeled "A", "B", "C", "D", "E", "F", "G", "H", "I", "J", "K", and "L", and represent external connections to the CDFG block 3720c. The CDFG 3702 shows the expansion of the CDFG block 3720c to include seven lower level CDFG objects 3722b, 3722d, 3722e, 3722f, 3722g, 3722h, and 3722i, and two size-annotated rectangular CDFG blocks 3722a and 3722c representing further lower levels of hierarchy.

FIG. 37c is a CDFG 3704 showing the CDFG block expansion of FIG. 32b applied "in-place" to the CDFG 3700 of FIG. 37a. The labels "A" through "L" are carried through to this CDFG to permit a user to readily correlate the expanded views of FIGS. 37b and 37c. It should be noted that the label "I" is applied to a lower level CDFG block 3742, rather than to a terminal 3710. This illustrates that the terminals of a lower level CDFG are not necessarily connected to terminals at a higher level of abstraction.

The present inventive techniques provide for hierarchical display of CDFG's by making use of information derived from the design synthesis process to break down the design into a series of hierarchically-related blocks and to display them according to their hierarchical level, as requested by a user. Further, the present inventive techniques provide for annotation of CDFG blocks with visual attributes and/or textual information to provide design-related (or even simulation-related) data about the annotated blocks or their underlying design objects. A CDFG object can be annotated with more than one type of information by using more than one annotation technique (e.g., color and size, color and line-style, size and text, etc.). By applying these hierarchical display and annotation techniques to CDFG representations of a design, it is possible for a user to rapidly gain valuable insight about the effect and effectiveness of different design choices, and by acting on this insight, to make better-informed choices and to provide better overall design quality.

What is claimed is:

1. An interactive system for hierarchical display of control and dataflow information, on a system including a computer processor, information storage means, and graphical display means, comprising:

a design description entry device for a user to enter a high-level design description on said system, wherein said design description is stored on said information storage means;

an analyzer for analysis of the high-level design description, identification of modules according to a first predetermined criteria, and organization of said modules according to a second predetermined criteria;

a synthesizer for synthesizing one or more detailed electronic designs from the high-level design description;

a graphical control indicator for graphically representing control and data flow between graphical objects representing modules on said graphical display means, said graphical control and data flow indications representing control and data flow between the modules represented by the graphical objects;

a selector for selecting a level of hierarchical abstraction for any displayed graphical object; and an indicator for indicating that a displayed graphical object represents a module having progeny modules associated therewith at a lower level of abstraction.

2. A system according to claim 1, wherein identification and organization of modules is accomplished in a hierarchical manner by the analyzer such that:

each module at other than a highest level of abstraction is associated with ancestor modules at higher levels of abstraction; and each module at other than a lowest level of abstraction is associated with progeny modules at lower levels of abstraction.

3. A system according to claim 1, further comprising:

a graphical object selector for selecting a graphical object representing a module; and an object and flow display device for displaying progeny graphical objects and control and data flow between said progeny graphical objects, said progeny graphical objects representing progeny modules of the module represented by the selected graphical object.

4. A system according to claim 3, further comprising:

an isolator for displaying the progeny graphical objects in isolation.

5. A system according to claim 4, wherein the information related to the module is a set of HDL code statement represented by the module.

6. A system according to claim 3, further comprising:

a graphical objects progeny display device for displaying the progeny graphical objects in place of the selected graphical object.

7. A system according to claim 1, further comprising:

an annotator for annotating any graphical object with information related to the module represented by the object.

8. A system according to claim 7, wherein the annotator controls at least one visual attributes of the graphical object.

9. A method according to claim 8, wherein said annotating step controls at least one visual attributes of the graphical object.

10. A method according to claim 8, wherein said annotating step provides textual information adjacent to the graphical object.

11. A method according to claim 8, wherein the information related to the module is simulation-related information.

12. A method according to claim 8, wherein the information related to the module describes one or more physical characteristics of one or more circuit elements represented by the module.

13. A system according to claim 7, wherein the annotator provides textual information adjacent to the graphical object.

14. A system according to claim 7, wherein the information related to the module is simulation-related information.

15. A system according to claim 7, wherein the information related to the module describes one or more physical characteristics of one or more circuit elements represented by the module.

16. A method of creating and validating a structural description of an electronic system from a higher level, behavior-oriented description thereof on an interactive system, comprising the steps of:

entering a high-level design description on said system;

storing said design description on said information storage means;

analyzing the high-level design description;

identifying modules according to a first predetermined criteria;

organizing said modules according to a second predetermined criteria;

synthesizing one or more detailed electronic designs from the high-level design description;

graphically representing control and data flow between graphical objects representing modules on said graphical display means, said graphical control and data flow indications representing control and data flow between the modules represented by the graphical objects;

selecting a level of hierarchical abstraction for any displayed graphical object; and providing an indication that a displayed graphical object represents a module having progeny modules associated therewith at a lower level of abstraction.

17. A method according to claim 16, wherein said identifying and organizing steps are accomplished such that:

each module at other than a highest level of abstraction is associated with ancestor modules at higher levels of abstraction; and each module at other than a lowest level of abstraction is associated with progeny modules at lower levels of abstraction.

18. A method according to claim 17, further comprising:
selecting a graphical object representing a module; and
displaying progeny graphical objects and control and data flow between said progeny graphical objects, said progeny graphical objects representing progeny modules of the module represented by the selected graphical object.

19. A method according to claim 18, further comprising: displaying the progeny graphical objects in isolation.

20. A method according to claim 19, wherein the information related to the module is a set of HDL code statement represented by the module.

21. A method according to claim 18, further comprising: displaying the progeny graphical objects in place of the selected graphical object.

22. A method according to claim 16, further comprising: annotating any graphical object with information related to the module represented by the object.

23. A method of creating and validating a structural description of a system from a higher level, behavior-oriented description thereof, comprising the steps of:

entering a specification for a design of desired behavior of the system in a high-level, behavior-oriented language;

iteratively simulating and changing the design of the system at the behavioral-level until the desired behavior is obtained;

partitioning the design of the system into a number of architectural blocks and constraining the architectural choices to those which meet the high-level timing goals;

directing the various architectural blocks to logic synthesis programs, thereby providing a netlist or gate-level description of the design;

organizing design objects associated with said architectural blocks in a predetermined hierarchical manner; and displaying at least a portion of the system design as a plurality of graphical objects.

24. A method according to claim 23, wherein said design of desired behavior of the electronic system includes high-level timing goals.

25. A method according to claim 23, wherein said organizing in a predetermined hierarchical manner step is where:

each design object at other than a highest level of abstraction is associated with ancestor design objects at higher levels of abstraction; and each design object at other than a lowest level of abstraction is associated with progeny design objects at lower levels of abstraction.

26. A method according to claim 23, wherein said displaying step further comprises associating each graphical object with one or more respective design objects, said graphical objects interconnected with control and data flow indications to form a control and dataflow graph.

27. A method according to claim 23, further comprising the step of:

annotating at least some of the graphical objects with information related to graphical objects representing the design objects.

28. A method according to claim 23, wherein the graphical objects are annotated by changing at least one visual attribute thereof.

29. A method according to claim 23, wherein the graphical objects are annotated with textual information.

30. A method according to claim 23, wherein the information related to the design objects includes simulation-related data.

31. A method according to claim 23, wherein the information related to the design objects describes one or more physical characteristics of circuit elements represented by the design objects.

32. A method of creating an electronic design on a system having an accessible database, design tools, and a display device and one or more input devices enabling a user to interact with the system, comprising:

displaying a control and dataflow graph representation of an electronic design, the control and dataflow graph being at a given hierarchical level of abstraction;

storing in the accessible database information relating to the electronic design at various levels of abstraction;

retrieving information relating to the electronic design from the accessible database;

displaying the information contemporaneously with displaying the control and dataflow graph; and providing selectable representations of objects represented in the control and dataflow graph.

33. A method according to claim 32, wherein said selectable representations are at a lower level.

34. A method according to claim 32, further comprising:
displaying the representations of the objects contemporaneously with displaying the control and dataflow graph.

35. A method according to claim 33, further comprising:

displaying the representations of the objects in isolation of the control and dataflow graph in the form of a lower-level control and dataflow graph.

36. A method according to claim 35, further comprising:

annotating at least one object in the control and dataflow graph with information related to the object.

37. A method according to claim 36, wherein the annotation of the at least one object is accomplished by altering a visual attribute of the object.

38. A method according to claim 37, wherein the annotation of the at least one object is accomplished by providing descriptive textual information adjacent to the at least one objection on the display device.

39. A method of creating and validating a structural description of a circuit or device from a higher level, behavior-oriented description thereof, comprising:

entering a specification for a design of desired behavior of a device, including high-level timing goals, in a high-level, behavior-oriented language;

iteratively simulating and changing the design of the device at the behavioral-level until the desired behavior is obtained;

partitioning the design of the device into a number of architect blocks which meet the high-level timing goals;

displaying a control and data flow graph corresponding to the partitioned design; and directing the various architectural blocks to logic synthesis programs.

40. The method of claim 39, wherein said directing step provides a netlist or gate-level description of the design.

* * * * *

UNITED STATES PATENT AND TRADEMARK OFFICE
CERTIFICATE OF CORRECTION

PATENT NO. : 5,801,958
APPLICATION NO. : 08/707918
DATED : September 1, 1998
INVENTOR(S) : Carlos Dangelo, Daniel Watkins and Doron Mintz Page 1 of 1

It is certified that error appears in the above-identified patent and that said Letters Patent is hereby corrected as shown below:

Title Page; item (63);
Page 1 – Related U.S. Application Data should read;

Continuation of Ser. No. 196,337, Feb. 10, 1994, Pat. No. 5,555,201, which is a continuation-in-part of Ser. No. 77,304, Jun. 14, 1993, Pat. No. 5,623,418; Ser. No. 76,729, Jun. 14, 1993, Pat. No. 5,544,066; Ser. No. 76,738, Jun. 14, 1993, Pat. No. 5,557,531; Ser. No. 76,728, Jun. 14, 1993, Pat. No. 5,541,849; and Ser. No. 77,403, Jun. 14, 1993, Pat. No. 5,553,002; said Ser. No. 77,304 is a continuation-in-part of Ser. No. 77,294, Pat. No. 5,544,067 and Ser. No. 917,801, Jul. 20, 1992, Pat. No. 5,220,512, which is a continuation of Ser. No. 512,129, Apr. 19, 1990, abandoned; said Ser. No. 77,294 is a continuation-in-part of Ser. No. 917,801 and Ser. No. 54,053, Apr. 26, 1993, abandoned, which is a continuation-in-part of Ser. No. 507,201, Apr. 6, 1990, Pat. No. 5,222,030.

Signed and Sealed this

Twenty-seventh Day of October, 2009

David J. Kappos
*Director of the United States Patent and Trademark Office*